United States Patent
Asmussen et al.

(10) Patent No.: US 10,494,719 B2
(45) Date of Patent: Dec. 3, 2019

(54) METHODS AND APPARATUS FOR MICROWAVE PLASMA ASSISTED CHEMICAL VAPOR DEPOSITION REACTORS

(71) Applicant: BOARD OF TRUSTEES OF MICHIGAN STATE UNIVERSITY, East Lansing, MI (US)

(72) Inventors: Jes Asmussen, East Lansing, MI (US); Jing Lu, East Lansing, MI (US); Yajun Gu, Boise, ID (US); Shreya Nad, Hillsboro, OR (US)

(73) Assignee: BOARD OF TRUSTEES OF MICHIGAN STATE UNIVERSITY, East Lansing, MI (US)

( * ) Notice: Subject to any disclaimer, the term of this patent is extended or adjusted under 35 U.S.C. 154(b) by 0 days.

(21) Appl. No.: 15/313,250

(22) PCT Filed: May 22, 2015

(86) PCT No.: PCT/US2015/032177
§ 371 (c)(1),
(2) Date: Nov. 22, 2016

(87) PCT Pub. No.: WO2015/187389
PCT Pub. Date: Dec. 10, 2015

(65) Prior Publication Data
US 2017/0183778 A1    Jun. 29, 2017

Related U.S. Application Data

(60) Provisional application No. 62/002,539, filed on May 23, 2014.

(51) Int. Cl.
*C23C 16/00* (2006.01)
*C23C 16/511* (2006.01)
(Continued)

(52) U.S. Cl.
CPC .......... *C23C 16/511* (2013.01); *C23C 16/274* (2013.01); *C23C 16/52* (2013.01);
(Continued)

(58) Field of Classification Search
CPC ................................. C23C 16/00; H01J 37/00
See application file for complete search history.

(56) References Cited

U.S. PATENT DOCUMENTS

| 5,311,103 A | 5/1994 | Asmussen et al. |
| 8,316,797 B2 | 11/2012 | Asmussen et al. |

(Continued)

FOREIGN PATENT DOCUMENTS

| WO | WO-2012/158532 | 11/2012 |
| WO | WO-2012/173207 | 12/2012 |

OTHER PUBLICATIONS

International Search Report and Written Opinion in PCT/US2015/032177, dated Aug. 7, 2015 (1 page).
(Continued)

*Primary Examiner* — David P Turocy
*Assistant Examiner* — Mohammad Mayy
(74) *Attorney, Agent, or Firm* — Marshall, Gerstein & Borun LLP

(57) ABSTRACT

The disclosure relates to microwave cavity plasma reactor (MCPR) apparatus and associated tuning and process control methods that enable the microwave plasma assisted chemical vapor deposition (MPACVD) of a component such as diamond. Related methods enable the control of the microwave discharge position, size and shape, and enable efficient matching of the incident microwave power into the reactor prior to and during component deposition. Pre-deposition tuning processes provide a well matched reactor exhibiting a high plasma reactor coupling efficiency over a wide range of operating conditions, thus allowing opera-
(Continued)

tional input parameters to be modified during deposition while simultaneously maintaining the reactor in a well-matched state. Additional processes are directed to realtime process control during deposition, in particular based on identified independent process variables which can effectively control desired dependent process variables during deposition while still maintaining a well-matched power coupling reactor state.

12 Claims, 21 Drawing Sheets

(51) Int. Cl.
    *C23C 16/27*     (2006.01)
    *C23C 16/52*     (2006.01)
    *H01J 37/32*     (2006.01)

(52) U.S. Cl.
    CPC .. *H01J 37/32192* (2013.01); *H01J 37/32256* (2013.01); *H01J 37/32926* (2013.01); *H01J 2237/3321* (2013.01)

(56) References Cited

U.S. PATENT DOCUMENTS

| | | |
|---|---|---|
| 8,668,962 B2 | 3/2014 | Asmussen et al. |
| 2009/0255800 A1* | 10/2009 | Koshimizu ........ H01J 37/32091 204/164 |
| 2010/0034984 A1 | 2/2010 | Asmussen et al. |
| 2012/0228755 A1* | 9/2012 | Nagano .................. H01L 23/04 257/698 |
| 2013/0101730 A1* | 4/2013 | Asmussen ............. C23C 16/274 427/9 |
| 2013/0277333 A1 | 10/2013 | Misra et al. |

OTHER PUBLICATIONS

Lu et al., "Experimentally defining the safe and efficient, high pressure microwave plasma assisted CVD operating regime for single crystal diamond synthesis," Diamond & Related Materials 37 (2013) 17-28.

Nad et al., "Performance and Efficiency of Microwave Cavity Plasma Reactors Utilized in the Synthesis of High Quality CVD Single Crystal Diamonds (SCDs)," Presented at New Diamond and Nano Carbons Conference (NDNC 2014). May 25-29, 2014 Chicago, Illinois.

Gu et al., "Temperature Control Strategies for Microwave Plasma Assisted CVD SCD Synthesis," Presented at New Diamond and Nano Carbons Conference (NDNC 2014). May 25-29, 2014 Chicago, Illinois.

* cited by examiner

METHODS AND APPARATUS FOR MICROWAVE PLASMA ASSISTED CHEMICAL VAPOR DEPOSITION REACTORS

CROSS REFERENCE TO RELATED APPLICATION

Priority is claimed to U.S. Provisional Application No. 62/002,539 (filed May 23, 2014), which is incorporated herein by reference in its entirety.

STATEMENT OF GOVERNMENT INTEREST

None.

BACKGROUND OF THE DISCLOSURE

Field of the Disclosure

The disclosure relates to microwave cavity plasma reactor (MCPR) apparatus and associated tuning and process control methods that enable microwave plasma assisted chemical vapor deposition (MPACVD) of a component such as diamond. Related methods enable the control of the microwave discharge position, size and shape, and enable efficient matching of the incident microwave power into the reactor prior to and during component deposition.

SUMMARY

In one aspect, the disclosure relates to a process for depositing a component on a substrate, the process comprising: (a) providing a microwave plasma assisted reactor comprising: (i) a first microwave chamber having a reference plane at a reference axial location $Z_0$, the first microwave chamber extending in an axial direction $z > Z_0$ and comprising (A) an electromagnetic wave source and (B) an upper conducting short in electrical contact with the first microwave chamber (e.g., outer sidewall thereof) and disposed in an upper portion of the first microwave chamber at an axial distance $L_s$ above $Z_0$, the upper conducting short having a central opening and defining an upper boundary of the first microwave chamber (e.g., more generally an axially adjustable upper conducting boundary for the first microwave chamber), and (ii) a plasma chamber having an outer wall, the plasma chamber extending into the first microwave chamber such that at least a portion of the plasma chamber is located at $z > Z_0$, and (iii) a conductive stage for supporting a substrate, the conductive stage having an axially adjustable reference surface extending into the plasma chamber at an axial distance $Z_s$ relative to $Z_0$ (e.g., negative $Z_s$ is below $Z_0$ (further away from EM wave source), positive $Z_s$ is above $Z_0$ (closer to EM wave source)); (b) performing a first tuning process comprising: (i) operating the reactor to deposit a component on a substrate supported on the conductive stage at a plurality of different electromagnetic wave source incident power values $P_{inc}$ and at a plurality of different $L_s$ values to measure corresponding reflected power values $P_{ref}$, and (ii) identifying a first matched operating regime for which a power reflection coefficient R defined as $P_{ref}/P_{inc}$ is 0.1 or less (e.g., R is 0.05, 0.02, or 0.01 or less; first matched operating can be defined as a $L_s$ and $P_{inc}$ (or $P_{abs}$) domain meeting the target R value); (c) performing a second tuning process comprising: (i) operating the reactor to deposit a component on a substrate supported on the conductive stage at a plurality of different axial distance $Z_s$ values and at a plurality of different $L_s$ values to measure corresponding reflected power values $P_{ref}$ (e.g., also at an electromagnetic wave source incident power value $P_{inc}$ such as a $P_{inc}$ value within the first matched operating regime, such as within the plurality of incident power values of the first tuning process), and (ii) identifying a second matched operating regime for which a power reflection coefficient R defined as $P_{ref}/P_{inc}$ is 0.1 or less (e.g., R is 0.05, 0.02, or 0.01 or less, such as where the target R value can be the same or different as that from the first tuning process); and (d) operating the reactor at a pressure ranging from about 10 Torr to about 760 Torr (e.g., more generally about 10 Torr to about 3 atm) to deposit a component on a substrate supported on the conductive stage at one or more operating conditions within at least one of the first matched operating regime and the second matched operating regime, wherein the power reflection coefficient R is 0.1 or less during deposition of the component (e.g., R is 0.05, 0.02, or 0.01 or less during deposition, such as where the target R value obtained during deposition can be the same or different as that from the first and second tuning processes, for example the R values during deposition could be slightly higher than the R values obtained during tuning).

The first and second tuning processes can be performed in any order (e.g., the second tuning process can be performed to identify the second matched operating regime and then the first tuning process can be performed to identify the first matched operating regime, or vice versa). In some embodiments, and an initial coarse tuning process can be performed to reduce $P_{ref}$ or R to some low value (e.g., R or 0.5, 0.2, or 0.1 or less), and then the first and second tuning processes are performed to further reduce R, internally match the reactor, and identify a well matched operating regime. Suitably, the results of the tuning process performed earlier in time are used to select operating conditions for the tuning process later in time. For example, the incident power value $P_{inc}$ for the second tuning process can be selected from within the first matched operating regime when the first tuning process is performed earlier in time. Similarly, the substrate position $Z_S$ for the first tuning process can be selected from within the second matched operating regime when the second tuning process is performed earlier in time. Regardless of the order performed, the first tuning process generally includes operation of the reactor at plurality of $P_{inc}/L_s$ combinations performed at one or more other constant operating conditions such as reactor pressure $p_r$, EM probe distance $L_p$, total feed gas flow rate, feed gas composition (e.g., $CH_4/H_2$ concentration), reference surface/substrate position $Z_s$ (e.g., where L1 and L2 also constant). Similarly, the second tuning process generally includes operation of the reactor at plurality of $Z_s/L_s$ combinations performed at one or more other constant operating conditions such as reactor pressure $p_r$, EM probe distance $L_p$, total feed gas flow rate, feed gas composition (e.g., $CH_4/H_2$ concentration), incident power $P_{inc}$. The reference surface/substrate position $Z_s$ can be varied by varying L1 and/or L2. Suitably, the constant operating conditions are same for both first and second tuning processes (i.e., other than the $P_{inc}$, $L_s$, and $Z_S$ values varied during the process). For the tuning processes, a specific substrate holder (e.g., molybdenum) and substrate combination is generally selected, and the combination is determined by the specific process application that is being optimized, typically using one substrate per optimization.

In a refinement, the post-tuning deposition process further comprises, during part (d), varying (e.g., stepwise at selected time intervals, as a continuous function at selected time intervals) at least one of reactor pressure $p_r$, substrate position $Z_s$, and incident power $P_{inc}$ while maintaining the power reflection coefficient R to be 0.1 or less (e.g., R is 0.05, 0.02, or 0.01 or less) during deposition of the component. The pre-deposition tuning process provides several advantages for subsequent deposition processes. Pre-deposition tuning as described herein generally allows reactor pressure $p_r$, substrate position $Z_s$, and/or incident power $P_{inc}$ to be varied within relatively broad ranges during a deposition process to control one or more other deposition parameters (e.g., substrate temperature $T_s$) while simultaneously maintaining the reactor in a well-matched, energy-efficient operational mode (e.g., avoiding the need to re-tune one or more of $L_s$, $L_p$, etc. during deposition, although fine-tuning of same is possible if desired). For example, incident power $P_{inc}$ and/or substrate position $Z_s$ can be varied within their ranges from the first and second operating regimes. Similarly, the pressure $p_r$ can be varied within ±40, 60, 80, 100, or 120 Torr and/or within 10%, 20%, 30%, 40%, 50%, or 70% of a pressure used during the first and/or second tuning process. Conversely, other operating conditions suitably are the same or substantially the same as used during the first and/or second tuning process (e.g., the same as or ±2%, 5%, or 10% of a tuning value for one or more of gas flow rate, feed gas composition, probe distance $L_p$, cavity height $L_s$, etc.).

In another aspect, the disclosure relates to a microwave plasma assisted reactor control system comprising: a computer comprising a processor and memory coupled to a computer readable storage medium encoded with a computer program, the program comprising instructions that, when executed by the processor, cause the computer to control a microwave plasma assisted reactor according to any of the variously disclosed embodiments, and to perform one or more of (i) a first tuning process according to part (b) of the above process, (ii) a second tuning process according to part (c) of the above process, and (iii) component deposition according to part (d) of the above process (e.g., including computer/software automation and control of the reactor to perform any combination of parts b, c, and d of the general pre-deposition tuning process and post-tuning deposition process, such as b, c, d, b and c, b and d, c and d, or b, c, and d). The computer can be a general purpose computer, for example including a processor and memory coupled to a computer readable medium encoded with one or more computer programs for controlling a MCPR reactor. For example the program can include instructions for execution by the processor to permit the computer to control the reactor and execute any, some, or all of the variously disclosed reactor tuning and component deposition steps.

In another aspect, the disclosure relates to a process for depositing a component on a substrate, the process comprising: (a) providing a microwave plasma assisted reactor comprising: (i) a first microwave chamber having a reference plane at a reference axial location $Z_0$, the first microwave chamber extending in an axial direction $z > Z_0$ and comprising (A) an electromagnetic wave source and (B) an upper conducting short in electrical contact with the first microwave chamber (e.g., outer sidewall thereof) and disposed in an upper portion of the first microwave chamber at an axial distance $L_s$ above $Z_0$, the upper conducting short having a central opening and defining an upper boundary of the first microwave chamber (e.g., more generally an axially adjustable upper conducting boundary for the first microwave chamber), (ii) a plasma chamber having an outer wall, the plasma chamber extending into the first microwave chamber such that at least a portion of the plasma chamber is located at $z > Z_0$, and (iii) a conductive stage for supporting a substrate, the conductive stage having an axially adjustable reference surface extending into the plasma chamber at an axial distance $Z_s$ relative to $Z_0$ (e.g., negative $Z_s$ is below $Z_0$ (further away from EM wave source), positive $Z_s$ is above $Z_0$ (closer to EM wave source)); (b) selecting a deposition process controlled variable selected from the group consisting of substrate temperature $T_s$, plasma discharge volume $V_d$, plasma discharge position $r_d$, reflected power $P_{ref}$, power reflection coefficient R, plasma discharge absorbed power $P_{abs}$, plasma discharge absorbed power density $<P_{abs}>$ and combinations thereof; (c) selecting a deposition process manipulated variable selected from the group consisting of reactor pressure $p_r$, substrate position $Z_s$, and incident power $P_{inc}$, and combinations thereof; (d) operating the reactor at a pressure ranging from about 10 Torr to about 760 Torr (e.g., more generally about 10 Torr to about 3 atm) to deposit a component on a substrate supported on the conductive stage, wherein the power reflection coefficient R is 0.1 or less (e.g., R is 0.05, 0.02, or 0.01 or less) during deposition of the component; and (e) during part (d), adjusting the manipulated variable to maintain the controlled variable within a predetermined (selected) range relative to a setpoint for the controlled variable, while maintaining the power reflection coefficient R to be 0.1 or less (e.g., R is 0.05, 0.02, or 0.01 or less) during deposition of the component (e.g., predetermined range can be within ±5, 10, 20, 50, or 100° C. of a temperature setpoint, more generally within ±1%, 2%, 5%, 10%, or 20% of another controlled variable setpoint).

The controlled variables and manipulated variables are not particularly limited and can include the various dependent and independent variables of the deposition process. In some cases, there is a one-to-one correspondence between a controlled variable and a manipulated variable (e.g., one manipulated variable is used to control one controlled variable). In other cases, there is a one-to-many relationship between variables (e.g., one manipulated variable is used to control multiple controlled variables; multiple manipulated variables are used to control one controlled variable). The controlled variables are suitably those that can be measured in situ during component deposition, such as by an optical pyrometer (e.g., measuring substrate temperature or related variables), a plasma discharge camera (e.g., measuring plasma discharge volume/location or related variables), and reflected power meter (e.g., measuring $P_{ref}$ or related variables). The substrate temperature can be an average (e.g., area-based) surface temperature or a spatial temperature distribution (e.g., $T_s(r)$, maximum local substrate temperature, minimum local substrate temperature, etc.). A combination of controlled variables indicates that more than one process variable can be controlled, for example by one or more corresponding manipulated variables. The manipulated variables are suitably those that can be varied within relatively broad ranges during a deposition process (e.g., resulting from the tuning processes above) while maintaining the power reflection coefficient R to be 0.1 or less (e.g., R is 0.05, 0.02, or 0.01 or less) during deposition of the component. A combination of manipulated variables indicates that more than one process variable can be manipulated, for example to control one or more corresponding controlled variables.

Various refinements of the deposition-concurrent control process are possible. In a refinement, the setpoint for the controlled variable is constant during deposition of the component. In another refinement, the setpoint for the controlled variable is a selected function of time during deposition of the component (e.g., variable setpoints could be a step function of time, a continuous function of time, etc.; for example an initially low setpoint for a substrate temperature for a time sufficient to form a first crystalline layer on the substrate can be followed by a higher setpoint for substrate temperature to increase deposition rate thereafter; deposition uniformity setpoint can be controlled in combination with substrate temperature versus time to reduce stress in synthesized diamond). In one embodiment, the controlled variable is the substrate temperature $T_s$ and the manipulated variable is the reactor pressure $p_r$. In one embodiment, the controlled variable is the substrate temperature $T_s$ and the manipulated variable is the substrate position $Z_s$. In one embodiment, the controlled variable is the substrate temperature $T_s$ and the manipulated variable is the incident power $P_{inc}$. In one embodiment, the controlled variable is the absorbed power density $<P_{abs}>$ and the manipulated variable is the reactor pressure $p_r$. In one embodiment, the controlled variable is the absorbed power density $<P_{abs}>$ and the manipulated variable is the substrate position $Z_s$. In one embodiment, the controlled variable is the absorbed power density $<P_{abs}>$ and the manipulated variable is the incident power $P_{inc}$.

In another refinement, adjusting the manipulated variable in part (e) comprises performing a control process comprising: (i) measuring an instantaneous value of the controlled variable, (ii) adjusting the manipulated variable to minimize an error function based on the difference between the instantaneous value of the controlled variable and the setpoint of the controlled variable, and (iii) repeating (i)-(ii) of the control process. The instantaneous value need not be continuously measured; it can be measured at any process-relevant timescale interval such that the control process adjustment can be implemented by automated control electronics (e.g., under computer/software control) or by a human operator (e.g., when adjustment intervals are sufficiently long). Suitable control electronics such as P, PI, PD, or PID controllers (e.g., tuned with $K_p$, $K_i$, and/or $K_d$ coefficients as appropriate) can be used in an automated feedback control loop.

In some embodiments, the deposition-concurrent control process can further include one or more tuning processes (e.g., as described in any of the above embodiments and refinements, such as prior to deposition of the component in parts (d) and (e) of the process). In a refinement, the process further comprises, prior to part (d): performing a first tuning process comprising: (i) operating the reactor to deposit a component on a substrate supported on the conductive stage at a plurality of different electromagnetic wave source incident power values $P_{inc}$ and at a plurality of different $L_s$ values to measure corresponding reflected power values $P_{ref}$, and (ii) identifying a first matched operating regime for which a power reflection coefficient R defined as $P_{ref}/P_{inc}$ is 0.1 or less; wherein deposition of the component in part (d) further comprises operating the reactor at one or more operating conditions within the first matched operating regime while maintaining the power reflection coefficient R to be 0.1 or less during deposition. In another refinement, the process further comprises, prior to part (d): performing a second tuning process (e.g., alone or in combination with the first tuning process) comprising: (i) operating the reactor to deposit a component on a substrate supported on the conductive stage at a plurality of different axial distance $Z_s$ values, and at a plurality of different $L_s$ values to measure corresponding reflected power values $P_{ref}$, and (ii) identifying a second matched operating regime for which a power reflection coefficient R defined as $P_{ref}/P_{inc}$ is 0.1 or less; wherein deposition of the component in part (d) further comprises operating the reactor at one or more operating conditions within the second matched operating regime while maintaining the power reflection coefficient R to be 0.1 or less during deposition.

In another aspect, the disclosure relates to a microwave plasma assisted reactor control system comprising: a computer comprising a processor and memory coupled to a computer readable storage medium encoded with a computer program, the program comprising instructions that, when executed by the processor, cause the computer to control a microwave plasma assisted reactor according to any of the variously disclosed embodiments, and to perform component deposition and manipulated variable adjustment according to parts (d) and (e) of the deposition-concurrent control process above. The computer can be a general purpose computer, for example including a processor and memory coupled to a computer readable medium encoded with one or more computer programs for controlling a MCPR reactor. For example the program can include instructions for execution by the processor to permit the computer to control the reactor and execute any, some, or all of the variously disclosed reactor tuning and component deposition steps.

Various refinements of the microwave plasma assisted reactor are possible in any of the disclosed processes. In a refinement, the electromagnetic wave source of the microwave plasma assisted reactor comprises a coaxial excitation probe extending through the central opening of the upper conducting short and into the first microwave chamber by an axial distance $L_p$ relative to the upper boundary of the first microwave chamber. In another refinement, the conductive stage defines a second microwave chamber in the plasma chamber (i) at $z<Z_0$ and (ii) between the plasma chamber outer wall and the conductive stage; the microwave plasma assisted reactor further comprises a conducting short adjustably disposed in the second microwave chamber below $Z_0$ and in electrical contact with the plasma chamber outer wall and the conductive stage, the axial distance between the conducting short and $Z_0$ being L2, and the axial distance between the conducting short and the reference surface of the conductive stage being L1 (e.g., where the axial distance $Z_s$ relative to $Z_0$ is represented by L1−L2); and L2 and L1 are capable of axial adjustment in the reactor by moving the conducting short during operation of the reactor (e.g., where $Z_s$ can be varied by changing L1 and holding L2 constant, changing L2 and holding L1 constant, or by changing L1 and L2 together). For example, the conductive stage can be movable such that both L1 and L2 are capable of independent adjustment during operation of the reactor by moving one or both of the conducting short and the conductive stage. In another refinement, the microwave plasma assisted reactor is free from an external matching circuit. In another refinement, the component comprises single-crystal diamond, microcrystalline polycrystalline diamond, or nanocrystalline polycrystalline diamond.

While the disclosed apparatus, methods and compositions are susceptible of embodiments in various forms, specific embodiments of the disclosure are illustrated (and will hereafter be described) with the understanding that the disclosure is intended to be illustrative, and is not intended to limit the claims to the specific embodiments described and illustrated herein.

BRIEF DESCRIPTION OF THE DRAWINGS

For a more complete understanding of the disclosure, reference should be made to the following detailed description and accompanying drawings wherein.

Figure 1:
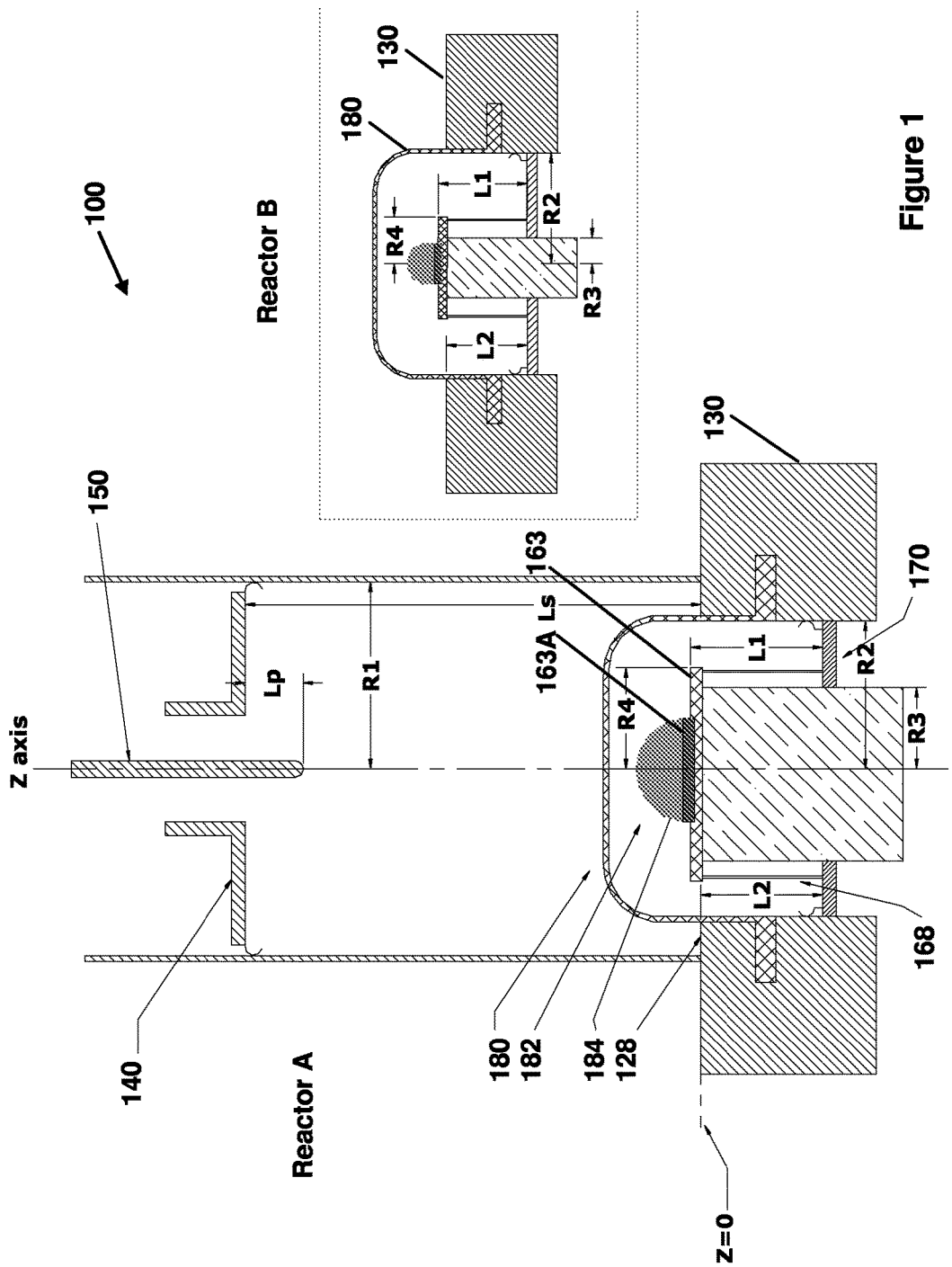
FIG. 1 is a cross sectional view of a MCPR reactor according to the disclosure in which the z=0 plane separates the cylindrical and coaxial sections of the reactor (Reactor A (left): large diameter substrate holder and conductive stage; Reactor B (right): smaller diameter holder and conductive stage; substrate position $Z_s$ is given by $Z_s$=L1−L2).

While the disclosed apparatus, compositions, articles, and methods are susceptible of embodiments in various forms, specific embodiments of the disclosure are illustrated in the drawings (and will hereafter be described) with the understanding that the disclosure is intended to be illustrative, and is not intended to limit the claims to the specific embodiments described and illustrated herein.

DETAILED DESCRIPTION

The disclosure relates to microwave cavity plasma reactor (MCPR) apparatus and associated tuning and process control methods that enable the microwave plasma assisted chemical vapor deposition (MPACVD) of a component such as diamond. Related methods enable the control of the microwave discharge position, size and shape, and enable efficient matching of the incident microwave power into the reactor prior to and during component deposition. Pre-deposition tuning processes provide a well matched reactor exhibiting a high plasma reactor coupling efficiency (e.g., coupling efficiency η of at least 90%, 95%, 98%, or 99%; alternatively a power reflection coefficient R of 0.1, 0.05, 0.02, or 0.01 or less) over a wide range of operating conditions (e.g., including and beyond those used in the tuning processes), thus allowing operational input parameters to be modified during deposition (e.g., to control a dependent deposition variable such as substrate temperature, deposition rate, deposition uniformity) while simultaneously maintaining the reactor in a well-matched state (e.g., high coupling efficiency $r_t$ and/or low power reflection coefficient R). Additional processes are directed to real-time process control during deposition, in particular based on identified independent process variables which can effectively control desired dependent process variables during deposition while still maintaining a well-matched power coupling reactor state.

High Pressure Microwave Discharges

At high pressures and high power densities, microwave discharges in hydrogen gas have neutral gas temperatures in excess of 2500 K, contract and separate from the surrounding discharge chamber walls, and become a very non-uniform, intense and "arc like" discharge. As pressure is increased, the gas temperature and discharge power density increase, resulting in a floating discharge with increased active radical plasma species having the potential for increased growth rates. The formation of contracted and floating microwave discharges at high pressures, which are identified herein as microwave arcs, has been observed and studied in many experiments. The microwave arc, like lower frequency arcs, is a thermally inhomogeneous discharge. It has a hot central core, and sharp thermal gradients exist between the discharge center and the surrounding walls. Microwave energy is readily coupled into the electron gas in the hot discharge center because of its reduced gas density, and neutral gas species are also readily ionized, dissociated, and excited in the hot central discharge core. These high pressure microwave discharges have been applied as discharges in electrothermal thruster space engines and as high pressure, high power microwave discharge light sources.

An important difference between high pressure and low pressure microwave discharges is that the microwave discharge entirely fills the discharge chamber at low pressures and produces a diffusion loss dominated, cold (i.e., gas temperatures are less than 1000 K), non-equilibrium plasma. In the high pressure regime, the microwave discharge is hot (i.e., gas temperatures are greater than 2000 K), is volume recombination dominated, and becomes a more thermal-like discharge. Plasma densities for 2.45 GHz hydrogen discharges operating at 100 Torr to 200 Torr are estimated to be about $10^{11}$ $cm^{-3}$ to about $10^{13}$ $cm^{-3}$ (i.e., free electrons per unit volume). At these high pressures, the discharge separates from the walls and can become freely floating, taking on shapes that are related to the shape of the impressed electromagnetic fields. The discharge can even move about the discharge chamber as it reacts to the buoyant forces on the discharge and to the convective forces caused by the gas flows in the discharge chamber (e.g., source gas inlet and exhaust gas outlet).

Thus, high pressure microwave discharges behave very differently from the typical low pressure discharge and require new methods of discharge control and microwave applicator and plasma reactor design that take into account the distinctly unique nature of the high pressure microwave plasma. The goal in a CVD application is to control the size, the spatial location and the shape of this very hot, non-uniform discharge in such a manner to enable optimal CVD diamond synthesis. This is a formidable engineering challenge. The disclosed high pressure plasma reactors and associated methods allow the spatial positioning and shaping of this thermally inhomogeneous, hot microwave discharge, thereby enabling the optimization of the diamond CVD process at high pressure.

Reactor Geometry

Figure 1A:
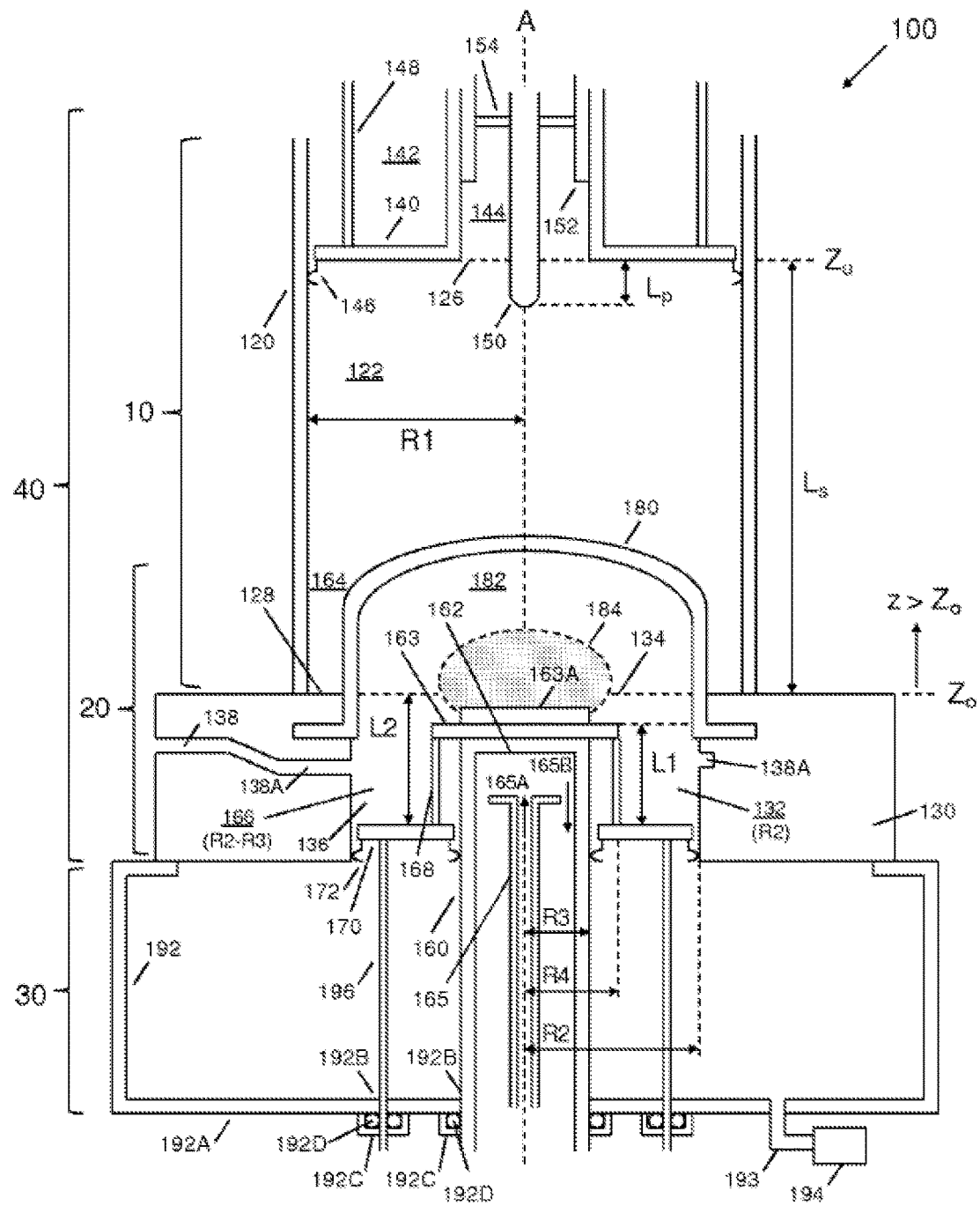
FIG. 1A illustrates a cross-sectional view of a microwave plasma assisted reactor (or microwave cavity plasma reactor; "MCPR") embodiment according to the disclosure.

A cross sectional view of an internally tunable microwave plasma assisted reactor 100 according to the disclosure is illustrated in FIG. 1A. The reactor 100 generally includes a microwave chamber/section 10, a plasma chamber/section 20, and a vacuum chamber/section 30. The reactor 100 has a generally cylindrical structure with components that are generally aligned along a central axis A (e.g., the z-axis in a cylindrical coordinate system with substantial component symmetry in the theta, θ (or phi, ϕ) direction). Collectively, the microwave chamber 10 and the plasma chamber 20 are referenced as an applicator 40. The microwave chamber 10 and the plasma chamber 20 meet at a reference axial location $Z_o$ (or z=0). The applicator 40 includes two coupled cavities at the $Z_0$ plane: a cylindrical cavity section ($z \geq Z_0$) and a coaxial cavity section ($z \leq Z_0$).

The microwave chamber 10 includes a cylindrical chamber 120 (e.g., an open-ended metallic cylinder) defining an interior cylindrical cavity 122 of radius R1 aligned with the central axis A. The cylindrical cavity 122 has a lower boundary 128 (e.g., a metallic portion of the base 130) at the reference axial location $Z_0$ and an upper boundary 126 at an axial location $Z_u > Z_0$ (i.e., the microwave chamber 10 generally extends upwardly in an axial direction $z > Z_0$). The microwave chamber 10 can be cooled with an external coolant, for example with cooling lines (e.g., for water or other cooling liquid) on the exterior of the cylindrical chamber 120 and/or with a cooling gas inlet/outlet (e.g., for air or other cooling gas) in fluid communication with the cylindrical cavity 122. As illustrated, the cylindrical chamber 120 has a uniform radius R1 throughout its height. In alternative embodiments, the cylindrical chamber 120 can have a multi-section construction, for example including a first cylindrical chamber of radius R1a (or other characteristic width dimension for non-cylindrical chambers) adjacent to the base 130 and a second cylindrical chamber of radius R1b adjacent to the first cylindrical chamber and extending upwardly away from the base 130. In general, R1a can be less than or greater than R1b depending on the resulting influence upon the microwave field in the microwave chamber 10.

The microwave chamber 10 further includes an upper conducting short 140 in electrical contact with the cylindrical chamber 120 and disposed in an upper portion 142 of the cylindrical chamber 120 at an axial distance Ls above Z0. The upper conducting short 140 has a central opening 144, defines the upper boundary 126 of the cylindrical chamber 120, and is electrically connected to the side walls of the cylindrical chamber 120 via finger stocks 146. Preferably, the upper conducting short 140 is slidably disposed in the cylindrical chamber 120, and its axial position can be adjusted by any suitable means, for example using a sliding (e.g., threaded) rod/gear assembly (e.g., via rods 148 (mounted to the upper conducting short 140) and as illustrated in more detail in U.S. Pat. No. 5,311,103; incorporated herein by reference).

The microwave chamber 10 further includes an excitation probe 150 as an electromagnetic wave source extending through the central opening 144 of the upper conducting short 140 and into an upper portion of the cylindrical cavity (or microwave chamber) 122 by an axial distance Lp relative to the upper boundary 126. The excitation probe 150 is generally capable of generating radiofrequency waves in the UHF (e.g., about 300 MHz to about 3 GHz) and/or microwave (e.g., about 300 MHz to about 300 GHz or about 300 MHz to about 100 GHz) frequency domain. Suitable specific excitation frequencies include 915 MHz and 2.45 GHz. As illustrated, the excitation probe 150 is supported in an inner sleeve 152 by an insulator/holder 154. The inner sleeve 152 preferably is adjustably mounted on the interior annular surface of the upper conducting short 140. Similar to the upper conducting short 140, the excitation probe 150 also is adjustably disposed in the cylindrical chamber 120, and its axial position can be adjusted by any suitable means, for example using a gear assembly to slide the inner sleeve 152 and the excitation probe 150 as a unit relative to the upper conducting short 140 (e.g., as illustrated in U.S. Pat. No. 5,311,103; incorporated herein by reference). In an embodiment, the axial positions of both the upper conducting short 140 and the excitation probe 150 are independently adjustable to provide an impedance tuning mechanism to minimize reflected power in the cylindrical cavity 122.

The plasma chamber 20 includes a base 130 (e.g., a metallic base) that defines an interior base cavity 132 (e.g., a cylindrical cavity of radius R2) and that is mounted to the cylindrical chamber 120 of the microwave chamber 10. The interior base cavity 132 has (i) an upper boundary 134 at $Z_0$ and adjacent the cylindrical chamber 120 and (ii) a lower portion 136 extending axially downwardly in a direction $z<Z_0$. As illustrated, the base 130 includes a source/feed gas inlet in fluid connection with the base cavity 132, for example a conduit 138 extending through the base 130 and opening into the base cavity 132 through an annular manifold 138A (or other similar structure for tangentially distributing the source gas). The plasma chamber 20 further includes a quartz bell jar 180 mounted in/on the base 130 and extending upwardly into a bottom portion 164 of the cylindrical cavity 122 (i.e., $z>Z_0$). Together, the base 130 and the quartz bell jar 180 define an interior cavity 182 of the plasma chamber 20 (e.g., by an outer wall/boundary including the quartz bell jar 180 and the interior surface (i.e., at r=R2) of the base 130). The base 130 optionally can include cooling channels (e.g., a water cooling channel and/or a gas cooling channel; not shown) that circulate one or more coolants through the base 130 to provide a mechanism for controlling the temperature of the base 130, the quartz bell jar 180, and/or the interior cavity 182 of the plasma chamber 20 during operation of the reactor 100.

The plasma chamber 20 further includes a coaxial stage 160 (e.g., a conductive stage, for example a metallic tube) having a radius R3 and an upper surface 162. The coaxial stage 160 extends at least into the base cavity 132 and optionally into the bottom portion 164 of the cylindrical cavity 122 (i.e., the axial position of the upper surface 162 can be $z \leq Z_0$ or $z > Z_0$ based on the axially adjustable nature of the coaxial stage 160). The coaxial stage defines a coaxial cavity (or microwave chamber) 166 between R3 and R2 in the base cavity 132. A substrate holder 163 (e.g., a molybdenum substrate holder) having a radius R4 is mounted on the upper surface 162 of the coaxial stage 160; during operation of the reactor 100, a deposition substrate 163A is placed on the substrate holder 163. The thickness (i.e., in the z-direction) of the substrate holder 163 is suitably about 0.6 cm; however, the thickness can be varied as an additional means to independently vary L1 and L2. As illustrated, the substrate holder 163 is a flat, disk-shaped structure. Alternatively, the substrate holder 163 can contain a recess (not shown) in its upper surface facing the interior cavity 182, and the deposition substrate 163A is seated in the recess during operation. In an embodiment, the coaxial stage 160 includes internal structure to cool (or otherwise control the temperature of) the substrate 163A during operation. As illustrated, a conduit 165 in the interior of the coaxial stage 160 provides an inlet for a (relatively cold) coolant 165A (e.g., gas or liquid, preferably water) that serves as a heat transfer medium to withdraw heat from the substrate 163A and then exits the coaxial stage 160 as a heated coolant 165B. Alternatively, a relatively hot stream 165A can be used to warm the substrate 163 and then exit as a cold stream 165B.

The plasma chamber 20 further includes a lower conducting short 170 adjustably disposed in the coaxial cavity 166 below $Z_o$ and in electrical contact with the base 130 and the coaxial stage 160 via finger stocks 172. As illustrated, the lower conducting short 170 has a solid annular construction (e.g., a metallic construction); however, the lower conducting short 170 can include one or more channels (or other orifices; not shown) that allow effluent gases to escape from the interior cavity 182 of the plasma chamber 20 into the vacuum chamber 30. The axial distance between the lower conducting short 170 and $Z_o$ is L2, and the axial distance between the lower conducting short 170 and the substrate holder 163 (or a base or bottom portion of the substrate 163A) is L1. Alternatively, the distance L1 can be measured between the lower conducting short 170 and an upper or top portion of the substrate 163A. Together, the two distances define a difference $\Delta L=L1-L2$ that denotes the displacement of the coaxial stage 160, substrate holder 163, and the substrate 163A from $Z_o$.

As illustrated in FIG. 1A, the plasma chamber 20 can further include a quartz tube holder 168. The quartz tube holder 168 is generally mounted on the lower conducting short 170 and extends upwardly to the substrate holder 163. The quartz tube holder 168 has a radius slightly larger than that of the coaxial stage 160, thereby defining an annular gap between the quartz tube holder 168 and the coaxial stage 160. The quartz tube holder 168 controls the flow of exhaust gas leaving the interior cavity 182 of the plasma chamber 20. Specifically, the substrate holder 163 has holes/conduits (not shown) at the outer radial positions of the substrate holder 163, thereby directing exhaust gas from the interior cavity 182 into the annular gap between the quartz tube holder 168 and the coaxial stage 160. In this case, holes/conduits are placed in the lower conducting short 170 at radial positions between the quartz tube holder 168 and the coaxial stage 160. In an embodiment (not shown), the quartz tube holder 168 can be fixed/mounted to the substrate holder 163 and can have portions that slidably extend through accommodating openings in the lower conducting short 170. In this case, L1 and L2 can be slidably adjusted without having to insert a quartz tube holder 168 of variable height.

Figure 1B:
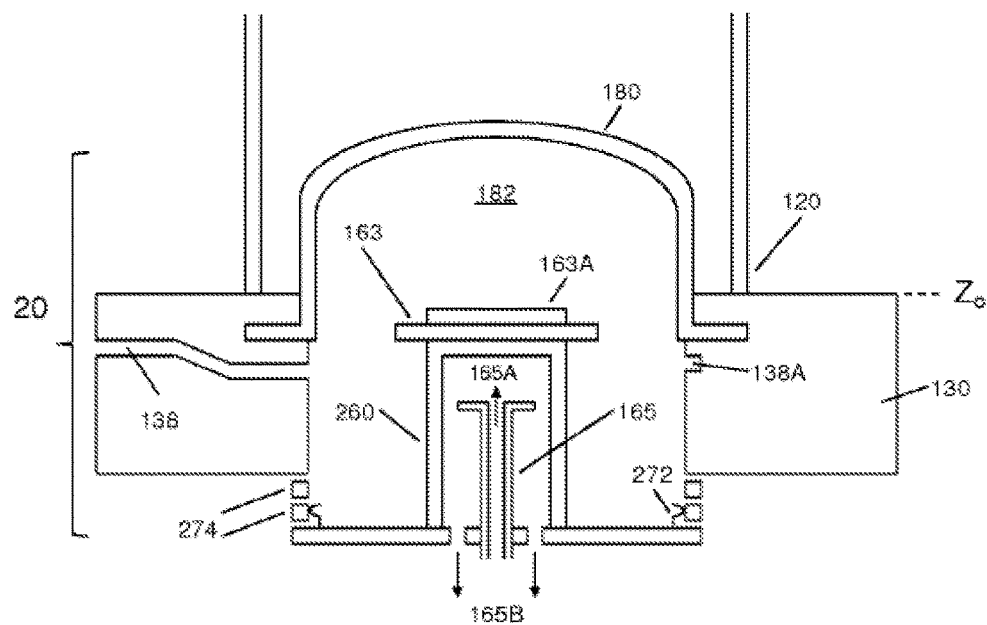
FIG. 1B illustrates a cross-sectional view of an alternative embodiment for a plasma chamber for the microwave plasma assisted reactor of FIG. 1A.

FIG. 1B illustrates an alternate embodiment of the lower conducting short 270. The lower conducting short 270 has a disk-shaped structure (e.g., a metallic construction) that is in electrical contact with the base 130 (via finger stocks 272) and with the conducting stage 260 (via direct contact). The axial position of the lower conducting short 270 is adjustable in the coaxial cavity 166 below $Z_0$ by selecting one or more conducting shim inserts 274 (e.g., conducting annular metallic rings of predetermined height) that are interposed between the base 130 and the lower conducting short 270. The structure illustrated in FIG. 1B is held in place during operation, for example, with bolts (not shown) that extend through lower conducting short 270, the shim inserts 274, and into the base 130. As illustrated, the coaxial stage 260 is a cylinder mounted on the lower conducting short 270; however, the coaxial stage can have similar cooling structure as that illustrated in FIG. 1A (e.g., a coolant inlet and a coolant outlet passing through conduits in the lower conducting short 270 and into the interior of the coaxial stage 260).

An aspect of the disclosed reactors is that the geometric reactor length scales L1 and L2 are adjustable by altering the axial location of the lower conducting short 170/270 in the coaxial cavity 166. In FIG. 1A, the illustrated conducting short 170 is a slidable, annular disk that can be moved in the axial direction before and/or during the operation of the reactor 100. In FIG. 1B, the illustrated conducting short 270 is a disk that can be repositioned in the axial direction by altering the number and/or size of the shim inserts 274 that are axially interposed between the base 130 and the lower conducting short 270. Preferably, both of the length scales L1 and L2 are independently adjustable. Thus, in the embodiment illustrated in FIG. 1A, the coaxial stage 160 is independently slidable/adjustable relative to the conducting short 170 such that L2 can be independently adjusted before and/or during the operation of the reactor 100. In the embodiment illustrated in FIG. 1B, the height of the coaxial stage 160 can be adjusted by selecting stages of differing height for mounting to the conducting short 270. The specific methods for adjusting L1 and L2 are not particularly limited, and can include any of a variety of known methods (e.g., using a gear assembly, using an o-ring sealed movable rod, manually repositioning the components, etc.).

The vacuum chamber 30 is defined by vacuum chamber walls 192 that are mounted to the base 130 of the plasma chamber 20 to provide an air-tight seal. The vacuum chamber 30 further includes a conduit 193 through the chamber walls 192 that is connected to a vacuum pump 194 that helps maintain a desired operating pressure in the plasma chamber 20 during operation. As illustrated, a base portion 192A of the chamber walls 192 can include one or more conduits/openings 192B that permit the structural/mechanical coupling of various elements in the plasma chamber to the external environment. For example, vacuum seals 192C (e.g., including an o-ring 192D) can accommodate slidable rods 196 that are attached to the lower conducting short 170 and that extend through the vacuum chamber 30 to the external environment. The rods 196 can be repositioned to adjust the axial position of the lower conducting short 170 by any of a variety of methods (e.g., manual, coupling to a gear assembly similar to that used to adjust the position of the upper conducting short 140, where the gear assembly can be under manual and/or automatic control). As illustrated, a conduit 192B also is provided for the coaxial stage 160 (and any internal structure such as the conduit 165) so that the coaxial stage 160 can be axially repositioned similarly to the slidable rods 196 and the lower conducting stage 170.

Characteristic dimensions and coordinates of the reactor 100 are shown in FIG. 1A. They are the distance $L_p$ that the excitation probe 150 extends beyond the conducting short 140, the height $L_s$ of the cylindrical cavity 122, the radius R1 of the cylindrical cavity, the radii R2 and R3 that define the annular width of the coaxial cavity 166, the radius R4 of the substrate holder 163, the thickness D of the substrate holder 163, and lengths L1 and L2 in the coaxial cavity 166 defining the position of the lower conducting short 170 and the coaxial stage 160. Generally, R1≥R2≥R4≥R3 and $L_s$≥L1 and L2, although other variations are possible. The substrate 163A itself is located approximately at $Z_0$ near the open end of the coaxial cavity 160 on the substrate holder 163. Thus, the upper surface 162 of the conducting coaxial stage 160 serves as a platform for the substrate holder 163, and the interior of the coaxial stage 160 allows temperature control of the substrate 163A (e.g., via water cooling/heating as illustrated). The conducting coaxial stage 160 and the substrate holder 163 are collectively identified as the powered electrode. The difference between L1 and L2 (i.e., L1−L2=ΔL), is the distance that the top surface of the powered electrode or the substrate surface is above or below the cylindrical cavity 122 bottom $Z_o$ plane (z=0).

The specific dimensions of a given reactor design generally scale inversely with the microwave excitation frequency of the excitation probe 150 (i.e., relatively higher probe 150 frequencies generally call for smaller reactor scales and vice versa). Two common excitation frequencies are 2.45 GHz and 915 MHz. For a 2.45 GHz-reactor, suitable dimensions include R1 ranging from about 6 cm to about 12 cm or 18 cm (e.g., about 8.9 cm), R2 ranging from about 5 cm to about 10 cm or 15 cm (e.g., about 7.0 cm), R3 ranging from about 0.5 cm to about 5 cm or 8 cm (e.g., about 0.95 cm, 1.9 cm, or 4.1 cm)), R4 ranging from about 1 cm to about 6 cm or 12 cm (e.g., about 3.25 cm), $L_s$ ranging from about 15 cm to about 25 cm (e.g., about 20 cm), $L_p$ ranging from about 2 cm to about 5 cm (e.g., about 3.6 cm), and/or L1 and L2 independently ranging from about 4 cm to about 8 cm (e.g., |ΔL| about 2 cm, 1 cm, or 0.5 cm or less, including cases where ΔL≠0 (i.e., a net displacement of the substrate 163/coaxial stage 160 from $Z_o$)). For a 915 MHz-reactor, suitable dimensions include R1 ranging from about 15 cm to about 25 cm or 40 cm (e.g., about 30 cm), R2 ranging from 5 cm to about 30 cm (e.g., about 15 cm), R3 ranging from about 2 cm to about 20 cm (e.g., about 9.5 cm), R4 ranging from about 2 cm to about 20 cm (e.g., about 12 cm), $L_s$ ranging from about 40 cm to about 80 cm (e.g., about 60 cm), $L_p$ ranging from about 5 cm to about 15 cm (e.g., about 8 cm), and/or L1 and L2 independently ranging from about 10 cm to about 20 cm (e.g., |ΔL| about 5 cm, 2 cm, or 1 cm or less, including cases where ΔL≠0 (i.e., a net displacement of the substrate 163/coaxial stage 160 from $Z_0$)).

The ratio R3/R2 can be up to about 0.8 in many applications. An aspect of the disclosure, however, is that a reduction in the size/diameter of the coaxial stage 160 allows an increase in the applied power density of the plasma in a manner that is controllable to permit uniform and high deposition rates (e.g., of diamond) on the substrate 163A. Thus, the radius R3 is suitably small relative to R2. For example, the ratio R3/R2 is suitably about 0.5 or less, about 0.4 or less, about 0.3 or less, or about 0.2 or less. Due to practical structural considerations (e.g., if the coaxial stage 160 include internal temperature control structure), the ratio R3/R2 is suitably about 0.05 or more, or about 0.1 or more.

Another aspect of the disclosure is that relatively fine adjustments of the axial positions of the lower conducting short 170 and/or the coaxial stage 160 (e.g., in the neighborhood of $Z_0$) allow positioning of the electromagnetic focus of the plasma above the substrate 163A to provide an additional means to control deposition rates. Thus, during or before operation (e.g., when tuning the reactor and/or when depositing a component), the distance ΔL is suitably small relative to L1 and/or L2. For example, the ratio |ΔL|/L1 or |ΔL|/L2 is suitably about 0.5 or less, about 0.2 or less, about 0.1 or less, or about 0.05 or less. In practice, a desirable, tuned value of ΔL is non-zero, and often ΔL<0 during operation.

The disclosed reactor can be provided in the form of a kit that facilitates the selection by a user of specific geometric embodiments. For example, the kit can include a microwave plasma assisted reactor according to any of the disclosed embodiments in conjunction with at least one of: (a) a plurality of cylindrical chambers, each defining an interior cylindrical cavity of a different radius R1; (b) a plurality of bases, each defining an interior base cavity of a different radius R2; and, (c) a plurality of coaxial stages, each having a different radius R3. When the kit includes a plurality of bases, a plurality of appropriately sized quartz bell jars and lower conducting shorts (whether disk-shaped, annular, or otherwise) are also included in the kit. Similarly, when the kit includes a plurality of coaxial stages, a plurality of appropriately sized lower conducting shorts also can be included in the kit (e.g., annular lower conducting shorts should be complementary in size with the individual coaxial stages; however, a single disk-shaped lower conducting short can accommodate the plurality of coaxial stages). A plurality of shim inserts (with the same or different heights) also can be provided in the kit. Thus, the reactor can be assembled with any combination of the cylindrical chambers, the bases, the coaxial stages, and any attendant complementary parts such that at least one of R1, R2, and R3 can be varied in a selected reactor assembly.

Variable-Chamber Reactor Designs

Figure 1C:
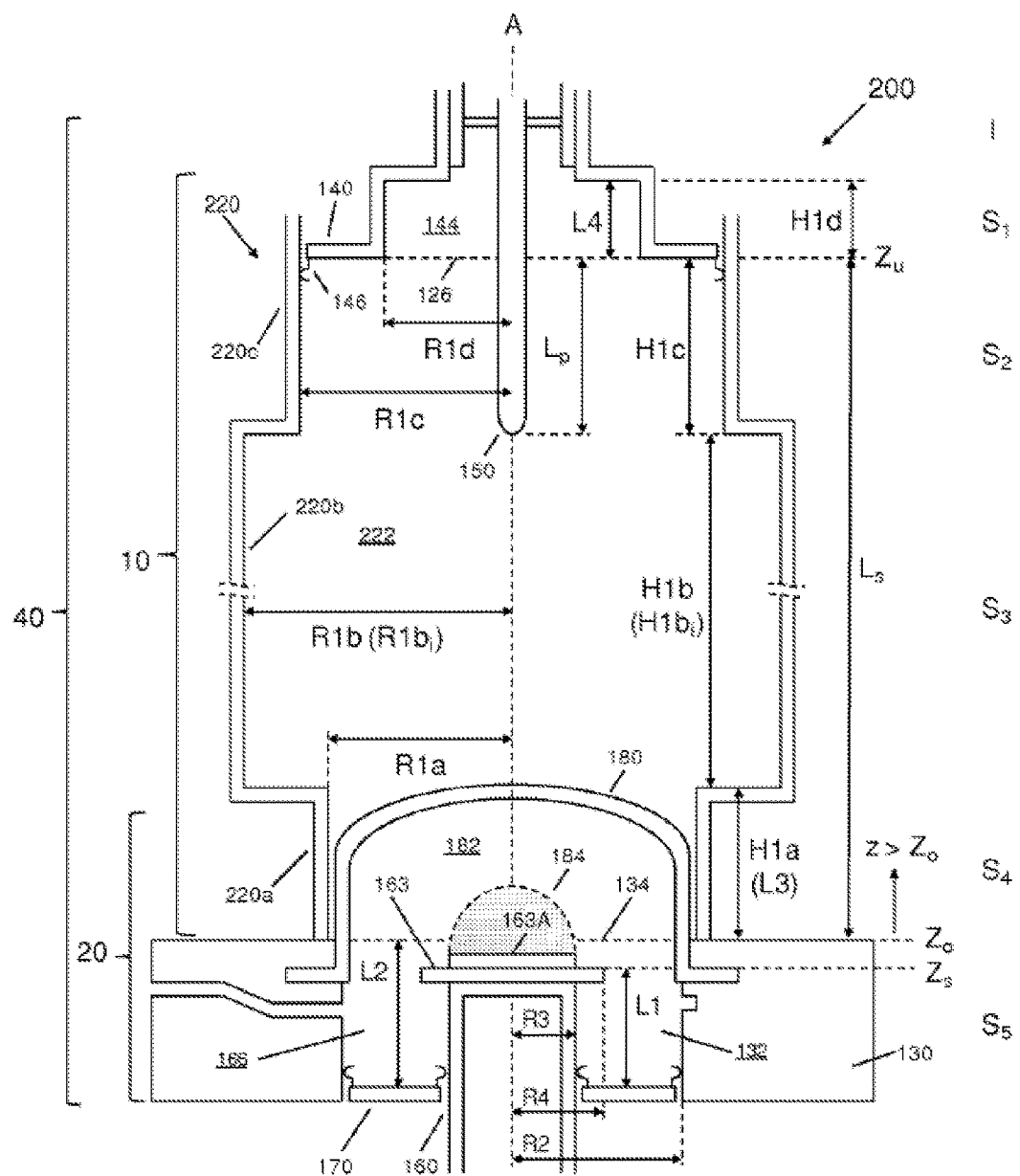
FIG. 1C illustrates a cross-sectional view of a generalized microwave plasma assisted reactor embodiment according to the disclosure.

In its most generalized form, the internally tunable MCPR according to the present disclosure has many separate cylindrical coaxial and cylindrical waveguide sections each with different radii and variable lengths. An example of a generalized reactor design 200, which consists of an input section I and reactor sections S1-S5, is shown in FIG. 1C. Analogous to FIG. 1A, the microwave chamber 10 includes a multi-section and/or variable-radius chamber 220, for example including cylindrical sections 220a, 220b, and 220c which define corresponding reactor sections S2-S4 (e.g., metallic sections with a step-wise (shown), linear, or curved profile transition therebetween). The chamber 220 and its sections 220a-c define an interior cavity 222 with respective radii and heights of R1a, R1b, and R1c and H1a (or L3), H1b, and H1c relative to the central axis A. As shown, the sliding short 140 can have a variable radius design (e.g., also with a step-wise profile as shown) to define the reactor section 51 and the cylindrical cavity 144 with radius R1d and height H1d (or L4) adjacent to the uppermost section of the cavity 222 (e.g., reactor section S2 defined by the cylindrical section 220c as illustrated).

Figure 10:
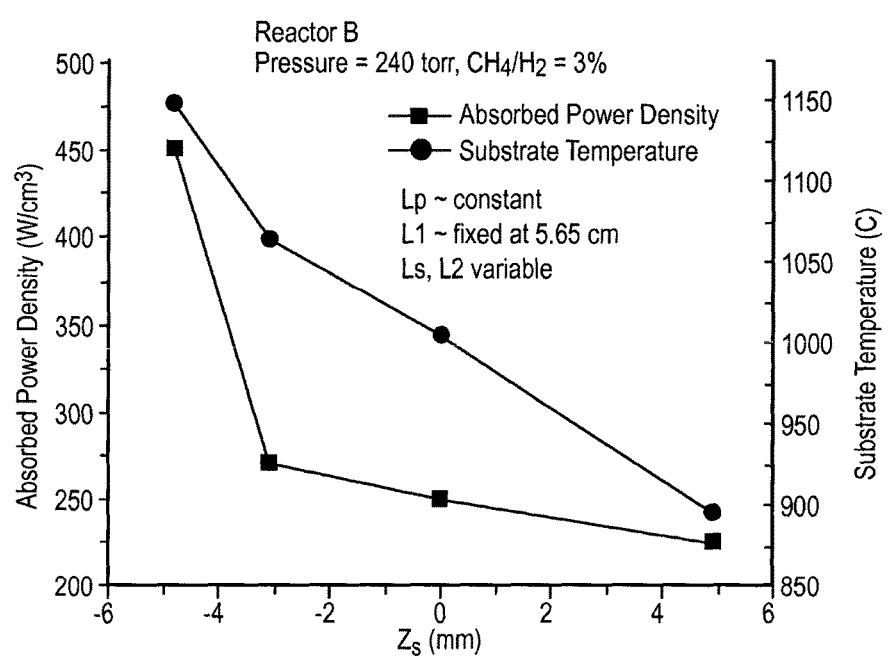
FIG. 10 is a graph illustrating the variation of reactor absorbed power density and substrate temperature as a function of substrate position Zs (e.g., where Zs may be varied during component deposition to maintain the absorbed power density and/or the substrate temperature at a setpoint value).

The purpose of each section S1-S5 is (1) to guide and transmit microwave energy to the discharge load, (2) to impedance match the microwave power into the discharge, and (3) to appropriately spatially focus or refocus the microwave energy as it is transmitted through each individual waveguide section. By adjusting the position $Z_s$ of the substrate 163A in sections S4 and S5 above and below the Z=0 plane ($Z_0$; where $Z_S<Z0$ is below $Z_0$ and $Z_S>Z_0$ is above $Z_0$), the electromagnetic (EM) field in the vicinity of the substrate 163A can be varied (although the electric field is primarily in the axial direction, both Ez and Er electric field components vary as $Z_S$ is varied) to achieve the desired CVD process growth rate and growth uniformity. The choice of the specific configuration (e.g., the number of and the specific lengths of each of the cylindrical waveguide sections) employed in a particular design depends upon on the requirements of the particular application. As is indicated in FIG. 10, the waveguide section S3 can be further divided into multiple sections, each with a different radius R1b, and length/height H1b, (e.g., i=1 to n, where n is the number of sub-sections for waveguide section S3). In this case, R1b/R1a can be greater than 1 to represent a focusing contraction. In various embodiments, the ratio $R1b_{i+1}/R1b_i$ can be less than or greater than one for adjacent subsections i and i+1 depending on whether the EM energy is being locally focused or defocused by the subsections. Similarly, the (coaxial) waveguide section S2 and the (cylindrical) waveguide section S4 can be further divided into multiple sections, each with a different radius $R1c_i$ or $R1a_i$ and length/height $H1c_i$ or $H1a_i$, respectively (e.g., i=1 to n, where n is the number of sub-sections for the waveguide section). In various embodiments, successive sections $R1c_i$ can be expanding and successive sections $R1a_i$ can be contracting in the direction from $Z_U$ to $Z_0$ to provide desired defocusing or refocusing, respectively, of EM energy passing through the microwave chamber 10.

As used herein, "focused" (or "refocused") and "defocused" are terms indicating a relative increase or decrease, respectively, in the electromagnetic power density of microwave energy in a microwave cavity/chamber, such as between neighboring or adjacent regions of the microwave cavity/chamber. Generally, the microwave energy density becomes focused or refocused as the wave propagates through the microwave cavity/chamber from a region having a relatively larger cross sectional area to a region having a relatively smaller cross sectional area (e.g., a sudden or gradual contraction in cross sectional area, such as in a plane generally perpendicular to a primary direction of propagation of electromagnetic energy in the apparatus). Similarly, microwave energy flux density generally becomes defocused as it propagates through the microwave cavity/chamber from a region having a relatively smaller cross sectional area to a region having a relatively larger cross sectional area (e.g., a sudden or gradual expansion in cross sectional area, such as in a plane generally perpendicular to a primary direction of propagation of electromagnetic energy in the apparatus). For example, in the context of FIG. 10, microwave energy emanating from the probe 150 is defocused as it propagates from section S2 to S3, and it is focused/refocused as it propagates from section S3 to S4 and into the plasma chamber 180.

Figure 1D:
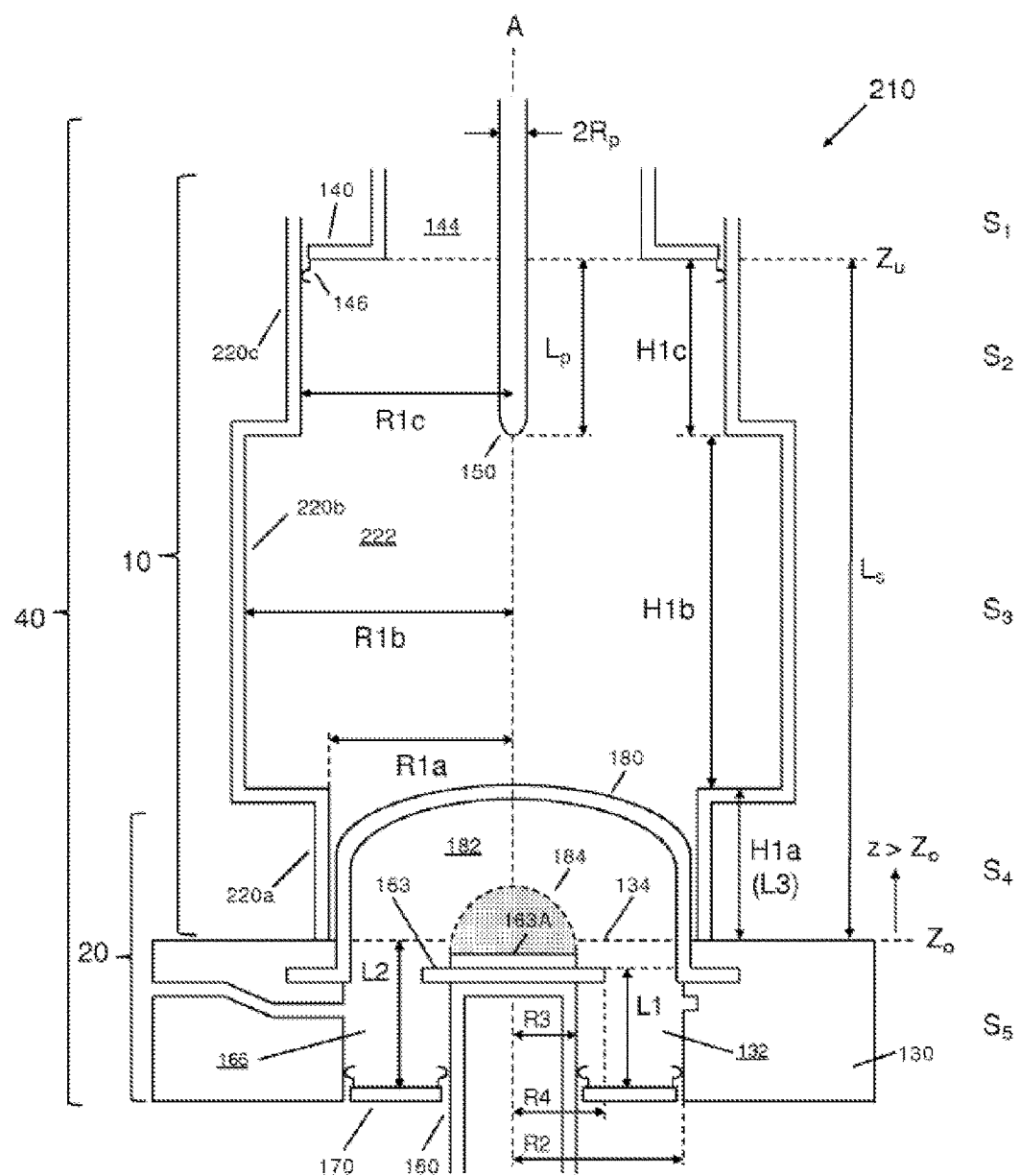
FIG. 1D illustrates a cross-sectional view of a microwave plasma assisted reactor embodiment with a three-section microwave chamber according to the disclosure.

A cross section of an embodiment of the more generalized reactor 200 design is shown in FIG. 1D as reactor 210. The internal cavity 222 is cylindrically symmetric about a center z-axis A, and the $Z_0$ plane is identified as the bottom of the reactor 210 and the top of the substrate holder 163 is located in the vicinity of the Z0 plane. The reactor 210 shown in FIG. 21 is divided into five interconnected but distinct cylindrical waveguide sections S1-S5. From the top to the bottom, these are identified as: section S1 which is the coaxial input microwave feed; section S2 which is a length-adjustable coaxial waveguide impedance-matching section of length $L_p$ and radius R1c; section S3 which is a cylindrical waveguide section of length Ls-L3-Lp and of radius R1b;

section S4 which is an additional cylindrical waveguide section of radius R1a and length L3; and section S5 which is a variable length, coaxial cavity section with radii R2 and R3 and variable length L2. The probe 150 has a radius Rp and the position of the probe 150 and/or sliding short 140 can be adjusted to select the desired length Lp (e.g., independently adjusted such that Lp and H1c can be the same or different). The length L1 of the cylindrical center conductor of section S5 is also independently variable (e.g., as described above relative to FIGS. 1A and 1B for the sliding short 170). The substrate 163A is placed on the top of the center conductor 163 of section S5 near the $Z_0$ plane. Thus the position $Z_S$ of the substrate 163A is independently variable and is defined by $Z_S$=L1−L2. The center conductor 163 of section S5 also serves as the substrate holder 163 and can be independently externally heated or cooled as described above.

As shown in FIG. 1D, section S1 is the coaxial waveguide input power port. Section (2), the second cylindrical coaxial waveguide section, behaves as an impedance matching section where in practice Lp is often adjusted to be close to a quarter TEM wavelength. In practice, the radial dimensions of this section (R1c and Rp), can be chosen to allow the propagation of a single TEM mode or the propagation of both the coaxial TEM and $TM_{01}$ modes. Section S3 also acts like an impedance matching section and, for this embodiment, the radius R1b is larger than the radii R1d and R1c of sections S1 and S2, respectively (e.g., R1b>R1c>R1d). This causes an EM field intensity redistribution over the waveguide cross section of section S3 and, for a given high input power operation, allows a lower EM power flux density (W/cm$^2$) to be transmitted through the empty waveguide region of section S3 than the power flux density being transmitted through sections S1 and S2. Thus, section S3 defocuses the microwave power as it is transmitted through the reactor 210 preventing at high input powers discharge formation in section S3.

Section S4 also behaves like an additional impedance matching and EM field refocusing section. Since it is desired to create an intense EM field region above the substrate 163A around the $Z_0$ plane and then maintain a discharge in this region at the center axis A of the reactor 210, the EM fields in section S4 are refocused onto the substrate holder 163 location around the $Z_0$ plane. This is accomplished by reducing the radius from R1b in section S3 to R1c of section S4 and then adding the appropriate, additional coaxial waveguide section S5 to the bottom of the applicator 40 enabling a strong electric field to be produced along the central z-axis A at the surface of the substrate 163A while avoiding power discharges in the microwave chamber 10.

Section S5 (−L2≤z≤0), behaves as a TEM mode coaxial waveguide section. When excited with 2.45 GHz microwave energy, only the TEM waveguide mode is excited in this section. By adjusting the coaxial cavity lengths L1 and L2 to about 6.12 cm, which is a half TEM wavelength, a standing wave $TEM_{001}$ mode EM field exists in this section and a perpendicular electric field is produced on the surface of the substrate 163A. The substrate position $Z_S$ is further adjusted by slightly varying L1 to position the substrate 163A above or below the $Z_0$ plane as desired.

Figure 1E:
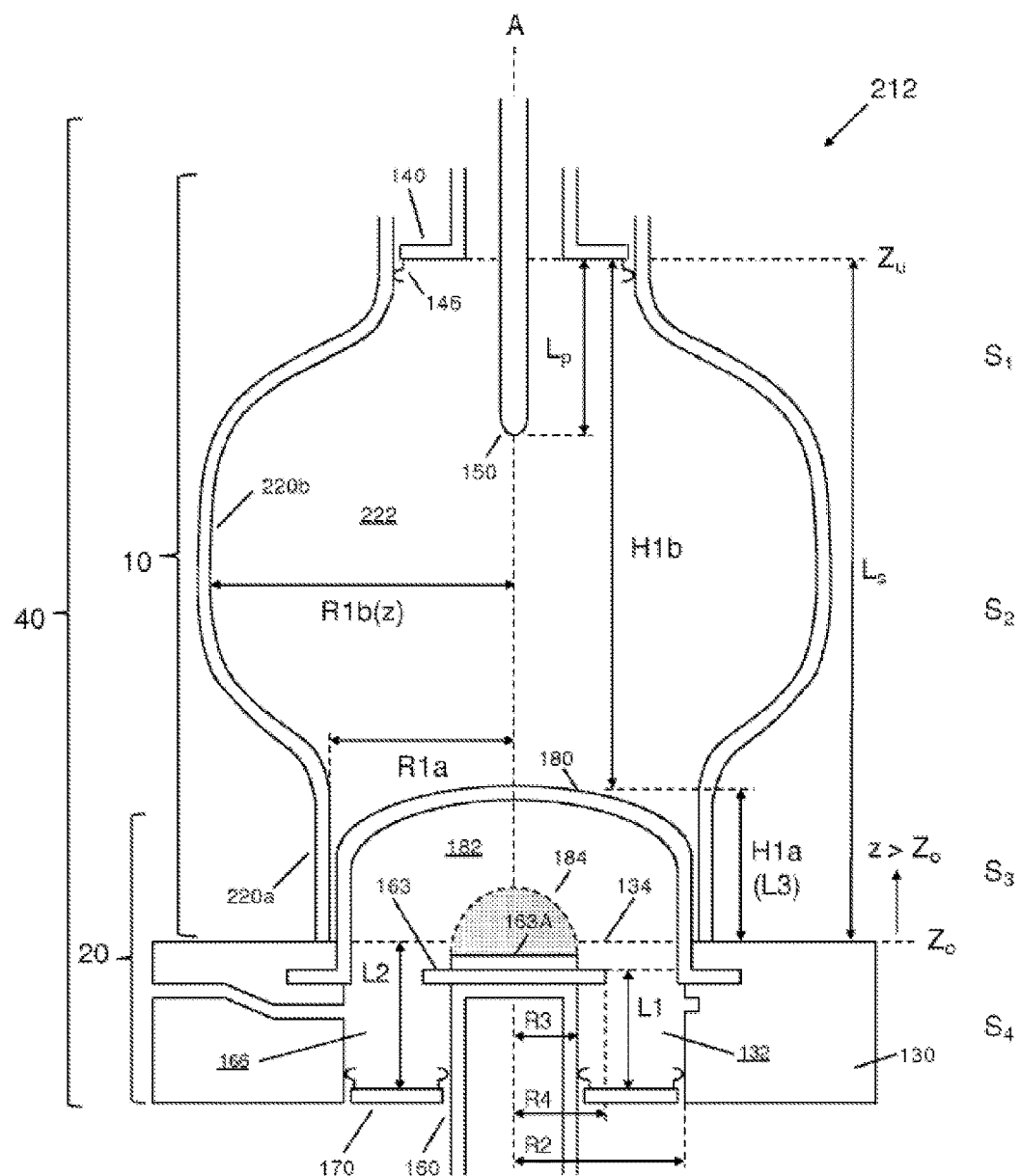
FIG. 1E illustrates a cross-sectional view of a microwave plasma assisted reactor embodiment with a variable-radius microwave chamber according to the disclosure.

Another embodiment of the generalized reactor 200 is shown in FIG. 1E as reactor 212 with a contoured, smooth curving wall/section 220b. The individual sections each with a different radii and length are replaced by a wall/section 220b with a continuously varying radius R1b(z). As illustrated, from the top $Z_U$ of the applicator 40 down toward the $Z_0$ plane, the radius R1b(z) first increases and then, as the substrate location $Z_S$ is approached, the radius R1b(z) decreases. Thus, the discrete cylindrical sections shown in FIG. 20 can be replaced with a gradual, continuously varying wall/section of radius R1b(z). The particular variation of R1b(z) depends on the desired EM unfocusing and refocusing that is desired and may be selected based on the specific plasma processing application. As shown, the curved, continuously varying section 220b can be connected to a generally cylindrical section 220a as described above. In other embodiments, the curved section 220b can extend to the base 130 at $Z_0$ of the applicator 40.

Figure 1F:
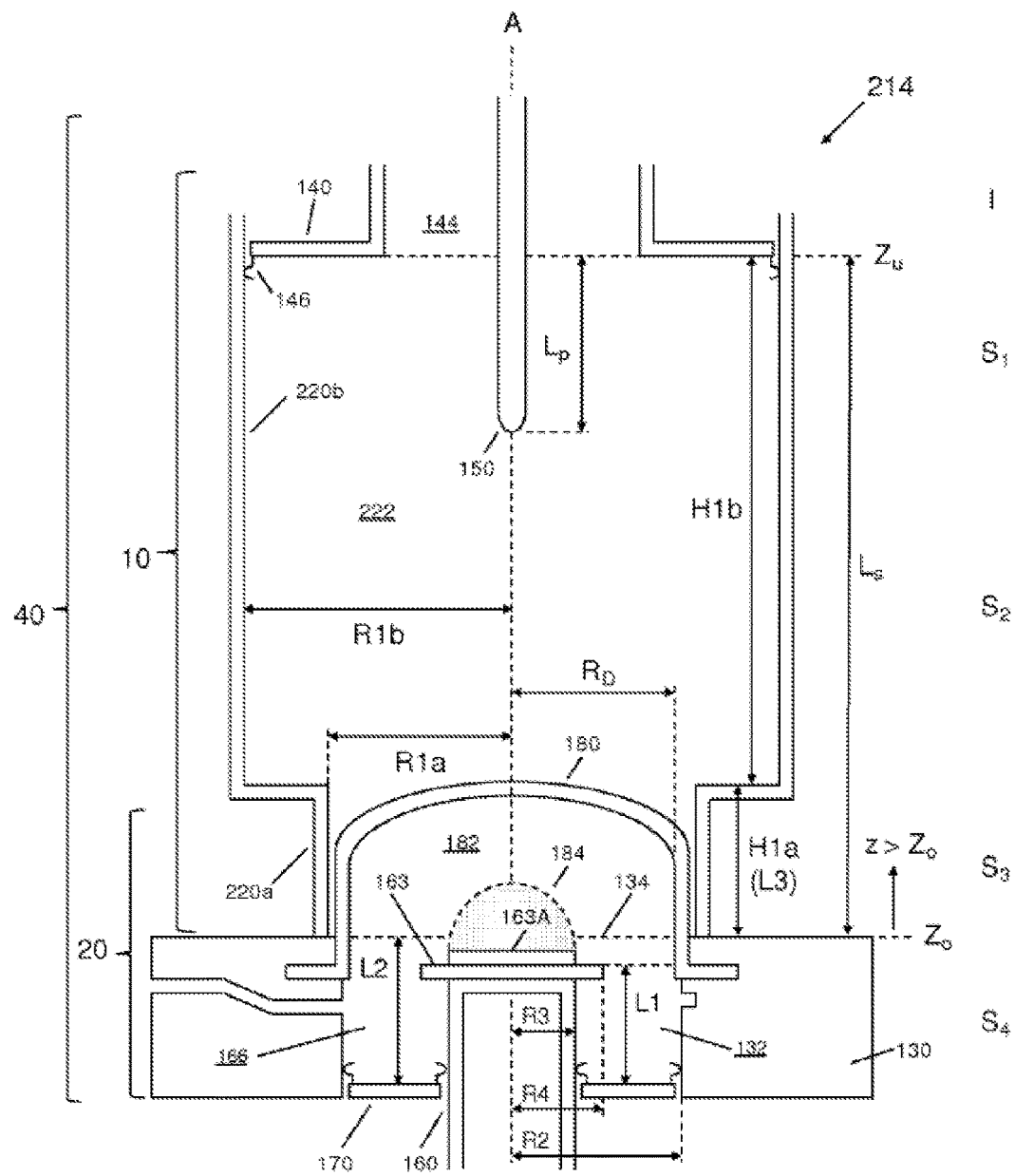
FIG. 1F illustrates a cross-sectional view of a microwave plasma assisted reactor embodiment with a two-section microwave chamber according to the disclosure.

Another embodiment of the generalized reactor 200 is shown in FIG. 1F as reactor 214 having two cylindrical sections with radii R1a and R1b (e.g., R1a<R1b as illustrated). As shown in FIG. 1F, the reactor 214 includes five cylindrical waveguide sections: the input section I and reactor sections S1-S4. The illustrate reactor 214 has four mechanically independent cavity applicator 40 adjustments: (1) variable coupling probe 150 length Lp, (2) variable substrate holder 163 length L1, (3) variable top plate sliding short 140 position Ls, and (4) variable lower conducting short plate 170 position L2. These enable process optimization and impedance matching and are varied for discharge control as input power, pressure, gas flow, substrate holder design, etc. are varied.

Reactor Operation

In practice, the plasma loaded applicator in any of the various disclosed reactor embodiments is excited with the hybrid $TM_{013}+TEM_{001}$ electromagnetic mode. In order to achieve $TM_{013}$ excitation in the open cylindrical cavity 122, $L_s$ is preferably adjusted/selected to be very close to $3\lambda_g/2$, where $\lambda_g$ is the guided wavelength of the $TM_{01}$ cylindrical waveguide mode. In order to achieve $TEM_{001}$ excitation in the coaxial section, L2 is preferably adjusted/selected to approximately $\lambda_0/2$, where $\lambda_0$ is the free space wavelength. In general, $\lambda_0$ is based on the relationship $f\lambda_0$=c (e.g., for excitation frequency f=2.45 GHz, $\lambda_0$=12.2 cm; for f=915 MHz, $\lambda_0$=32.8 cm). In practice, $\lambda_g$ is larger than $\lambda_0$ and can be computed as $\lambda_g=\lambda_0(1-(f_c/f)^2)0$, where $f_c$ is the cut-off frequency (and $f>f_c$). Suitable discharge ignition starting lengths for process development are when L1 and L2 are equal to each other and are equal to approximately $\lambda_0/2$. Then, ΔL is zero and the top of the substrate is substantially even with the $Z_0$ plane. Suitable starting lengths for the cylindrical section are $L_s$ of about $3\lambda_g/2$ and the coupling probe depth $L_p$ of about $\lambda_g/4$.

The geometry of the reactor 100 is generally a function of the geometric variables $L_s$, $L_p$, L1, L2, R1, R2, R3, and R4. The more generalized reactor 200 includes these and additional length scales associated with the variable-radius design of the cavity 222. When these geometric length variables are changed, the electromagnetic fields and the electromagnetic focus in the local region above and around the $Z_0$ plane are controlled and altered. Similarly, when a microwave discharge or plasma is present, the discharge power density, the plasma shape, and the plasma position can be altered by varying one or more of the geometric variables. Thus, a microwave plasma assisted deposition process (e.g., diamond synthesis) also can be changed, controlled, and optimized by changes in the reactor geometry.

When the size and shape of the reactor 100/200 is varied, for example by changing the various reactor radii or lengths, the reactor can be optimized for a specific deposition process. In practice R1 is determined primarily by the choice of the excitation frequency Generally, a range of R1 values can be used, ranging from a minimum R1 for the $TM_{013}$ mode to exist and some maximum R1 at which a distinct $TM_{013}$ mode is difficult to obtain due to many other modes having a similar $L_s$ value, and R2 and R3 are then determined by the specific process application (e.g., desired substrate size, operating pressure regime). For example, for low pressure, large-area operation and low discharge power density, R2 and R3 take on lengths that are slightly smaller than R1. Reactor designs according the disclosure often fix the applicator radii, and then, during process optimization, the electromagnetic field patterns and associated microwave discharge are modified by varying L1, L2, $L_s$ and $L_p$ as well as pressure and input microwave power. This is a multivariable optimization procedure that is initially performed by the operator during process development and after some experience it can also be performed automatically via a preprogrammed recipe. Since there are many variables, there are many possible shapes, positions, and intensities that the discharge can assume in the vicinity of the $Z_0$ plane, and all of these are available for process optimization.

The reactor 100/200 in any of its embodiments can be operated in a process to deposit a component (e.g., single-crystal diamond, polycrystalline diamond) on the substrate 163A mounted or otherwise located above the coaxial stage 160 (e.g., on the substrate holder 163). The specific construction of the substrate 163A is not particularly limited and can be suitably selected based on the particular component being deposited. For example, single-crystal diamond can be deposited on a single-crystal seed substrate (e.g., high-pressure, high-temperature single-crystal seed), and polycrystalline diamond can be deposited on a silicon-based substrate (e.g., nucleation-seeded silicon, doped silicon, or silicon nitride). Polycrystalline diamond can include both nanocrystalline diamond (e.g., crystals on the order of nanometers to hundreds of nanometers) and microcrystalline diamond (e.g., crystals on the order of micrometers to hundreds of micrometers).

The reactor 100/200 is operated by applying power to the excitation probe 150 to generate electromagnetic waves at a selected frequency. For example, applied powers ranging from about 1 kW to about 10 kW (e.g., about 2 kW to about 3 kW or about 4 kW) are suitable for a 2.45 GHz frequency, and applied powers ranging from about 5 kW to about 30 kW are suitable for a 915 MHz frequency. Based on the reactor 100/200 geometry and depending on the particular selection of characteristic length scales, a first electromagnetic mode M1 (e.g., $TM_{013}$) can be excited in the cylindrical chamber 122 of the reactor 100/200 and a second electromagnetic mode M2 (e.g., $TEM_{001}$) can be excited in the coaxial chamber 166 of the reactor 100/200, thereby forming a hybrid electromagnetic mode M3 in the plasma chamber 20. This "hybrid mode" has field patterns that are predominantly $TM_{013}$ in the cylindrical chamber and $TEM_{001}$ in the coaxial chamber. The two electromagnetic field patterns interact at the discontinuous $z=Z_0$ boundary plane. The abrupt physical discontinuity at the $Z_0$ plane sets up local evanescent fields on either side of the plane and the total field in the vicinity of the deposition substrate 163A (i.e., the impressed electromagnetic field that creates and sustains the plasma) is the sum of the two modes M1 and M2 plus the induced evanescent field.

The impressed substrate field can be varied by spatially changing the evanescent field around the discontinuity plane by varying the various dimensions such as R1, R2, R3 L1, and L2, etc. Thus by changing these dimensions, the electromagnetic focus at the substrate is varied. For example if R3 is reduced and L1 and L2 are approximately equal to one half of the free space wave length, then the field at the end of the substrate holder will be intense and mainly perpendicular to the top of the substrate. If L1 and L2 are then varied slightly, the field then has additional inward or outward directed radial components, there by changing the total impressed field pattern. If R3 and R4 are large (i.e., with respect to R2) then the impressed field pattern is reduced, but is more uniform over a larger radius, there by producing a more uniform plasma and a more uniform deposition over the larger substrate area. Thus, it is clear that a large variety of impressed electromagnetic field patterns can be created in the vicinity of the substrate by adjusting the reactor dimensions. Given a specific microwave plasma assisted CVD application, the reactor dimensions and tuning can be adjusted to optimize a specific process.

A source gas is fed to the interior cavity 182 of the plasma chamber 20 at a selected operating pressure to form a plasma 184 when power is being applied. The particular operating pressure in the plasma chamber 20 can range between about 10 Torr and 760 Torr and can be suitably controlled by the vacuum pump 194 and/or by source gas flow rates. The operating pressure is desirably increased, however, to increase the deposition rate of the component on the substrate 163A. For example, operating pressures of at least about 100 Torr, 150 Torr, 180 Torr, 200 Torr, or 220 Torr and/or up to about 300 Torr, 350 Torr, 400 Torr, 500 Torr, or 760 Torr can be selected in various embodiments. More particularly, suitable pressures at a 915 MHz frequency can range from about 100 Torr to about 160 Torr (e.g., when the substrate 163A ranges from about 10 cm to about 14 cm in size/diameter) or from about 20 Torr to about 100 Torr (e.g., when the substrate 163A ranges from about 14 cm to about 20 cm in size/diameter). Suitable pressures at a 2.45 GHz frequency can range from about 50 Torr to about 150 Torr (e.g., when the substrate 163A ranges from about 6 cm to about 9 cm in size/diameter). Alternatively, pressures at a 2.45 GHz frequency can range from about 100 Torr to about 400 Torr, about 180 Torr to about 260 Torr, or about 220 Torr to about 260 Torr (e.g., when the substrate 163A is up to about 6 cm or up to about 3 cm in size/diameter).

The particular source gas(es) fed to the plasma chamber 20 will depend on the particular deposition component. For diamond deposition, a mixture of methane ($CH_4$) and hydrogen ($H_2$) is suitable. The feed composition is generally expressed as a mol. % (or vol. %) of methane relative to hydrogen. For example, feed compositions of at least about 1 mol. % $CH_4$, 2 mol. % $CH_4$, or 3 mol. % $CH_4$ and/or up to about 5 mol. % $CH_4$, 6 mol. % $CH_4$, 8 mol. % $CH_4$, or 10 mol. % $CH_4$ can be selected in various embodiments. In some embodiments, the source gas can further include nitrogen ($N_2$) to increase the diamond deposition rate. Suitable nitrogen feed concentrations can range from about 0.005 mol. % N2 to about 2 mol. % $N_2$ relative to the hydrogen feed. Other source gases may be incorporated as desired to add desired dopants, for example including diborane ($B_2H_6$; to form boron-doped diamond). In yet other embodiments, an inert carrier gas (e.g., argon) can form the bulk of the source gas with desired levels of methane, hydrogen, etc. added to the carrier gas.

The process further includes adjusting the axial position of the lower conducting short 170 and/or the coaxial stage 160 of the reactor 100/200 to selectively position the electromagnetic focus of the plasma 184 above the substrate 163A during operation. The axial position adjustments can be made prior to operation of the reactor 100/200. For example, the lower conducting short 170 and the coaxial stage 160 can be set to their desired axial positions after which the reactor 100/200 can be powered on to execute a brief ignition step and then to perform a continuous deposition process according to the foregoing parameters. Alternatively or additionally, the lower conducting short 170 and the coaxial stage 160 can be set to their desired axial positions during the operation of the reactor 100/200 (e.g., using the structure illustrated in FIG. 1A to adjust the lower conducting short 170 and the coaxial stage 160 without needing to disassemble or otherwise access the plasma chamber 20 and the vacuum chamber 30).

The axial position adjustments can form the basis for a more general reactor tuning process. Specifically, a plurality (e.g., two or more) of combinations of L1 and L2 can be selected to identify favorable/optimum deposition properties (e.g., power density, substrate temperature, deposition rate, deposition uniformity) at a selected set of other operating parameters (e.g., operating pressure, source gas composition, applied power, coaxial stage radius (or other geometric parameters)). For example: L1 is held constant and L2 is parametrically varied over a plurality of values, L2 is held constant and L1 is parametrically varied over a plurality of values, or L1 and L2 are both parametrically varied over a plurality of values. Such parametric variation can be expressed in terms of a plurality of ΔL values that are individually tested (e.g., a plurality of ΔL/L1 or ΔL/L2 values ranging from about −0.5 to about 0.5, about −0.2 to about 0.2, about −0.1 to about 0.1, or about −0.05 to about 0.05). The tuning process is completed by operating the reactor 100/200 at each of the plurality of L1 and L2 (or ΔL) combinations and then measuring or otherwise characterizing one or more deposition properties resulting from each individual tuning selection. Deposition properties can be measured at each combination of L1 and L2, and a specific set of L1 and L2 values (or the tuned L1 and L2 values) can be selected as that which maximizes or otherwise optimizes the reactor operation in terms of one or more deposition properties. For example, it is generally desirable to maximize the power density and/or the deposition rate, and such maximization can be constrained by a desire to simultaneously maintain the substrate temperature and/or the deposition uniformity within or under a specific range based on safety and/or quality considerations.

While the tuning process generally applies to the selection of favorable/optimum geometric parameters for reactor operation, other operating conditions can be parametrically varied over a plurality of values in addition to the plurality of L1 and L2 values as part of the tuning process. For example, the operating pressure and/or the source gas composition can be varied to characterize their influence on one or more deposition properties.

The particular selection of geometric reactor parameters (e.g., coaxial stage 160 radius R3, coaxial stage 160 distance Li, lower conducting short 170 distance L2) permits operation of the reactor 100/200 under conditions that result in favorable/optimum properties of deposition process and/or resulting deposition film. Particular deposition properties of interest include applied power density, substrate temperature, deposition rate, and deposition uniformity. Thus, the reactor 100/200 is preferably capable of obtaining any combination of the foregoing deposition properties during operation, for example including deposition property values within the following ranges.

The power density (or discharge power density) is the absorbed microwave power divided by the plasma 184 volume. A relatively high power density is desirable as it generally leads to higher component deposition rates. In various embodiments, the power density is suitably at least about 50 W/cm$^3$, 100 W/cm$^3$, 120 W/cm$^3$, 160 W/cm$^3$, or 200 W/cm$^3$ and/or up to about 500 W/cm$^3$, 600 W/cm$^3$, 700 W/cm$^3$, 800 W/cm$^3$, 900 W/cm$^3$, 1000 W/cm$^3$, or 2000 W/cm$^3$.

During deposition, the temperature uniformity across the substrate 163A correlates with the size of the plasma 184. At low microwave powers, the plasma 184 may not completely cover the substrate 163A, leading to incomplete and/or non-uniform deposition. At higher microwave powers, the plasma 184 may expand in size to the point that it begins excessively heating the quartz bell jar 180. Thus, the substrate temperature uniformity and quartz bell jar temperature are preferably monitored and controlled during operation of the reactor 100/200 to achieve desired substrate temperature and substrate temperature uniformity without overheating the quartz bell jar (e.g., via the coolant 165A internal to the coaxial stage 160 and/or by adjusting the applied input power and/or operating pressure). For example, in a 2.45-GHz reactor and at elevated operating pressures of interest, the substrate temperature suitably ranges from about 1000° C. to about 1200° C., about 1050° C. to about 1200° C., or about 1100° C. to about 1200° C.

The deposition rate is suitably expressed as an integral property of the deposition process (i.e., total deposited (average) film thickness divided by the total deposition time, for example in microns per hour) and is desirably maximized to increase process throughput. In various embodiments, the deposition rate is suitably at least about 2 pm/h, 3 pm/h, 6 pm/h, 10 pm/h, 12 pm/h, or 15 pm/h and/or up to about 20 pm/h, 25 pm/h, 30 pm/h, 40 pm/h, 50 pm/h, 75 pm/h, 100 pm/h, or 150 pm/h (e.g., with the optional introduction of a nitrogen source gas) in particular for single crystal diamond and (microcrystalline) polycrystalline diamond. Deposition rates for nanocrystalline diamond are often lower, for example being at least about 50 nm/h or 100 nm/h and/or up to about 200 nm/h or 500 nm/h.

The deposition non-uniformity is desirably small so that the physical properties of the resulting film will be relatively homogeneous, regardless of how the resulting film is used in a practical setting. The deposition uniformity can be expressed as the percent relative deviation of the deposited component's film thickness measured at multiple (e.g., three or more) spatial locations (e.g., circumferential and/or radial locations) in the film. As reported herein, the deposition uniformity is the percent difference between the maximum and minimum measured thicknesses normalized to the average film thickness. In various embodiments, the deposition uniformity is suitably up to about 15%, 10%, 5%, or 3%. While the deposition uniformity is desirably as small as possible, process variability can result in deposition uniformities of at least about 0.1%, 0.2%, 0.5%, or 1%.

Additional details relating to the disclosed subject matter are described in the examples below. Examples 1 and 2 describe methods for internally tuning a microwave plasma assisted reactor to provide a well-matched, energy-efficient reactor system having high energy coupling efficiencies (e.g., and correspondingly low power reflection coefficients) over a wide range of operating conditions. U.S. Pat. Nos. 8,316,797, 8,668,962, U.S. Publication No. 2010/0034984, and International Publication No. WO 2012/173207 are incorporated herein by reference and they describe various suitable reactor geometries (e.g., microwave chambers with one or more cylindrical wall sections and/or variable-radius wall sections, axially adjustable conductive stages providing variable substrate positioning during deposition, axially adjustable upper microwave chamber boundaries and EM wave sources permitting internal cavity matching, reactor dimensions) and operating conditions (e.g., gas flow rates, feed gas compositions, microwave excitation frequencies, microwave excitation input powers, substrate temperatures, generated EM modes, operating pressures, reactor power densities, etc.).

EXAMPLES

The following examples illustrate the disclosed apparatus and methods, but are not intended to limit the scope of any claims thereto.

Overview.

The following examples illustrate (1) methods that enable the control of the microwave discharge position, size and shape, (2) methods that control the efficient matching of the incident microwave power into the reactor, and (3) the associated process control methods that enable the microwave plasma assisted chemical vapor deposition (MPACVD) of a component such as diamond. These experimental control methods generally involve the sequential variation of the usual input process variables in coordination with variations of four mechanically tunable microwave cavity plasma reactor geometry variables.

Example 1—Tuning and Process Control of MPACVD Reactors

The microwave discharge and plasma processing control methods are described herein with reference to illustrative microwave cavity plasma reactor (MCPR) apparatus such as illustrated and described herein with reference to FIGS. 1 and 1A-1F as well as in U.S. Pat. Nos. 8,316,797 and 8,668,962, International Publication No. WO 2012/158532, and in references 1-4, incorporated herein by reference. However, the described microwave discharge and processing control methods also can be applied to other MCPR configurations, in particular when operating the reactors in a high pressure regime (e.g., at pressures from about 150 torr to up to 760 torr).

Within the high pressure operating regime (150 torr and above) the properties of the microwave discharge, i.e. the discharge size and position, the spatial variation of the charge and radical specie densities, the gas and electron temperatures, etc. are nonlinearly and sensitively dependent on a variety of input experimental variables such as the input power, pressure and the reactor design geometry variables. The here described discharge control and processing methods make use of the microwave discharge's intrinsic nonlinear behavior and also the associated MCPR's discharge-loaded, experimental behavior versus the many experimental input and internal variables.

Given a geometrically fixed reactor, any discharge-loaded reactor's experimental behavior can, in part, be described by a set of experimental curves, which are identified here as the reactor's operating field map. The reactor operating field map is a set of experimental curves that display the nonlinear relationships between the input variables of pressure, input power, and substrate temperature for a specific geometrically fixed reactor design.

The MPACVD diamond synthesis process and discharge control methods that are described below can be applied to any microwave plasma reactor designs. Given a particular microwave plasma reactor geometry, its operating field map can be varied via physical changes in the reactor geometry. Thus, the operation of a plasma reactor that has a variable geometry yields a microwave plasma processing system that can be adapted and varied to enhance process control and optimization. The illustrated MCPR designs employ a phi-symmetric cylindrical applicator geometry, and the electromagnetic excitation is with a $TM_{01n}$ mode where n equals either 1, 2 or 3. When adopted for the high pressure MPACVD diamond synthesis application, the illustrated MCPR designs employ four mechanical tuning variables (Ls, Lp, L1, and L2) that enable internal reactor matching, discharge control, process optimization and process control versus time.

Microwave Cavity Plasma Reactors (MCPR).

A cross section of a MCPR 100 is shown in FIG. 1. This cross section is related to two specific MCPR 100 designs, i.e. Reactors A and B (R3/R2 for Reactor A is larger than R3/R2 for Reactor B). Reactor B serves as the "reference rector" for these examples. In addition to the independent input power and pressure control variables, the reactor designs have four mechanically tunable adjustments, i.e. Ls, Lp, L1 and L2, that enable discharge matching and control, and process optimization. For each process application the reactor 100 can be mechanically tuned, via the adjustment of Lp, Ls, L1 and L2, for desirable process performance such as microwave coupling efficiency, deposition uniformity, high growth rates, etc. Thus given a particular input operating condition, i.e. given a specific operating pressure, flow rate, etc., the mechanical variations of the reactor geometry enable variations in microwave coupling into MCPR 100 and also enables the variation the reactor operating field map and thereby also simultaneously yield: (1) a stable, focused discharge 184 located in contact with the substrate 163A, (2) an efficiently produced discharge 184, and (3) an optimized diamond deposition process. These mechanically tuned reactors 100 can with minor mechanical and input variable adjustments efficiently sustain a discharge above and in contact with the substrate from a few torr to one atmosphere.

Complex and real time-controlled diamond synthesis process cycles can be implemented by appropriately adjusting one to four tunable reactor geometry variables in parallel with the variation of the more commonly recognized input variables such as pressure, p, input power, $P_{abs}$, and methane concentration. Thus the MCPR designs that employ four tunable mechanical variables (1) have unique abilities to control the position, size and the matching of the discharge, and also (2) enable flexible and optimal process control via the variation of several independent input variables and the four tunable reactor geometry variables.

Microwave Plasma Processing Machines and Systems.

Figure 2:
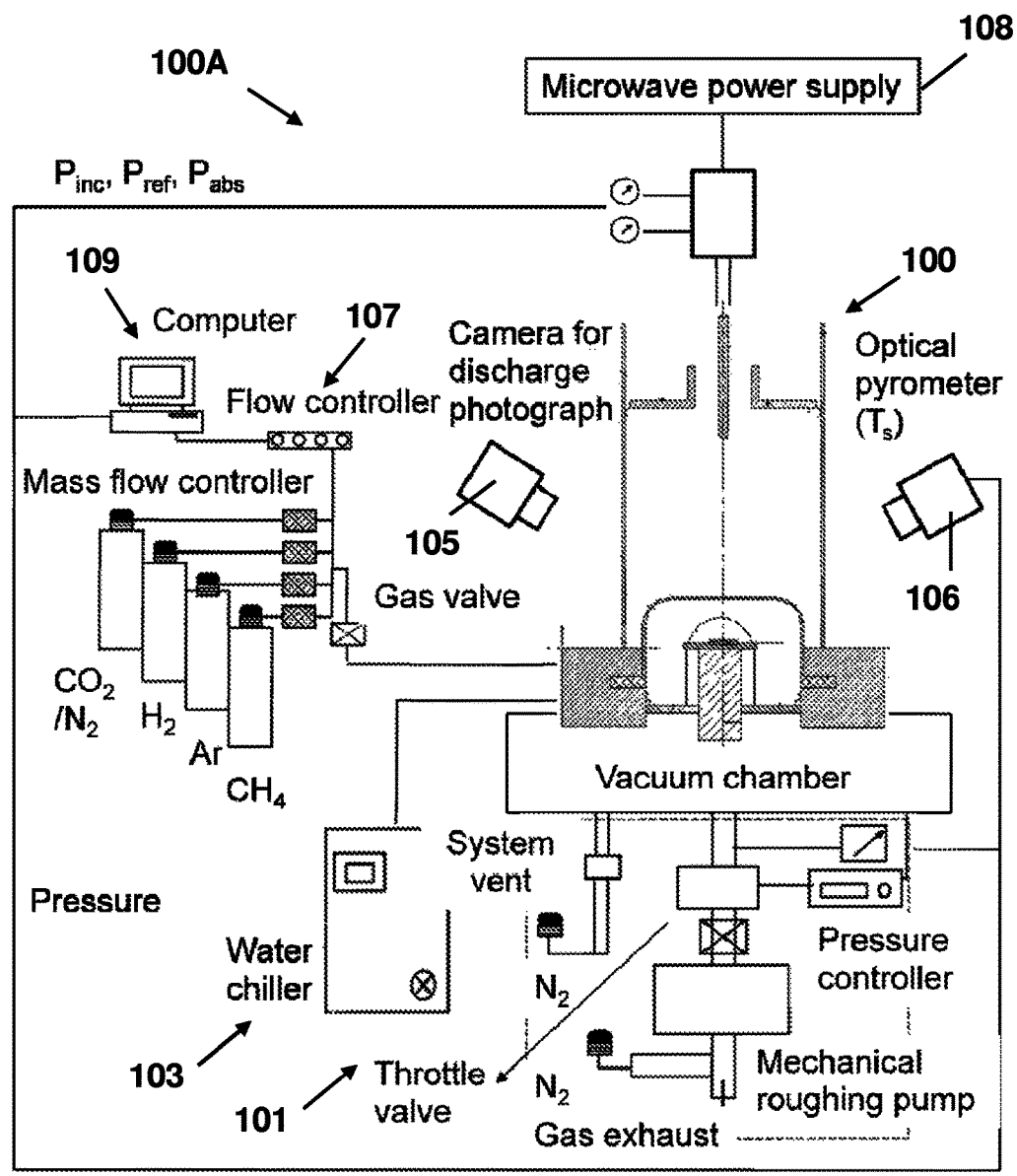
FIG. 2 is a schematic view of a microwave plasma assisted CVD reactor according to the disclosure and associated measurement and control systems.

FIG. 2 displays an example of a MCPR 100 connected to an external MPACVD diamond synthesis process and control system 100A. The entire system, i.e. the MCPR 100 plus the external experimental system 100A, is referred to here as a plasma processing machine. The external control system 100A is made up of several sub-control systems, including: (1) the gas handling system 107 that controls the input gas flow rates, the gas mixtures, the gas pressure, and the gas exhaust (e.g., including flow controllers, valves, feed gas lines or tanks for $CH_4$, Ar, $H_2$, $CO_2/N_2$, etc. in fluid communication with the MCPR 100 as illustrated), (2) the input microwave power coupling system 108, (3) the optical sensing and feedback measurement systems 105, 106 that are employed to measure the substrate temperature, discharge size, shape and position and also to measure discharge species concentrations (e.g., including a camera 105 for photographing a discharge, an optical pyrometer 106 for measuring substrate temperature $T_S$, etc.), (4) the substrate stage and reactor cooling systems 103 (e.g., including a water chiller and fluid feed lines to/from the MCPR 100), (5) a vacuum system 101 (e.g., including pumps, vents, and pressure controllers for the MCPR 100 vacuum chamber), and (6) the discharge positioning system (not shown in FIG. 2) where L1 and L2 are varied. All of these systems are connected to (7) a computer 109 that senses, coordinates and controls the sub-control systems and also performs the functions of start up, shut down and process control versus time.

The gas handling and pressure control system consists of a gas flow controller for each input gas, reactor pressure measurement sensors, a vacuum pump, a throttle valve and a gas exhaust outlet. Nitrogen gas bottles and associated flow controllers are connected to the vacuum pump exhaust outlet and the vacuum chamber and are used when appropriate to dilute the exhaust and chamber gases. Sensors from each of these subsystems (not shown in FIG. 2) are connected to the computer. The computer then is programmed to control the total gas flow rate, $f_t$, the input gas mixture, and the operational process pressure, p, etc. That is, the computer is programmed to carry out the entire start up, deposition cycle and the shut down processes.

The electromagnetic, microwave power coupling system consists of a variable power magnetron microwave power supply, circulator, incident and reflected power sensors and internal cavity (or internal MCPR) impedance matching mechanical variables, Ls and Lp. The microwave power supply, the incident and reflected power sensors, and the micromechanical length position sensors for Lp and Ls are all connected to and controlled by the computer. For example, the exact positions of Ls and Lp are sensed, fed into the computer system and then are motor controlled from position instructions programmed in the computer control system. During a specific process the Lp and Ls length adjustments first select the proper electromagnetic excitation mode and then once the discharge is formed and the process is initiated, fine adjustments of Lp and Ls enable the impedance matching of the rector to the magnetron oscillator and the microwave waveguide input circuit as the input variables such as pressure, gas flow rate, etc. are varied. These adjustments can be made manually through the computer by the operator, or can be preprogrammed as part of an entire computer controlled process cycle.

Since the microwave discharge and its associated impedance, position, size, etc. are dependent on a number of input variables such as input power and pressure, etc., the control of the discharge requires additional control elements beyond the Ls and Lp tuning/matching adjustments. Thus it is desirable for the substrate position, Zs=L1–L2 to also be computer controlled and varied during process optimization. The addition of substrate position control, i.e. the variation of L1 and L2, along with the additional, slight compensating adjustments of Ls and possibly Lp versus any variations of various input variables such as pressure, p, and input absorbed power, $P_{abs}$, allows the repeatable, stable and efficient, optimization of the discharge size and position versus the substrate position. Thus by the proper application of power, pressure and the adjustment of L1, L2, Lp, and Ls, a stable well matched discharge can then be ignited and formed away from the reactor walls and can be controlled to position the discharge to be in close contact with the substrate over a wide range of input pressures (e.g., a few torr to over 400 torr) and an range of input powers.

Experimental Variables.

The experimental behavior of a microwave plasma reactor depends on many interrelated experimental variables. The reactor's experimental performance depends on a number of independent input variables such as input power, $P_{abs}$, pressure, p, etc. and even depends on the reactor design geometry variables that are for a specific reactor design (e.g., as illustrated in FIG. 1) either fixed such as R1, R2, etc. or in the case of MCPRs are mechanically variable such as L1, L2, and Ls, and Lp. Once a specific reactor has been designed and built and the geometry is fixed there are still many process variables. Important process variables are grouped into three subgroups: (A) external input variables, (B) internal variables, and (C) output variables. External input variables include: (1) the power absorbed by the reactor, $P_{abs}$ ($P_{abs}=P_{inc}-P_{ref}$; when the reflected power $P_{ref}$ is 0 or small then $P_{abs}$ is approximately equal to the incident microwave power, $P_{inc}$), (2) the operating pressure, p, (3) the total gas flow rate, $f_t$ (e.g., the sum of the hydrogen plus methane gas flow rates), (4) methane concentration (e.g., expressed as % $CH_4/H_2$), (5) deposition time, t, and (6) mechanically variable reactor geometry variables such as Ls, Lp, L1 and L2. Internal variables include: (1) discharge volume, $V_d(r)$ and discharge position, r, where r is the position coordinate within the discharge chamber, (2) average discharge absorbed power density, $<P_{abs}>=P_{abs}/V_d$, (3) substrate temperature, $T_s(r)$, (4) spatially varying discharge gas and electron temperatures, i.e., $T_g(r)$ and $T_e(r)$ respectively, (5) impressed electromagnetic field E(r), and (6) the various discharge species densities such as the ion, electron and radical density distributions, which vary spatially within the reactor chamber. Output variables include: (1) microwave coupling efficiencies, including (a) coupling efficiency into the MCPR, Eff=$(1-P_{ref}/P_{inc})\times 100\%$ and (b) microwave coupling efficiency into the discharge, $Eff_{coup}=(1-(P_{loss}+P_{ref})/P_{inc})\times 100\%$ where $P_{loss}$ represents the microwave power absorbed by the conducting walls and the dielectric materials within the MCPR, (2) diamond growth rate, both linear and weight gain growth, (3) diamond quality, and (4) synthesized diamond uniformity.

The input variables are closely interrelated to the reactor internal variables such as discharge absorbed power density, discharge gas temperature, $T_g$, discharge uniformity, and even important output variables such as film growth rate and quality. A specific microwave plasma application specifies the important output variables and thus directs the reactor design and the process optimization process. These examples specifically illustrate the MPACVD diamond synthesis process, but they apply as well to other component deposition processes.

MCPR Design and Operational Principles.

In order to deposit/synthesize diamond efficiently and at high rates, it is preferable to perform two or more (suitably all) of the following during deposition: (1) single electromagnetic (EM) mode-excite the reactor with a particular EM mode selected for a given reactor design and/or deposition component, (2) microwave-match the single mode excited plasma loaded reactor (i.e., $P_{ref}\sim 0$, where internal matching is desirable), (3) create stable, high absorbed power density discharges (e.g., at high operating pressures of about 180 torr to 400 torr or higher), (4) control the shape and location of the microwave discharge (e.g., the discharge should be located just above the substrate and away from the reactor walls), (5) control the substrate temperature within the diamond deposition window via substrate cooling, and (6) avoid undesirable substrate discharge surface reactions (e.g., avoid the formation of microwave plasmoids and dusty microwave discharges).

The availability of four reactor mechanical tuning variables together with the many input variables opens the possibility of a multitude of potential operating conditions. However many of the possible reactor operating conditions are not optimal and others, because of safety considerations, should be avoided entirely. Thus a reactor-operational adjustment strategy is also imposed on the variation of the input variables. This strategy also imposes limits on the range and the order of variation of input power, pressure and the mechanical variables Ls, Lp, L1 and L2.

An important step in the reactor design process is to define a number of reactor design principles. Some of the design principles are generic and are independent of a specific plasma processing application while others depend on the specific application of the reactor. Here the reactor design principles are discussed in the context of the MPACVD diamond synthesis application. The disclosed MCPR designs for the diamond synthesis application incorporate a number of important principles. They are: (1) single mode electromagnetic excitation, (2) internal applicator matching, (3) the placement of the substrate on a movable water-cooled stage, and (4) the scalability of the design versus excitation frequency. Additional principles include: (5) the ability for flexible process control via several tunable reactor geometry parameters, and (6) the control of the discharge position so that it is not in direct contact (and stays out of contact) with either the metal reactor walls or the quartz dome walls. Principles (5) and (6) have been realized by incorporating four mechanical adjustments, i.e. the variable reactor geometry variables Lp, Ls, L1, and L2, into the reactor designs. They are also implemented by imposing a specific strategy on the reactor during the process cycle.

Operating Field Maps for the MCPR.

Desirable, discharge-stable operating regimes (e.g., represented by an operating reactor field map or reactor roadmap) represent locations in the input variable space where the discharge is stable and also is located in contact with the substrate holder. This is displayed in FIG. 3. Under certain experimental conditions the discharge will jump from this ideal location to undesirable locations as is shown in FIG. 4. The experimental conditions that produce these discharge "position instabilities," are functions of many variables, such as reactor geometry, pressure, input power, methane concentrations, gas flows, etc. Given a particular reactor design the movement of the discharge away from and off of the holder surface should be avoided. The conditions that produce a stable discharge located above the substrate holder can be determined and understood by experimentally identifying the stable discharge operating regime versus the various input operating variable space, i.e. by defining the reactor's operating field map. It is important to measure and record an operating roadmap for each reactor.

The discharge stable operating regime, i.e. the reactor operating road map, can be altered/modified and optimized by changing the reactor geometry. Thus the reactor designs include two mechanical tuning variables, L1 and L2, that have been incorporated into the MCPR design and operating strategies. The MCPR designs allow the reactor geometry to be mechanically varied. These reactor geometry variations in turn alter the discharge size, shape and power density as well as the reactors operating field map curves and thereby allow for a wider range of discharge stable operating conditions. They enable the variation of the size, shape and position of the discharge, and when combined with the internal cavity matching with Ls and Lp adjustments also enable efficient microwave power coupling into the reactor.

Thus the MCPR designs incorporate two mechanical adjustments that when combined with variations of Ls and Lp enable the experimental coupling, maintenance and control of the microwave discharge at high pressures. Specifically the MCPR has four independent mechanical tuning variables, i.e. Ls, Lp, L1 and L2, which allow a wide range of operating possibilities. By adding these additional experimental variables to the reactor design and operation, it appears to complicate and already complex problem. However, the additional experimental complexity provides additional experimental degrees of freedom to find efficient process solutions. Once the solutions have been identified, the operation of the rector then can be simplified (e.g., one may no longer need to change some or all of the four mechanically tunable variables) and then, for a given process application, the reactor design and associated system can also then be further simplified. That is, some of the input and reactor geometry variables can be fixed for a specific process application. Alternatively, given a specific process that is already well matched, the additional tuning adjustments that are available can then be utilized for process control versus time around a desirable, efficient, stable and optimum operating condition.

MCPR Operational Strategy.

The reactor design and operational principles described above impose specific limitations on the length and variations of Ls, Lp, L1 and L2. That is, a strategy of how to vary the four tuning variables is imposed on the operation of the reactor. This operational strategy is as follows: (1) the main functions of Lp and Ls are first to select, match an excite a desired single electromagnetic mode, and then as the discharge is formed and process conditions are varied Lp and Ls are further slightly varied to microwave match the reactor to a desired optimum operating condition, and (2) the role of L1 and L2 is to position the substrate surface, Zs, in contact with the discharge in order to adjust the discharge boundary layer for optimal diamond synthesis. The variation of L1 and L2 also varies the size and shape of the discharge. If Zs is varied, then Lp and Ls may also have to be slightly varied to achieve excellent microwave coupling efficiency; i.e to achieve an excellent match. But the primary role of Ls and Lp is first to maintain the desired single electromagnetic mode excitation and then to match the reactor around stable and desirable operating conditions to ensure high coupling efficiency. L1 and L2 are adjusted (1) to position the discharge in contact with the substrate, (2) to achieve discharge stability (or to find a stable discharge operating regime) and then also (3) to adjust the size and shape of the discharge. Then when operating within the stable discharge operating space L1 and L2 are adjusted together with Ls to achieve optimal and efficient process conditions on the substrate. Examples of optimal process conditions for the diamond synthesis application include high deposition rates, deposition uniformity, and/or diamond deposition quality. The MCPR design, for example Reactor B, and its operation utilize these design and operational principles and the reactor control examples that are discussed below make use of the four mechanically adjustable variables to achieve rector discharge and process control. By employing a number of small reactor geometry and input variable adjustments, such as input power and pressure, and then also the variation of L1, L2, and Ls, a large variety of efficient synthesis process cycles can be achieved.

Once the initial length adjustments of the four tuning variables are established for electromagnetic mode selection, for example the excitation of the hybrid $TM_{013}$+ $TEM_{001}$ mode in Reactor B, and for the optimal location of the discharge/substrate position, then the tuning adjustments required for efficient matching or for the variation of the substrate position, are usually very small (e.g., of the order of a few mm). As is shown FIG. 2 all of the adjustments can be made by computer controlled motors and can be fully automated.

Discharge Location.

Figure 3:
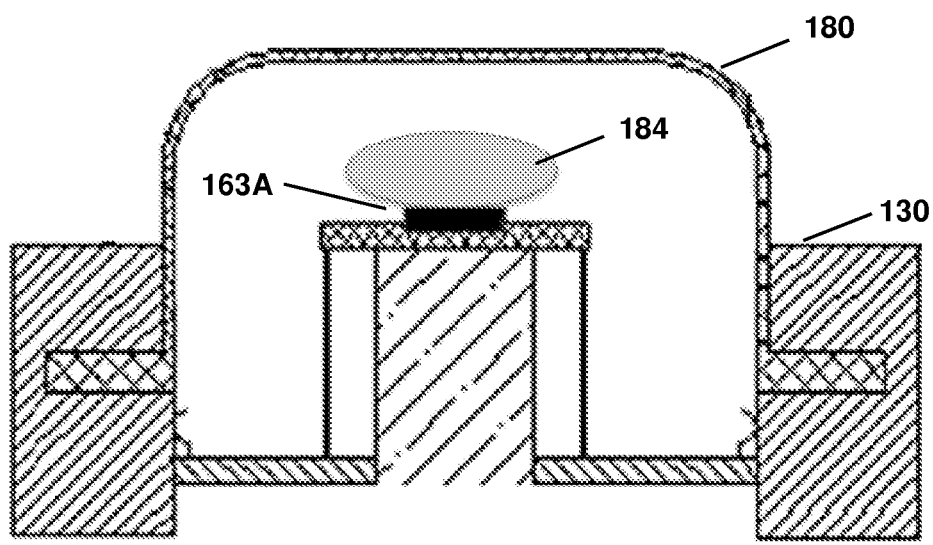
FIG. 3 is a cross sectional view of a microwave discharge chamber with a corresponding microwave discharge located in contact with a substrate (e.g., as illustrated at high pressure, the discharge is separated from the external reactor walls and is in good contact with the substrate surface).
Figure 4:
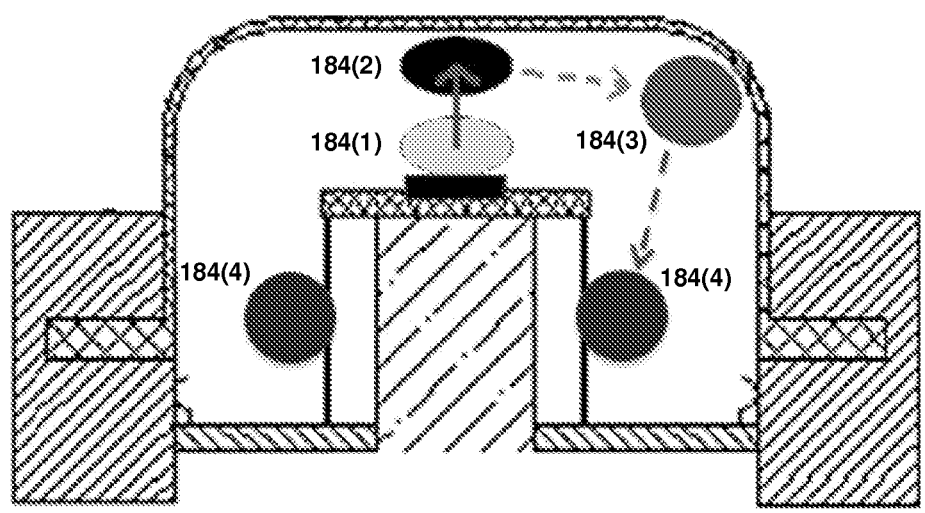
FIG. 4 is a cross sectional view of a microwave discharge chamber with a corresponding microwave discharge in several operational steady-states (1: desirable diamond synthesis discharge operating position in contact with the substrate and away from the discharge chamber walls; 2-4: several other undesirable steady state cross sectional discharge positions away from the substrate and/or in contact with the discharge chamber walls).

As shown in FIG. 3, a preferred location for a microwave plasma processing discharge 184 is inside the discharge chamber 180 positioned away from all reactor walls, but also adjacent to and in contact with the substrate 163A. At high pressures when the various discharge gas temperatures, i.e., $T_e$, $T_g$, etc., are well above 1500 K, the discharge should be kept away from any metal 130 and quartz 180 reactor walls.

The discharge itself is a very nonlinear function of the many input variables. The reactor and discharge internal variables, such as the discharge position and volume, impressed electromagnetic field, and resulting plasma species densities, and gas and plasma temperatures are complex nonlinear functions of the input variables. A variation of just one independent input variable usually results in the variation of two to several other internal discharge variables. During the MPACVD diamond synthesis process the efficient production and optimization of the appropriate important deposition species densities such as H atoms and $CH_3$ radicals located in the boundary layer just above the substrate often requires not only the a variation of the usual input variables such as pressure, and power etc., but also requires the adjustment of the mechanical reactor geometry input variables Ls, Lp and L1 and L2.

It is the availability of these four tunable reactor geometry variables that gives the MCPR its unique ability to efficiently operate over a wide input pressure and power regime, and also allows the optimization of a given CVD deposition process at each specific experimental operating condition within this wide pressure (e.g., 60 torr to 400 torr or 760 torr) and power (e.g., 1.5-4 kW) regime. At each experimental pressure/power operating condition the optimal adjustment of Ls, Lp, L1 and L2 allows the variation of the discharge position, size, and shape and also the variation of the associated discharge boundary layer above the substrate.

As the operation of the MPACVD reactor is varied over the vast experimental variable space, not all combinations of the input variables result in a nicely behaved and microwave-matched discharge that is located just above and in contact with the substrate and that is also positioned away from the reactor walls. Only a subset of the input variables yields an efficient and properly located discharge.

Control of Microwave Discharge Position.

The maintenance and position control of the microwave discharge become increasingly difficult when attempting to operate a discharge above 90 torr. As pressure increases beyond about 80-90 torr, the microwave discharge constricts and separates from the discharge chamber walls and as pressure further increases the discharge can become freely floating and often can move around within the discharge chamber. It can even attach itself to the chamber walls. As the discharge position and size and shape vary the MCPR operation can be established in a number of different stable steady states. Only one or a few of these steady states are process-useful.

For example when operating Reactor B in the high pressure regime, such as 100-400 torr the microwave discharge constricts and separates from the reactor walls as pressure increases from 60 torr to 100 torr and at pressures greater than 150 torr it occupies only a fraction of volume inside of the discharge chamber. FIGS. 3 and 4 show examples of how the discharge 184 appears when it is operating as a high pressure constricted discharge. In FIG. 3, the proper location of the discharge 184 (1) is shown as the light gray cross section region located directly above and attached to the substrate 163A. As experimental conditions (e.g., pressure and input power) are varied the discharge also can jump and move about the inside of the discharge chamber 184. These discharge positions are shown in FIG. 4 as the black discharge cross sections 184 (2)-(4). In two of the examples shown the constricted discharges 184 (2) and (3) have separated/detached themselves from the substrate 163A and have moved and attached themselves to the quartz 180 chamber walls. As also shown in FIG. 4, the discharge 184 (4) can move and locate itself below the substrate 163A and establish itself as an annular ring discharge located in the high electric field regions in the coaxial section of the reactor. These are undesirable operating conditions to be avoided.

The MCPR designs have added two new mechanical variables, L1 and L2. These variables allow the adjustment of the rector, i.e. the adjustment of the substrate 163A position Zs, to enable the formation of a stable discharge 184 located in contact with the substrate 163A as is shown in FIG. 3. When the adjustment of the substrate 163A position, i.e. the variation of L1 and L2, is combined with the adjustment of Ls and Lp efficient process design and control is possible.

It has been observed experimentally that the ability to create a stable discharge that is attached to the substrate is a function of the input power, operating pressure and substrate position. Thus in addition to efficient discharge matching, experimental methods are developed in parallel with the rector matching methods to control the size, and shape of the discharge, and methods are also developed to control the position/location of the discharge. After application of the methods described below, the reactor operating field map is measured. This operating field map indicates that given a specific operating pressure a stable and efficient discharge is obtained over a limited range of input powers and a range of substrate positions. For example in Reactor B, for an operating pressure of 240 Torr with an input power of ~2 kW, the discharge is stable for Zs positions between +2 mm and −6 mm.

Nonlinear Multivariable Discharge Load.

The goal of controlling and optimizing a microwave reactor plasma process is complex since the discharge phenomenon is nonlinear and often has multiple, stable operating regimes. The size, shape, and position of the discharge and the internal discharge species densities depend on input absorbed power, operating pressure, substrate position, reactor tuning, i.e. Zs, and total flow rate, methane concentration, etc. Thus the microwave plasma loaded reactor input impedance depends in a complex way on the many input variables. For example, at a given constant operating pressure, as more power is matched into the discharge the discharge size, shape and position also vary. As input power is varied not only do the discharge species densities vary but the physical discharge size, shape and position also vary. Additionally the spatial distribution and intensity of the impressed electromagnetic field also varies as input power and pressure are changed. Thus the coupling of microwave energy into a microwave discharge load is a complex, nonlinear matching problem and may have many stable solutions.

Microwave Coupling Efficiency.

Internal cavity matching enables the efficient coupling of microwave energy into microwave discharges. This matching technique employs the variation of the applicator size (i.e. applicator length) and coupling probe depth, i.e. the mechanical variation of two matching elements that are located inside the coupling applicator, in order to efficiently match/couple the incident microwave energy into the discharge. Thus the geometry of the MCPR is varied as the discharge-loaded applicator is mechanically tuned to excite a well matched single mode resonant condition. This type of applicator matching is different from the more common externally located double or triple stub tuners or E-H tuners that are usually employed for reactor matching. Since all of the matching adjustments are made inside the applicator this method of matching has been identified as internal applicator or internal cavity matching. The variable elements, Ls and Lp shown in FIG. 1 are the two mechanical matching variables that have been utilized first to excite the proper electromagnetic mode and then match/couple microwave energy into the discharge loaded MCPR. Note that Lp and Ls are located inside the applicator one to three half standing wave lengths away from the discharge. For example in the diamond synthesis application either the $TM_{011}$, the $TM_{012}$ or the $TM_{013}$ modes can be excited to sustain the discharge inside the applicator. Besides yielding a very high coupling efficiency the resulting microwave applicator coupling system is physically very compact and also produces a very stable discharge.

The traditional methods of sustaining and matching a microwave discharge employ variable mechanical elements for plasma reactor matching, such as tuning stubs, E-H tuning elements, etc., that are located external to the reactor. Typically they are many half wave lengths away from the reactor and the discharge. Thus high standing wave electromagnetic fields exist within the external coupling waveguides resulting in microwave power losses in the coupling waveguides. Additionally if there are excitation frequency variations, which have often been observed in magnetron power supplies, discharge coupling instabilities are produced resulting in a flickering and unstable discharge. These external coupling methods then usually result in considerable microwave energy losses in the coupling waveguide walls and also can under some excitation conditions produce an unstable discharge.

However the use of internal cavity matching results in a very efficient and stable discharge. Microwave coupling efficiencies into the MCPR of 99% and coupling efficiencies into the discharge of 96-98% are obtainable using internal matching. The disclosed tuning process described here combines the variation of two the internal applicator matching variables, i.e. Lp and Ls, together with the variation of the substrate position, i.e. two other mechanical reactor geometry variables, L1 and L2, to control the discharge position, size and shape, to efficiently match the reactor and to optimize and control the deposition process itself. The specific details of how to couple microwave power into the MCPR via the variation of the reactors four internal mechanical tuning adjustments are described in more detail in Example 2.

Microwave Plasmoids.

Plasmoid formation should be avoided when diamond is being synthesized. In order to prevent the formation of plasmoids, the input power and the size of microwave plasmas are limited, the discharge is kept away from the reactor walls and the substrate is cooled. Then the rector operates within the safe and efficient operating regime. Under high atmospheric pressure conditions, microwave discharges can be formed inside waveguides/cavity applicators and can float and attach themselves to the waveguide/applicator wall surfaces. These discharges, which are sometimes called microwave plasmoids, then become hot wall stabilized microwave discharges and the hot discharge plasma interacts with the wall surface. The discharges develop hot spots and even can erode wall materials and can produce dusty microwave plasmas. The plasma-wall interactions alter the discharge itself and can erode the wall material thereby producing what is now identified as intense microwave plasmoids, or as microwave plasma fireballs or even Ball-lightning-like plasmoids.

The MPACVD diamond synthesis application produces a similar microwave discharge. However in order to produce a useful diamond synthesis discharge, the discharge/plasmoid location is controlled to be away from the reactor walls and in close contact with the substrate and then in order to achieve diamond synthesis the substrate temperature is lowered and controlled, i.e. it is usually cooled, to avoid undesirable discharge/wall material hot spots, and other undesirable plasma/substrate surface reactions. The substrate temperature is controlled to lie within the 700-1200° C. range in order to achieve the correct diamond synthesis temperatures.

In particular the diamond synthesis discharge attaches itself to the substrate and the associated substrate holder. However the temperatures of the substrate and holder are controlled, i.e. cooled, to prevent undesirable surface reactions and to promote CVD diamond synthesis. Thus in the MPACVD diamond synthesis application the substrate surface temperature is controlled to enable the controlled diamond growth without producing discharge/wall material hot spots and substrate erosion. As described below, the safe and efficient operating regime limits the power input into the MCPR. Thus the formation of microwave plasmoid fireballs and plasmoid discharges is avoided.

Reactor Process Control.

The experimental behavior of a microwave plasma reactor depends on many interrelated experimental variables. In the diamond synthesis application the input variables directly influence the reactor internal variables such as discharge volume, $V_d$, discharge absorbed power density $<P_{abs}>=P_{abs}/V_d$, substrate temperature, $T_s$, discharge gas temperature, $T_g$, discharge uniformity, and also directly influence the important output variables such as the diamond growth rate, diamond growth uniformity, and diamond quality. The reactor operating field map curves represent a way of describing, understanding and visualizing the complex and nonlinear relationships between these variables. A subset of the reactor operating field map space also defines the multi-dimensional, input and internal experimental variable space within which safe, efficient and optimized diamond synthesis processes are possible. Within this desirable process variable space the microwave coupling efficiency is high, the discharge is stable, is positioned away from the reactor walls and is in contact with the substrate. Some examples of specific optimized diamond synthesis process control, starting with some of the simplest and moving to the more complex, are summarized below.

Process Control Examples.

The microwave cavity plasma reactors (MCPCR) have been designed and can be operated so that (1) the MPCR always can be matched or very closely matched, (2) the discharge is controlled and positioned to be in contact with the substrate and located away from and out of contact with the reactor walls, and (3) the spatial variation of the discharge species can be adjusted (especially in the discharge/substrate boundary layer) to enable deposition uniformity and/or growth rate optimization. The MCPR designs allow the control of the size, shape and position of the microwave discharge while also simultaneously matching the reactor as the experimental conditions are varied over a wide range of process variables. This is achieved in the MCPR design by appropriately choosing and varying the reactor variables L1, L2, Lp, and Ls as the reactor is operated over a wide range of input variables. Examples of the input variable ranges are: (1) pressure 10-400 Torr, (2) input flow rates of a few sccm to thousands of sccm, (3) a wide range of input methane concentrations for example 0-15%, and (4) a range of input powers. However only a subset of this vast experimental variable space will produce a useful/robust, safe and efficient diamond synthesis operation.

The first example below describes experimental methods: (1) that enable the control of the position of the microwave discharge, and also (2) that identify the safe and efficient reactor operating regime. That is, the described example experimental methodology defines the efficient microwave coupling and discharge-stable limits on Ls, Lp, L1, L2 and input power, as the reactor is operated over a wide range input pressures. The MCPR operating field map curves can be determined and the following process control examples indicate how the shape of these curves can be employed for diamond synthesis process control. Further examples describe methods of control of the MPACVD diamond synthesis process versus time when using the MCPRs. One important example is the control of the substrate temperature versus time during the process cycle.

Example—Determination of Discharge Stable, Safe, Efficient and Useful Operating Regime Given a specific MCPR design and a specific diamond synthesis application, an experimental methodology is described for determining the process useful, safe and efficient, input variable operating regime. That is the allowable (1) input powers, and (2) the mechanical variations of Ls, Lp, L1, and L2, are defined for the MCPR as the pressure is varied from 40 torr-320 torr (for example). When operating the reactor within this regime the discharge position is also controlled; i.e. the reactor variables are adjusted so that the discharge is located adjacent to and in good contact with the substrate thereby enabling CVD diamond synthesis in a robust, efficient and safe manner. The discharge is positioned and matched by the appropriate variation of the positions Ls, Lp, L1 and L2 as the pressure and the input power are varied.

Operating field maps were experimentally measured using one inch diameter silicon wafer substrates placed in Reactor B and with other constant input variables of: (1) substrate position Zs=−5.7 mm, (2) methane concentration of 3% $CH_4/H_2$, and (3) input gas flow rate, $f_t$ of about 412 sccm. Once the operating field maps are established then the efficient and safe operation regime is determined.

Specifically when determining the reactor field map and establishing the safe and efficient operating regime, a single electromagnetic excitation mode is first chosen by (1) setting the substrate position to a selected value (e.g., Zs=0 such as by setting L1 and L2 equal to approximately one half a free space electromagnetic (EM) wavelength, or about 6.12 cm in Reactor B) and then (2) appropriately adjusting Lp and Ls to excite a desirable single electromagnetic (EM) mode. Once the hybrid EM mode is found both Ls and Lp are slightly varied around these initial values to enable a cavity applicator matched condition. The specific mode selected for Reactor B is the hybrid $TM_{013}+TEM_{001}$ mode. This mode was chosen because it focuses the electromagnetic field onto the desired discharge location; i.e. just above the substrate. Then as microwave power is increased the discharge is first ignited and formed above and in contact with the substrate. L1 and L2 then may be slightly varied to adjust the substrate position for the appropriate discharge processing conditions. As pressure, power and L1 and L2 are varied Ls and Lp may also be slightly adjusted at each constant operating condition to achieve efficient microwave coupling, i.e. a microwave energy match, into the MCPR. This insures the efficient coupling to and the maintenance of the microwave discharge versus the variation of the experimental parameters. While the efficient matching of the reactor is necessary, it is not a sufficient condition for optimal operation of the reactor. The size, shape and the position of the discharge is also controlled versus the experimental variables to form a stable (e.g., stably positioned in contact with the substrate) and an efficiently produced discharge located in good contact with the substrate and away from the reactor walls.

Figure 5A:
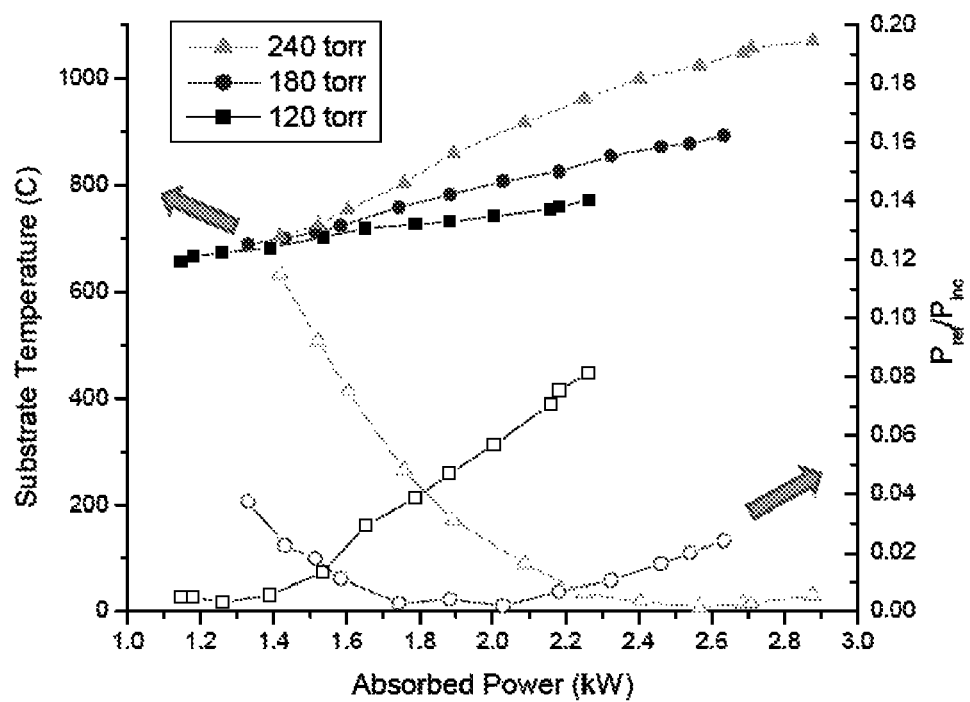
FIG. 5A is a graph illustrating roadmap curves and MCPR matching (i.e., $P_{ref}/P_{inc}$), versus absorbed power for three constant pressure conditions (120 torr, 180 torr, and 240 torr) produced by varying the incident power over the range from about 1.2 kW at to 2.8 kW. Other experimental conditions are constant, including 2.54 cm diameter silicon substrates, L1=52.87 mm, L2=58.6 mm, Zs=−5.73 mm, CH4/H2=3%, $f_t$=412 sccm, Ls=21.6 cm, and Lp=3.56 cm.

FIG. 5A illustrates how well the reactor is matched when it is operating within the safe and efficient operating regime. In FIG. 5A, three operating field map curves for 120 torr, 180 torr, 240 torr and 3% methane are displayed as the solid data points and three $P_{ref}/P_{inc}$ curves associated with each of the operating field map curves are also displayed in FIG. 5A as the open data points. For all the measurements shown in FIG. 5A, the reactor geometry was held constant, i.e. Zs, Ls and Lp were fixed.

Figure 5B:
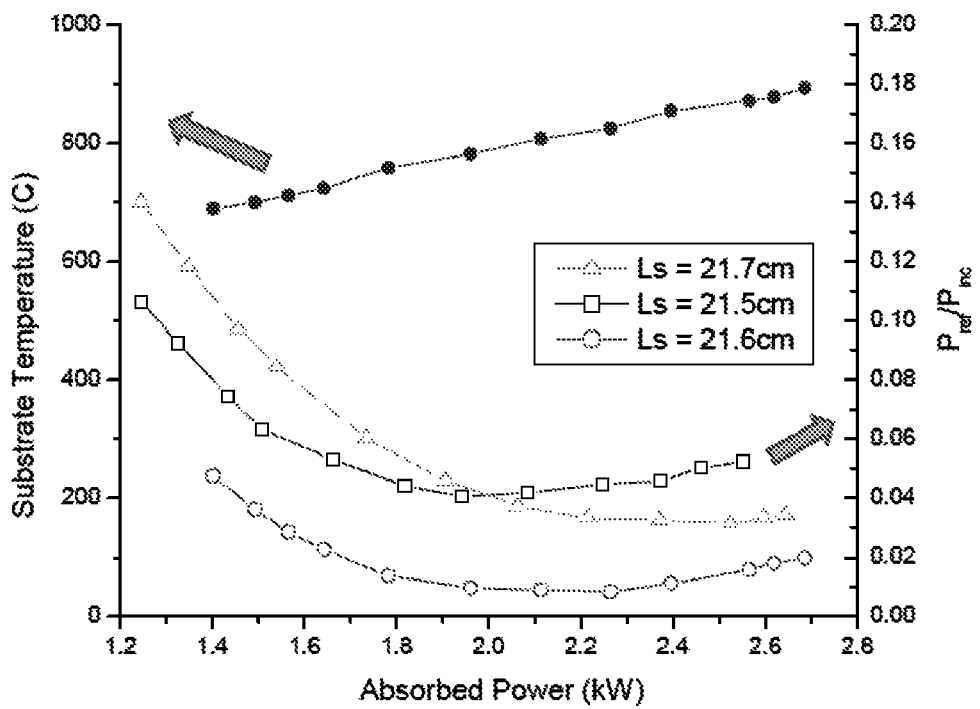
FIG. 5B is a graph illustrating microwave coupling efficiency versus Ls position tuning for a constant pressure of 180 torr (i.e., variation of $P_{ref}/P_{inc}$ versus absorbed power versus different Ls positions). The curve on the top is the operating field map curve for substrate temperature (left axis) versus absorbed power when Ls is held fixed at 21.6 cm. Experimental conditions: 2.54 cm diameter silicon substrate, p=180 torr, CH4/H2=3%, Lp=3.56 cm, L1=52.87 mm, L2=58.6 mm, and Zs=−5.73 mm.

The experimental data for each for each constant pressure curve shown in FIG. 5A was taken as the incident power was increased from low values to high values within the operating field map regime. Then as $P_{inc}$ is increased, $P_{abs}=P_{inc}-P_{ref}$ and the microwave coupling efficiency into the rector in percent is given by $(1-P_{ref}/P_{inc}) \times 100\%$. The $P_{ref}/P_{inc}$ versus $P_{abs}$ curves were taken for a constant Ls and Lp. Holding Ls and Lp constant as the incident power, $P_{inc}$, is increased the discharge size, shape and position change and also the discharge species densities also increase, and thus the reflected power also changes as is displayed in FIG. 5A. Very high coupling efficiencies are achieved when $P_{ref}$ is low or when $P_{ref}/P_{inc}$ is low. Even without the adjustment of Ls, very high microwave coupling efficiencies (e.g., >90%) are achieved over the entire 120-240 torr experimental pressure regime. However it is shown in FIG. 5B that a slight readjustment (an increase or decrease) of Ls can at any given pressure greatly improve the microwave coupling efficiency. Thus for a fixed Zs as input power and pressure are varied, an additional slight variation of Ls and sometimes Lp can insure excellent coupling to the discharge (e.g. >98%) over the entire 120-240 torr pressure regime.

The reactor operating field map is strongly dependent on the substrate position, Zs. Thus, if Zs is now also varied, then a new set of operating field map curves is generated for each constant Zs position. When using Reactor B, a position variation limit is placed on Zs of between −0.6 mm and +0.6 mm. This insures that the reactor operation falls within the discharge stable operation regime and thus insures that the discharge does not jump into an undesirable operating condition such as attaching itself to the reactor walls during the process operation.

Example—Controlling and Varying Discharge Absorbed Power Density

CVD diamond growth rates can be increased by employing high power density discharges. The growth rate is directly proportional to the absorbed discharge power density $<P_{abs}>$. Thus if high rate MPACVD diamond synthesis is desired then the reactor is suitably operated in a high power density discharge condition.

There are several methods of producing high power density microwave discharges. They are: (1) by increasing the discharge pressure, (2) by decreasing substrate holder area and (3) by varying the substrate position with respect to the EM mode focus. As the substrate position is varied the discharge/substrate boundary layer, which is very important in the diamond synthesis application, is also varied. In general, as pressure increases, the discharge power density increases. At operating pressures greater than 200 torr, discharge power densities of 300 W/cm³ to 1000 W/cm³ can be achieved. The second method is illustrated between Reactor A and Reactor B. The major difference between Reactor A and Reactor B is that the substrate holder/powered electrode area has been decreased in the Reactor B design. Thus when operating under the same experimental conditions the discharge power density increases in Reactor B; i.e. the discharge power density is inversely proportional to the powered electrode area. For example, at a constant pressure of 140 torr the discharge power density increases from about 50 W/cm³ to 220 W/cm³ as the powered electrode area is decreased by moving from the Reactor A design to the Reactor B design. Finally in the MCPR designs the electromagnetic (EM) focus above the substrate can be varied by varying the substrate position Zs. By varying the powered electrode position from 4 mm to −6 mm, the EM field strength varies from a disk-shape, more uniform distribution over and above the powered electrode surface to, a more focused, non-uniform and intense, pear-shaped, EM field pattern focused on the center of the powered electrode.

Figure 6:
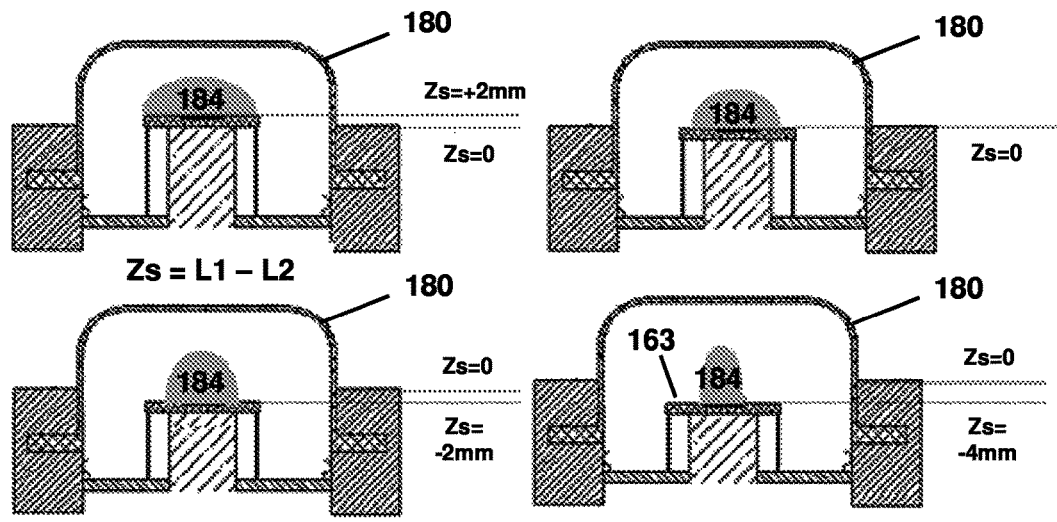
FIG. 6 is a cross sectional view of microwave discharge chambers, each with a corresponding microwave discharge having a shape and size varying with substrate position Zs, ranging from Zs>0 (top left) to Zs<0 (bottom right) as Zs decreases.

When the discharge is present under these same geometry conditions the discharge shape varies in a similar fashion. The experimentally observed discharge size/shape variations versus Zs are shown pictorially in FIG. 6. As the powered electrode position is varied from positive to negative values the discharge 184 volume shrinks and hence the power density increases. Experimentally measured increases in the absorbed power density versus substrate position are displayed in FIG. 10 below. As is shown in FIG. 10 at a constant pressure the absorbed power density can be increased 50-100% and the accompanying substrate temperature can be increased by 250 K by varying the substrate position from +4.9 mm to −4.8 mm.

Variations in discharge power density are accompanied by parallel variations in gas and substrate temperatures, discharge species densities and associated variations in the substrate/discharge boundary layer. The discharge power density can be increased (varied) by increasing (varying) the pressure, by decreasing the substrate/power electrode area, and by decreasing (varying) the substrate position to negative values. Any increase in absorbed power density also has an accompanying increase in substrate temperature and plasma species densities. Thus a variation in discharge power density is accompanied by an associated variation in gas temperature and hence substrate temperature and also a variation in discharge species densities. This also results in the variation in the diamond deposition rates.

Controlling Substrate Temperature Versus Time.

Once the safe and efficient process window has been determined, then in order to achieve an optimal synthesis process, the operation of the reactor can be controlled versus time by varying appropriately the input variables within the efficient process window. Some of these process control variables are external input variables such as pressure, p, $P_{abs}$, % $CH_4/H_2$, flow rate and the substrate position variables, L1 and L2. In response to the input variable changes the important internal process variables such as $T_s$ and discharge power density and discharge size, shape, and position can be varied. As the reactor is varied over this variable space Lp and Ls may also be slightly adjusted in order to stay within a well matched (i.e. to achieve a high coupling efficiency), safe and efficient single electromagnetic mode operating space. The shape of the operating field map curves also can be modified somewhat by varying the reactor design or varying the substrate thermal management. For example, the exact position of the operating field map curve versus temperature and even the slope of these curves can be engineered by changing the molybdenum substrate holder design, to enhance the process control goals.

Figure 7:
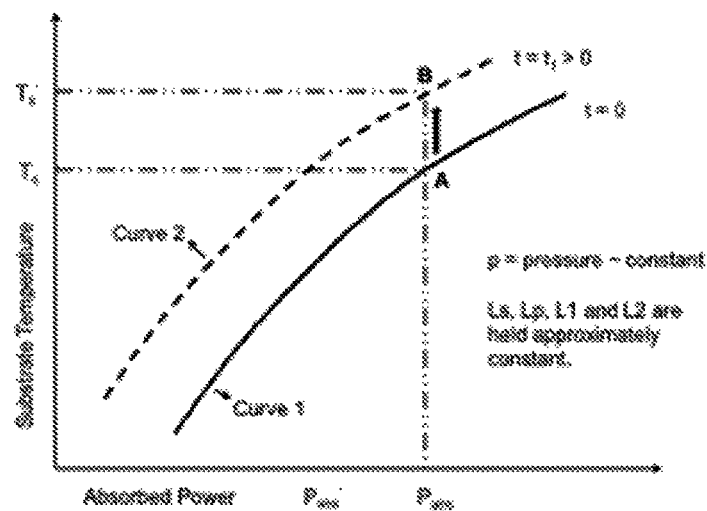
FIG. 7 is a graph illustrating the variation of an operating field map versus synthesis time from curve 1 (e.g., at a reference time such as t=0) to curve 2 (e.g., at a later time relative to curve 1).

Example—Controlling the Reactor Versus Time to Achieve a Setpoint Substrate Deposition Temperature During the SCD synthesis process SCD grows on the single crystal substrate surface and polycrystalline diamond may also grow on the molybdenum substrate holder. Thus the reactor behavior and its operating field map curves will vary slightly versus deposition time. This is shown in FIG. 7 where the initial process temperature increases from the A to B operating points as process time increases. The diamond substrate surface temperature increases as the diamond grows and as the diamond substrate thickness increases. Polycrystalline diamond is also deposited on the molybdenum substrate holder and the diamond seed surface temperature increases from $T_s$ to $T_s'$, where $T_s'-T_s<100°$ C. Then the operating field map curves vary slightly as time increases from $t_0$ to $t_1$ and the reactor operating point varies from A to B. See curves 1 and 2 in FIG. 7. In many experimental diamond synthesis process cycles it is desirable to adjust the reactor versus time to compensate for these substrate and substrate holder physical and associated temperature changes. That is for example it is desirable to hold the substrate temperature constant over the process cycle.

Figure 8:
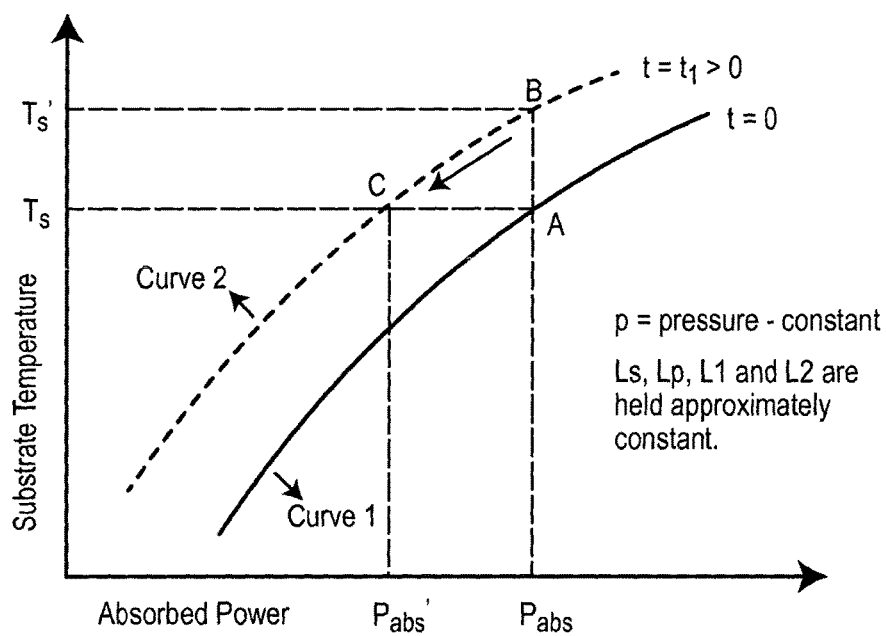
FIG. 8 is a graph illustrating the variation of input power versus synthesis time to control a deposition process to achieve a setpoint (e.g., constant) substrate temperature versus time. The temperature is controlled to be maintained at a setpoint temperature (e.g., held constant at the initial temperature) by moving the reactor operating point from A to C adjusting the incident power (e.g., corresponding to absorbed when reflected power is small or negligible in a well matched system), such as by reducing the incident power as shown.

In a number of synthesis applications it may be important to control the substrate temperature versus time in order to achieve high growth rates and high quality output diamond. At the higher pressures the slope (i.e., delta $T_s$/delta $P_{abs}$) of the operating field map curves increases as the pressure increases. This slope suggests that when operating at a constant pressure within the desirable diamond synthesis window, the substrate temperature can be precisely (because of the slope of the curves) controlled over the multi-hour synthesis process by making small adjustments in input power. That is, as shown is in FIGS. 10 and 11, the operating field map curves vary from curve 1 to curve 2. However as is also shown in FIG. 8 the substrate temperature can be held approximately constant by slightly adjusting the absorbed power. For example by reducing the absorbed power by just 50-100 Watts, the substrate temperature can be held constant. See experimental operating points A, B and C in FIG. 8. The slope of these curves can be adjusted to achieve the desired temperature control versus time either by modifying the thermal management of the substrate (by molybdenum substrate holder design) or by changing the substrate position, Zs.

The absorbed power can be adjusted in either of two different ways. One way as discussed above is to directly vary the incident power by adjusting the microwave generator output. This is indicated in FIG. 8. A second method of input power variation is by holding incident power constant and slightly varying Ls to detune the reactor from a match and thereby mismatching the reactor and slightly increasing the reflected power, $P_{ref}$. The Ls length can be adjusted slightly either in a positive or negative direction from the best matched condition and the substrate temperature will decrease. Since the reflected power increases as Ls is varied this Ls change is similar to a variation in input power.

Generalizing further, many substrate temperature control versus time process profiles, such as increasing and then decreasing the absorbed power versus time, can be achieved using these process control methods.

Example—Controlling Substrate Temperature Via Operating Pressure Variation

Figure 9:
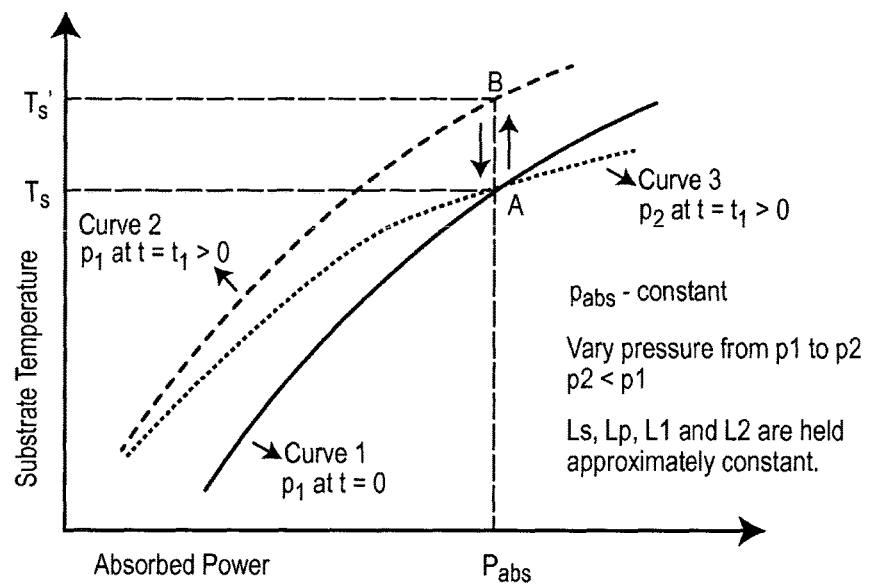
FIG. 9 is a graph illustrating the variation of reactor pressure to control a deposition process to achieve a setpoint (e.g., constant) substrate temperature. Reactor pressure is varied from $p_1$ (e.g., at a reference time such as t=0) to $p_2$ (e.g., at a later time relative to the reference time, illustrated by curve 3) to maintain the substrate temperature at a setpoint temperature (e.g., held constant at the initial temperature).

The substrate temperature can be controlled by holding the $P_{abs}$ constant, and then varying the operating pressure. FIG. 9 illustrates this method of process control. As shown by reducing the operating pressure the operating field map curves change from curve 1 to curve 2 versus time and thus the substrate temperature versus time is held constant (or is adjusted to a particular setpoint). As the pressure is varied the discharge size, position and power density will vary slightly. However for small changes in pressure the discharge power density and position do not vary appreciably.

Example—Control of Discharge Position, Shape, Absorbed Power Density and Substrate Temperature Via Variation of Substrate Position The ability to perform internal tuning provides MCPR designs considerable process control. The multiple adjustments of Ls, Lp, L1 and L2 allow one to simultaneously match the reactor and still control the size, shape, position and power density of the discharge. Additionally while operating at a constant pressure the substrate temperature and the discharge power density can also be varied. For example if, while operating Reactor B at 240 torr within the safe and efficient operating regime, the substrate position Zs can be varied from about +6 mm to −6 mm. Then the electric field, and the discharge shape and position can be varied above and around the substrate as Zs (and hence L1 and L2) is varied.

When a discharge is present and when operating at a constant operating pressure the discharge power density and substrate temperature also vary as Zs is varied. As the substrate position is varied from +5 mm to −5 mm similar to the electric field the discharge becomes smaller, more non-uniform and intense and more focused onto a smaller region in the center of the substrate. FIG. 10 displays for Reactor B the variation of the discharge absorbed power density and substrate temperature versus Zs. Both the discharge power density and the substrate temperature increase as Zs moves from positive to negative z position. The plasma and substrate temperature uniformity change from somewhat uniform at +5 mm to very non-uniform at −5 mm. This suggests that if uniformity over a large area is desired, such as that in polycrystalline diamond plate synthesis, then operation of the reactor at positive values for Zs is desirable. However if high rate diamond synthesis over a several square centimeters is desired, such as in SCD synthesis, then process operation at negative values for Zs (e.g., −5 mm) is more appropriate.

Thus the ability to adjust the substrate position allows the optimization of the process by adjusting the Zs position either in coordination with other process variable (input power, pressure, Ls, etc.) variations or by only varying Zs while holding all the other variables constant. Additionally the process cycle versus time can be varied by varying Zs. The ability to control the microwave discharge via the many controllable variables, i.e. the four mechanical variables along with a number of input variables such as input power and pressure, allows the operation of many different combinations of the process variables and also allows the process to be varied versus time by varying versus time one or more of these variables.

Example—Complex Process Cycling Versus Time

The CVD diamond synthesis process can be controlled by varying the substrate temperature and/or by varying the deposition species concentrations in the plasma substrate boundary layer. Thus many different process cycles versus time can be achieved by varying input power, $P_{abs}$, substrate position Zs and pressure, p. During the process cycle additional adjustments in Lp and Ls can be made versus time in order to achieve a good reactor match as the process is controlled via $P_{abs}$, p and Zs variation. One example of such a process control is to operate the reactor at a constant pressure (e.g., 240 torr) and adjust the substrate temperature versus time from an initial temperature of around 950° C. to about 1250° C. as process time progresses and also simultaneously adjust the discharge uniformity versus time by also adjusting the substrate position versus time. This is accomplished by cycling the input power and substrate position appropriately to achieve the desired process results. Simpler process cycles are also possible such as just varying the substrate position versus time to achieve the appropriate process uniformity and substrate temperature profile versus time.

Example 2—MPACVD Reactor Microwave Coupling and Operational Efficiency

In this example, the electrical efficiency of the 2.45 GHz, microwave plasma assisted diamond synthesis process is investigated by experimentally measuring the performance of internally tuned microwave plasma reactors. Plasma reactor coupling efficiencies ($\eta$>90% are achieved over the entire 100-260 T pressure range and 1.5-2.4 kW input power diamond synthesis regime without the need for additional external matching. When operating at a specific experimental operating condition, small additional internal tuning adjustments can be made to achieve $\eta$>98%. For a well maintained plasma reactor having a design enabling low losses, the empty cavity quality factor is >1500. Then overall microwave coupling efficiencies into the discharge of >94% can be achieved. The requirement of efficient and safe operational performance suggests the avoidance of both substrate hot spots and the formation of microwave plasmoids. Thus given a specific reactor, an experimental pressure/input power operating regime is identified where robust, efficient, high rate, high quality single crystal diamond synthesis is achieved. This investigation suggests that both the reactor design and the reactor operation preferably are considered when attempting to lower diamond synthesis electrical energy costs.

Recent experiments have demonstrated the high rate synthesis of high quality single crystal diamond (SCD). All of the initial experiments employed microwave discharges operating with $H_2$ and $CH_4$ gas mixtures at pressures (100-180 Torr) and with high microwave discharge power densities. They revealed the feasibility of high rate, homoepitaxial SCD synthesis with growth rates of 50-150 micron/h. Thus in recent years, interest in the commercial synthesis of high quality single crystal diamond (SCD) has dramatically increased.

The high pressure microwave plasma assisted chemical vapor deposition (MPACVD) SCD synthesis method is able to synthesize high purity and high quality SCD at high rates uniformly over acceptable deposition areas. Presently it is the most prominent commercial plasma assisted SCD synthesis method. Microwave plasma reactor designs that were initially associated with the early lower pressure diamond synthesis research experiments, have now evolved and are being applied in research laboratories and in commercial manufacturing environments throughout the world. However there is still a need to further improve the understanding and performance of MPACVD diamond synthesis reactors especially when they are operating in the high pressure (100-400 T) regime. Currently plasma reactor research activities are focused on: (1) the continued development of new, efficient, high power density, high pressure, MPACVD reactor technologies and (2) the development of efficient diamond synthesis process methods that take place within this high pressure process regime.

In commercial diamond synthesis applications in addition to further increase the diamond growth rates while maintaining high diamond quality, a remaining important diamond synthesis issue is the improvement of the diamond synthesis efficiencies. Two important diamond synthesis efficiencies are the: (1) input gas utilization efficiency and (2) diamond synthesis electrical efficiency. Diamond synthesis electrical efficiency is often expressed in kW-h per carat and is a minimization goal in an optimized diamond synthesis process. This example focuses on reactor design techniques and associated process methods that improve the diamond synthesis electrical efficiencies.

In view of the above mentioned high power density, high pressure and high efficiency requirements for SCD synthesis a new class of MPACVD diamond synthesis reactors has been developed. When they are operating at high pressures these reactors create stable discharges, are able to control the size and shape of the discharge and are adaptable and experimentally versatile. Additionally they also allow the exploration and optimization of the diamond synthesis process. These new reactor designs have already been applied to the MPACVD synthesis application and their performance has been reported for polycrystalline diamond (PCD) and SCD synthesis. Also reported were some of the details of the reactor design and experimental methods that enable the reactor to efficiently operate over a wide range of experimental conditions while minimizing undesirable plasma reactor wall interactions and the formation of microwave discharge hot spots on the substrate and plasmoids within the reactor.

The new reactor designs incorporate four mechanically tunable geometry variables that allow the internal reactor geometry to be varied in situ enabling the reactor to be adaptable to a variety of process conditions while still achieving high microwave coupling efficiencies. This example provides detailed reactor geometry variations and the associated experimental operating strategies that enable the reactor to achieve high microwave coupling efficiencies and overall excellent diamond synthesis efficiencies over a wide range of input operating conditions.

MPACVD Diamond Synthesis.

A cross section of a typical high pressure, high discharge power density MPACVD reactor 300 and its associated microwave system is displayed in FIG. 11(a). The microwave plasma reactor consists of a phi symmetric cylindrical cavity 122 attached to an external matching circuit 304, the electromagnetic excitation region inside the cavity 122, a substrate holder 163 and a microwave discharge 184. Ideally at high pressure the discharge 184, which is shown schematically and pictorially in FIG. 11(b) and FIG. 11(c) respectively, is separated from the reactor walls and is hovering above and is in contact with the deposition substrate 163A. The microwave discharge 184 heats the hydrogen and methane feed gas mixtures in the discharge activation zone to 2500-4000K and thereby produces the appropriate growth radicals, i.e. [H] and [$CH_3$]. The important growth radical species preferably are abundantly present in the thin boundary layer which is adjacent to the substrate 163A as is shown in FIG. 11(b). In a reactor design at high pressures (above 100 T) the substrate 163A and substrate holder 163 suitably is cooled to the desirable, 850-1300 K diamond synthesis substrate temperatures. If SCD substrates are employed, then SCD is synthesized. Alternatively, PCD is synthesized if the substrate is either non-diamond or even polycrystalline diamond. Small amounts of impurity gases also influence both the growth rate and diamond quality. For example, small amounts of $N_2$ gas impurities (~10 ppm) are known to increase SCD growth rates, but the presence of $N_2$ degrades the diamond quality. Thus high quality diamond synthesis preferably is performed in a high purity environment.

When the pressure is increased from 50 T to 300-400 T the discharge shrinks in size and the absorbed power density increases from 5-10 W/$cm^3$ at low pressures to 1000 W/$cm^3$ at the higher pressures. The discharge size shrinks even as the input power is increased as the pressure increases from 180 T to 260 T. Thus moving to high pressure operation dramatically increases the discharge power density. Plasma densities for 2.45 GHz microwave diamond synthesis discharges are estimated to vary from $5 \times 10^{11}$ to $3 \times 10^{12}$ $cm^{-3}$ when pressure is increased from 100 T to 240 T. As the pressure increases the radical species densities and the gas temperature increase and hence the diamond deposition rate, which is proportional to $CH_3$, also increases. In particular the [H] densities increase by 1000 and the [$CH_3$] densities increase by 10. Since diamond quality is proportional to the $H_2$/$CH_4$ feed gas ratio, at the high pressures of 200-400 T, high quality SCD can be synthesized with even higher $CH_4$/$H_2$ gas mixtures 184C (reactive gas inputs), i.e. at gas mixtures of over 7-9%. This has the effect at high methane concentrations and high pressures of not only further increasing the growth rate but also improving the diamond quality.

As pressure is increased, the plasma reactor design and operation challenges are to efficiently couple microwave power 184B into the intense, high temperature discharge 184 while still controlling the discharge 184 to be placed above and in good contact with the substrate 163A. As input power and pressure are adjusted to achieve optimal diamond synthesis it is additionally important to be able to vary the important boundary layer 184A located just above the substrate 163A (FIG. 11 (b)). The deposition species densities preferably are capable of being adjusted just above the substrate holder 163 while still operating at high coupling efficiencies and without creating undesirable substrate and substrate holder 163 reactions.

Microwave Coupling Efficiencies.

Figure 11:
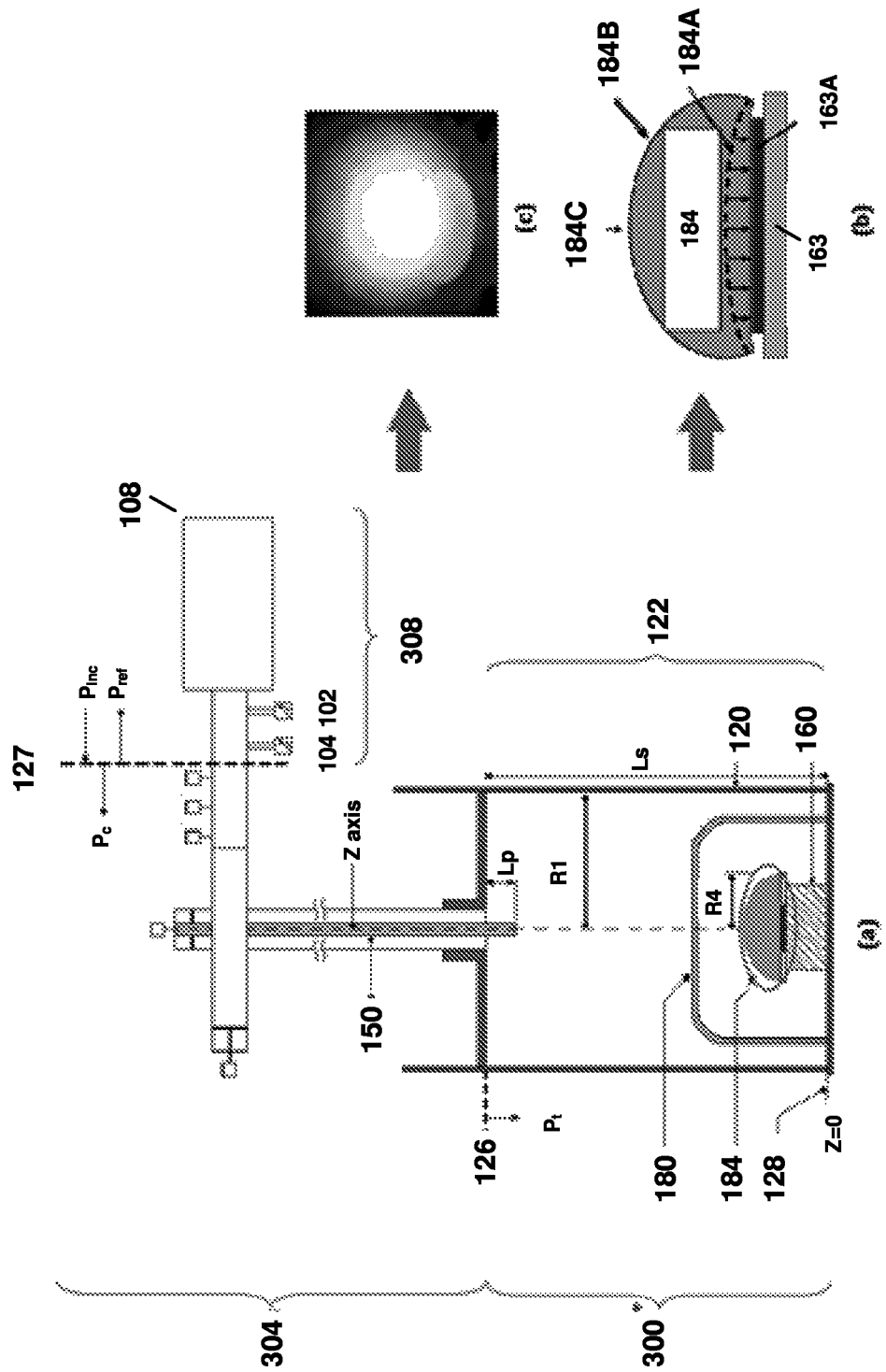
FIG. 11 illustrates a cross section of a typical MPACVD diamond synthesis reactor attached to an external matching system and a microwave power system, including: (a) a microwave discharge adjacent to the substrate holder, (b) a typical photograph of a $H_2/CH_3$=5%, 240 T diamond synthesis discharge hovering over a one inch silicon substrate, and (c) a schematic of the plasma discharge over the substrate and substrate holder.

FIG. 11 (a) shows a typical diamond synthesis system. It consists of the microwave power delivery system 308 (e.g., including a microwave generator 108, such as at 6 kW and 2.45 GHz), an external matching system 304 (e.g., including one or more tuning stubs, a short circuit piston, etc.) and the microwave plasma reactor 300. The reactor 300 is connected to the external microwave delivery system 308 at the reactor input plane 126. The output power from the microwave power delivery system 308 is the incident power ($P_{inc}$; measured at input matching plane 127 by incident power meter 104) and the total power coupled into the matching circuit at the input matching plane is $P_t=P_{inc}-P_{ref}$, where $P_{ref}$ is the power that is reflected from the input matching plane 127 (measured at input matching plane 127 by reflected power meter 102). The power coupled into the cavity reactor 300 at the reactor input plane 126 is $P_c=P_t-P_w=P_{abs}+P_{loss}$, where $P_{abs}$ is the power coupled into the discharge 184, $P_{loss}$ represents the microwave power losses due to the conducting walls and any dielectric material losses inside the cavity reactor 300, and $P_w$ represents any power lost in the external matching circuit 304. The power reflection coefficient from the input matching plane 127 is then given by $R=P_{ref}/P_{inc}$. The power coupled into the reactor 300 ($P_c$) and the power coupled into the discharge 184 ($P_{abs}$) can be expressed as $P_c=P_{inc}-P_w-P_{ref}$ and $P_{abs}=P_{inc}-P_{ref}-P_w-P_{loss}$ respectively. Then the microwave coupling efficiency into the reactor is given by $\eta=(1-(P_w+P_{ref})/P_{inc})\times 100\%$ and the overall microwave coupling efficiency into the discharge is given by $\eta_{coup}=(1-(P_w+P_{ref}+P_{loss})/P_{inc})\times 100\%$. Thus in order to efficiently couple microwave power into the discharge 184, $P_{ref}$ should be minimized, i.e. the system should be matched and $P_w$ and $R_{loss}$ should also be minimized.

Figure 12:
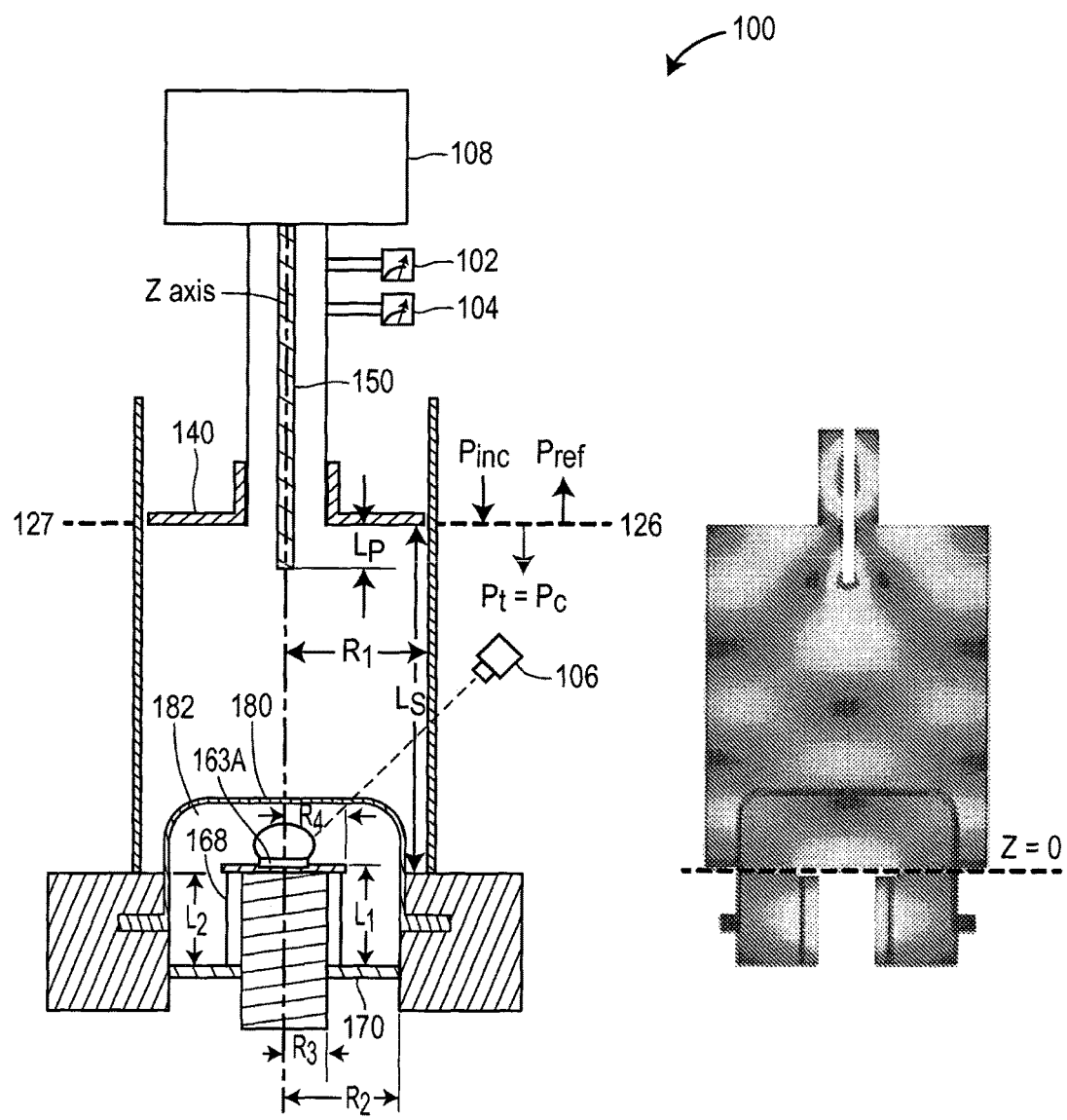
FIG. 12 illustrates a cross section of an internally tuned microwave cavity plasma reactor (reactor B design).

In this example, microwave system design and operational techniques are investigated that improve overall microwave plasma reactor 100 system efficiency. In particular if the external matching network 304 (FIG. 11(*a*)) is removed and replaced with internal reactor matching techniques and the microwave power delivery system 108 is directly connected to the reactor as is shown in FIG. 12, then the input matching plane 127 and the reactor input plane 126 are the same plane and $P_t=P_c$. Then $P_w$ is eliminated. An important question under these circumstances is whether internal matching techniques can be developed which create and maintain stable discharges that are useful for diamond synthesis while also minimizing $P_{ref}$. If $P_{ref}$ can be reduced to zero by internal matching then the major coupling losses only occur inside the reactor. The experiments discussed below investigate internal reactor matching techniques that enable the matching or nearly matching of the discharge loaded reactor, as the reactor is varied over a wide range of experimental input conditions and as the substrate position is also independently varied.

An example of an internally matched reactor 100 is shown in FIG. 12. If the reactor 100 is operated without an external matching circuit then $P_w=0$ and the efficiency of coupling microwave energy into the reactor, $\eta=(1-P_{ref}/P_{inc})\times 100\%$ (e.g., where the reflected power $P_{ref}$ is measured with the reflected power meter 102 and the incident power $P_{inc}$ is measured with the incident power meter 104). If additionally the reactor 100 can be internally matched so that $P_{ref}=0$; i.e. the reactor 100 is 100% matched and $P_{inc}=P_c$, then the power coupled into the reactor 100, $P_c$, is divided between the power lost, $R_{loss}$, and the power coupled into the discharge 184, $P_{abs}$. Under these circumstances $\eta_{coup}$ is equal to the internal cavity reactor coupling efficiency given by $(1-P_{loss}/P_c)\times 100\%=(1-P_{loss}/P_{inc})\times 100\%$. $\eta_{coup}$ can then also be expressed in terms of the empty cavity quality factor ($Q_o$), and discharge loaded cavity quality factor ($Q_L$), as $(1-Q_L/Q_o)\times 100\%$, where $Q_o$ is defined as the Q of the cavity reactor 100 without the discharge 184. Measurements of a well designed and maintained microwave cavity indicate that $Q_o$ is dependent on the reactor design, construction and maintenance. In a well designed and maintained diamond deposition system, $Q_o\sim 1500$-$3000$. When operating under diamond synthesis conditions, experimentally measured discharge loaded cavity $Q_L\sim 70$-$100$. Thus if internal reactor matching techniques are developed that are able to reduce the $P_{ref}$ to zero or close to zero and $P_w=0$ then very high overall microwave coupling efficiencies of $\eta_{coup}>95\%$ can be achieved.

Well-Matched Reactor.

Figure 13:
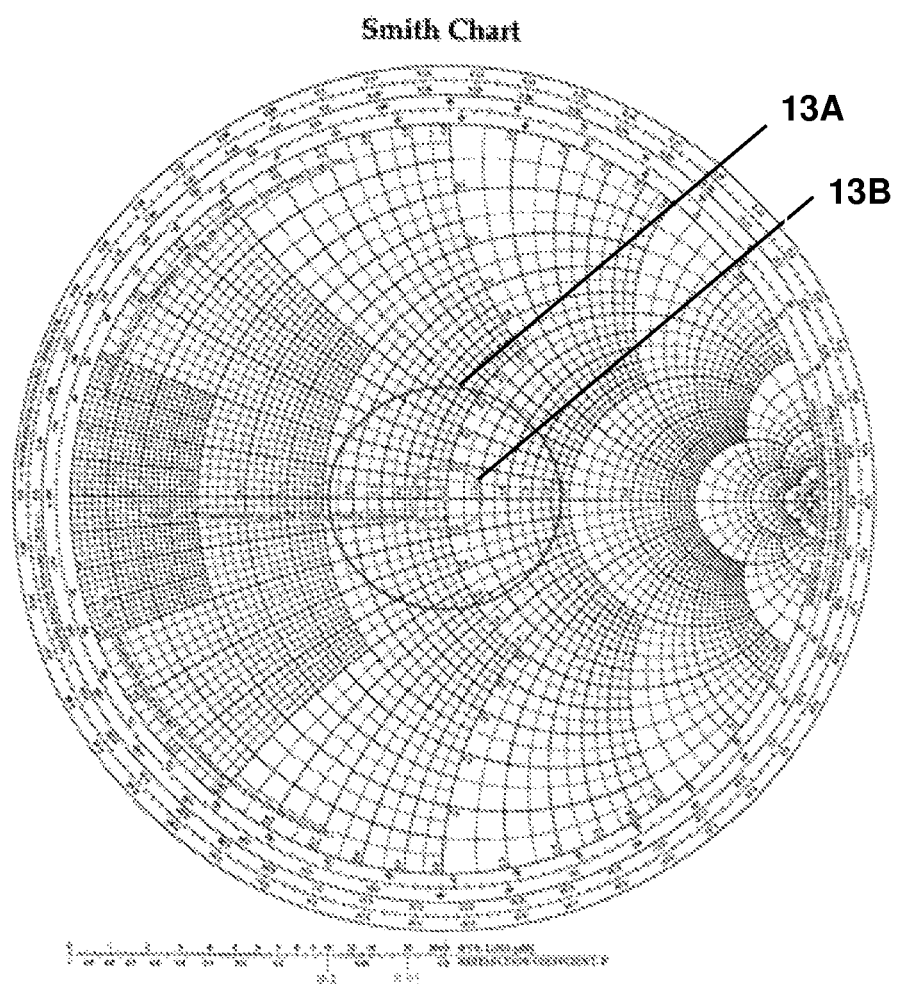
FIG. 13 is a Smith Chart showing (1) an outer circle which represents a power reflection coefficient radius R=0.1 and (2) an inner circle which represents a power reflection coefficient radius R=0.01.

The experimental behavior presented in this example considers that the internally tuned reactor 100 that is shown in FIG. 12 can be operated in a "well matched" condition. A well matched reactor condition can be suitably defined as when the power reflected from the input plane ($P_{ref}$) is equal to or less than 10% of the incident power. A "well matched" reactor has normalized impedances that all lie within the outer circle 13A shown in FIG. 13 and microwave coupling efficiencies are $\eta>90\%$. When the reactor's normalized impedance lies inside the inner circle 13B in FIG. 13, the reactor is very well matched, and microwave coupling efficiencies are $\eta>99\%$.

Microwave Plasma Reactor Designs.

The microwave coupling and operational methods described in this example utilize the specific reactor design shown in FIG. 12. This reactor creates a stable and efficient discharge at high pressures and is often referred to as the microwave cavity plasma reactor (MCPR), reactor B.

In order to operate at high pressures and to achieve improved electrical and process efficiencies the MCPR B design employs several important design features: (1) single mode electromagnetic (EM) excitation, (2) internal applicator matching, and (3) the placement of the substrate on an independently mechanically adjustable substrate holder stage. Similar to the more conventional MPACVD reactor 100 that is shown in FIG. 1, the new reactor design also employs single EM mode excitation of the discharge. However because of the unique applicator shape a single hybrid $TM_{013}+TEM_{001}$ EM mode is excited. This excitation creates and maintains a discharge just above and in contact with the substrate holder as is shown in FIG. 12. The other major design improvements over the conventional design (FIG. 1) are: (1) the replacement of the external reactor matching circuit with the mechanically variable matching adjustments, shown as $L_p$ and $L_s$ in FIG. 12, and (2) the addition of two more mechanical variables L1 and L2 that enable a variable substrate position. All four mechanical adjustments are internal to the reactor. Thus by varying the four tuning adjustments, the MCPR (1) acts like an electromagnetic mode converter, (2) acts like a variable impedance matching transformer, and (3) allows the independent variation of the substrate position with respect to the discharge.

The employment of internal matching eliminates any high standing EM wave fields that exist in the waveguide circuits external to the cavity applicator. This has the benefit of eliminating $P_w$ resulting from the high standing EM waves that usually occur in external waveguide matching circuit. Under many diamond synthesis conditions these losses can be substantial and thus the external matching circuit reduces the overall electrical efficiency of the diamond deposition system. The internal matching of reactor B allows the input matching plane to be located only a few wavelengths from the discharge load (FIG. 12). In practice if high efficiency is desired the output of the microwave power supply should be located very close to the input of the reactor, i.e. close to the input matching plane. Internal matching has the additional benefit of producing a very stable discharge that is also immune to small fluctuations in input power and excitation frequency.

A variable substrate position allows the in situ adjustment of the plasma substrate boundary layer. As the substrate position changes the reactor geometry varies and the position of the substrate with respect to the discharge also varies.

This capability enables the optimization of the process growth rate or the growth uniformity conditions. The benefits of this extra degree of freedom, i.e. the variability of the substrate position, have already been demonstrated by improved deposition uniformities and growth rates. Thus the four internal, mechanically variable reactor adjustments allow discharge position and shape control while still enabling efficient microwave coupling into the reactor.

Microwave Plasma Source.

As is shown in FIG. 12, the electromagnetic excitation region of the reactor consists of a cylindrical waveguide region (z>0) and a coaxial waveguide section (z<0). The z=0 plane separates the cylindrical and the coaxial parts of the reactor cavity. As is shown in FIG. 12, the substrate is placed on a molybdenum holder that is in good thermal contact with water-cooled center conductor of the coaxial waveguide section. The new reactor design incorporates four mechanically internally tunable geometry variables Ls, Lp, L1 and L2. The four tunable variables allow the internal reactor geometry to be varied to optimize the synthesis process. The mechanical tuning can also be varied during the diamond synthesis process itself.

Electromagnetic Excitation Mode.

The reactor B, phi symmetric, cylindrical/coaxial waveguide configuration allows the plasma source to be excited in a hybrid, $TM_{013}+TEM_{001}$ EM mode. In order to achieve the hybrid excitation the top (z>0) cylindrical section length $L_p$ is adjusted to be very close to $3\lambda_g/2$ where $\lambda_g$ is the guided EM wavelength of the $TM_{01}$ cylindrical waveguide mode and the coaxial section (z<0) length L2 is adjusted to approximately $\lambda_0/2$ where $\lambda_0$ is the free space wavelength at the 2.45 GHz excitation frequency. When properly adjusted, the top (z>0) cylindrical section is excited in the $TM_{013}$ mode, and the lower (z<0) coaxial section is excited in the $TEM_{001}$ mode. In the vicinity of the abrupt discontinuity plane, i.e. around z=0, the total electric field is the sum of the $TM_{013}$ field, the $TEM_{001}$ field plus any other evanescent field that is induced by the "waveguide discontinuity" at the z=0 plane. When $L_p$ and $L_s$ are appropriately adjusted the hybrid $TM_{013}+TEM_{001}$ mode is excited in the reactor. Then with the appropriate input power a discharge is formed above and in contact with the substrate.

The EM field focus at and above the substrate (around the z=0 plane) can be controlled and varied during experimental process development by length tuning L1 and L2. When a discharge and substrate are present, this length tuning varies: (1) the substrate position, $Z_s$=L1−L2, (2) the EM fields focus above and around the substrate and within the discharge, (3) and controls the location and the shape of the discharge.

Experimental Operational Strategy for Discharge Position Control and High Coupling Efficiency.

The reactor operational strategy is as follows: (1) The main functions of $L_p$ and $L_s$ are—(a) to select, match and excite a desired single EM mode, (b) then as the discharge is formed and process conditions are varied, $L_p$ and $L_s$ are further varied slightly to match the reactor to a desired optimum operating condition; and (2) The roles of L1 and L2 are to locate the substrate surface, $Z_S$, in contact with the discharge in order to adjust the discharge boundary layer for optimal diamond synthesis. The changes of L1 and L2 also vary the size and shape of the discharge. If $z_s$ is varied then $L_p$ and $L_s$ may also have to be varied slightly to achieve excellent microwave coupling efficiency i.e to achieve an excellent match. But the primary role of $L_s$ and $L_p$ is to maintain the desired single EM mode excitation. L1 and L2 are adjusted (1) to position the discharge in contact with the substrate, (2) to achieve discharge stability (or to find a stable discharge operating regime) and also (3) to adjust the size and shape of the discharge. Then when operating within the stable discharge operating space L1 and L2 are adjusted together with Ls to achieve optimal and efficient process conditions on the substrate. Examples of optimal process conditions for the diamond synthesis application are high deposition rates, deposition uniformity and diamond deposition quality.

Microwave System and Measurement Technique.

The entire experimental microwave system that was employed for the microwave coupling measurements is displayed in FIG. 12. The microwave power delivery system consists of a 2.45 GHz, variable power 800 W-5 kW Cober power supply, a circulator, and calibrated incident and reflected power meters. All experiments presented in this example have been performed using a silicon wafer substrate of diameter of 2.54 cm as the benchmark diamond synthesis example. The silicon substrate is placed in a molybdenum substrate holder having a recess for receiving the silicon substrate, and the substrate holder in turn is placed on the water cooled stage (FIG. 12). After scratch seeding with diamond powder, polycrystalline diamond was grown uniformly on the surface of the silicon wafer and continues to grow as the various experimental microwave coupling measurements are made. Thus all microwave coupling measurements are made under discharge loaded and diamond synthesis experimental conditions.

The substrate temperatures ($T_S$) were measured with an optical emission one color pyrometer (IRCON Ultimax Infrared thermometer) of wavelength 0.96 μm with an emissivity of 0.6. The incident angle of measurement for the pyrometer is kept constant at approximately 60° for all sets of data obtained over different power levels and operating pressures. The $H_2$ and $CH_4$ input gases used for all measurements have a purity level of 99.9995% and 99.999% respectively and no extra nitrogen was added in any experiment.

Experimental Variables.

The experimental measurements rely on the variation of many important variables. The experimental diamond synthesis system variables, which have been discussed in detail elsewhere, can be classified into internal, external input and output variables. The experimental variables discussed in this example include the following: (a) External input variables—The input variables are the: (1) operating pressure, p; (2) input power, i.e. the power coupled into the input plane $P_t=P_{inc}-P_{ref}$, (3) power reflection coefficient from the input matching plane $R=P_{ref}/P_{inc}$; (4) % $CH_4/H_2$; (5) total input gas flow rate ($f_t$) which is the sum of the hydrogen and the methane flow rates; and the (6) reactor geometry variables such as the four mechanically tunable variables lengths $L_s$, $L_p$, L1 and L2 and therefore also the variation of the substrate position: $Z_S$=L1−L2. (b) Internal variables—Important internal variables are the discharge volume ($V_d$), the discharge absorbed power density of plasma: $<P_{abs}>=P_{abs}/V_d$, the substrate temperature ($T_S$), and the impressed electromagnetic field (E(r)). (c) Output variables—The major output variables are the microwave coupling efficiencies: (1) η and (2) $η_{coup}$.

Operating Space for Diamond Synthesis.

The experimental measurements described below are presented as representative examples of the reactor microwave coupling efficiency, q, behavior for reactor B. As is indicated above, there are more than five important independent input variables. Only η versus a reduced set of input variables is presented in this example. Here several input variables are held constant: (a) the total flow $f_t$=412 sccm, (b) % $CH_4$/

$H_2$=3%, (c) L1=5.3 cm, and (d) $L_p$~3.25 cm, which is a known optimum position. At this constant $L_p$ position high coupling efficiencies can be achieved and slight variations from this length do not appreciably change the coupling efficiency. The experimental variation of η is investigated versus four important diamond synthesis variables: (1) pressure (p), (2) power input into the input plane $P_t=P_{inc}-P_{ref}$, and the mechanically tunable reactor geometry variables, (3) $L_s$, and (4) L2. η is measured as the input variables are varied over the following important diamond synthesis conditions: (1) 100 T<p<240 T, (2) 1.5 kW<$P_{abs}$<2.8 kW, (3) 21.8 cm<$L_s$<19.8 cm, i.e. discharge loaded reactor conditions that excite the hybrid EM mode, and (4) −8.17 mm<$z_s$<−1.77 mm, i.e. conditions that position the discharge in good contact with the substrate. One very important internal diamond synthesis variable is substrate temperature, T. Typically diamond synthesis occurs when the substrate temperature (5) is 700° C.<$T_S$<1300° C. The experiments presented below measure η only when the substrate temperature is within this range. While discharge volume, discharge shape and absorbed power density are important internal diamond synthesis variables their behavior is not reported in this example since it does not change the measured microwave coupling efficiencies. The major measured output variable is the microwave coupling efficiency, η. The experimental variation of η for reactor B is measured as the experimental conditions are varied over the ranges as described in (1)-(5) above for the external input variables. The reactor microwave coupling efficiency is measured versus P abs and p with either $L_s$, and/or L2 being varied.

Microwave Coupling Efficiency at a Constant Pressure and a Constant Substrate Position.

Considering first the case of a fixed reactor geometry, where the substrate position is held constant, a typical reactor experimental start up and operational scenario is as follows. The discharge is first ignited when operating with a fixed input hydrogen gas flow rate and with the pressure held constant between 5-20 T by adjusting $L_p$ and $L_s$ in order to excite the hybrid $TM_{013}+TEM_{001}$ mode. This mode is excited when $L_p$ and $L_s$ are initially adjusted to ~3.25 cm and ~21.5 cm respectively and the discharge is ignited when the incident power is increased to 500 W. Then as the pressure is increased to 100-260 T the incident power is increased to 1.5 kW-2.5 kW. Once the constant operating pressure is reached, methane input gases are added and the reactor is matched by varying $L_s$ thereby enabling a stable discharge excitation and efficient microwave coupling.

Figure 14:
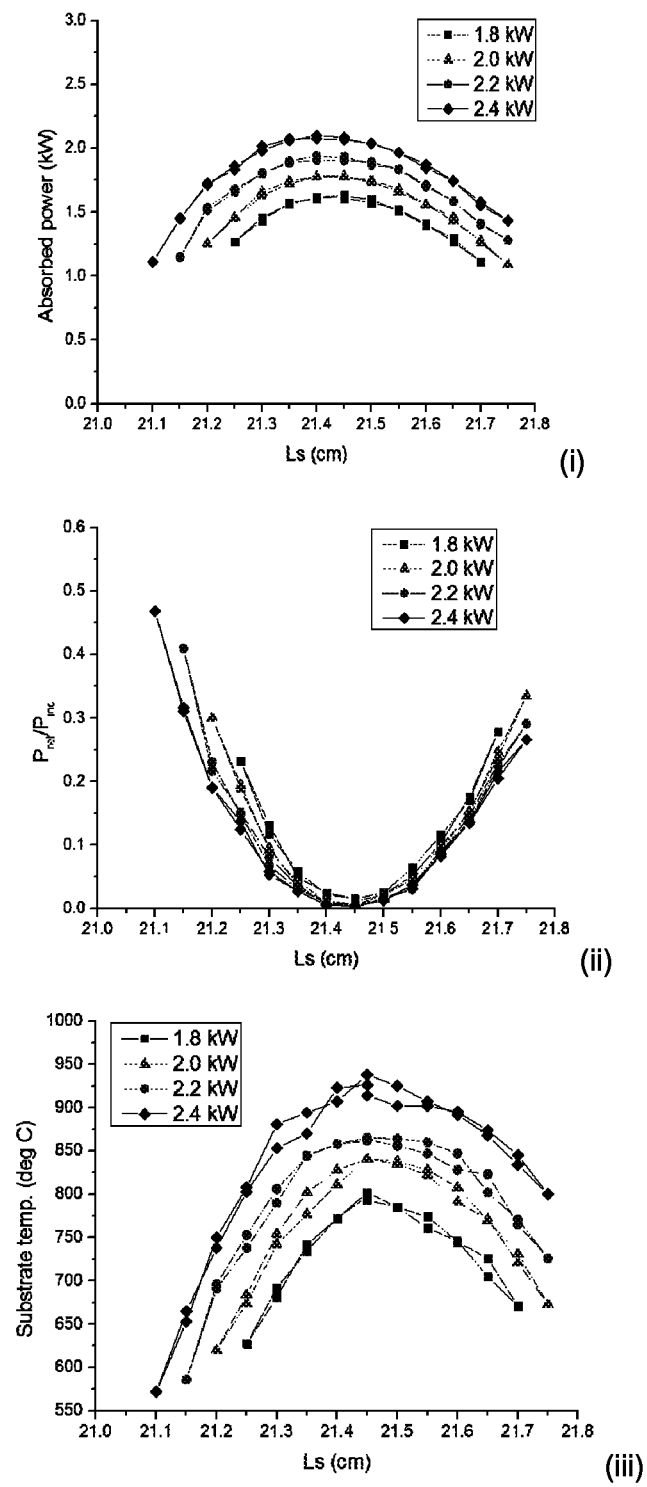
FIG. 14 includes graphs illustrating (i) $P_{abs}$ vs $L_s$, (ii) $P_{ref}/P_{inc}$ vs $L_s$, (iii) $T_s$ vs $L_s$. All other experimental variables are constant, such as 2.54 cm diameter silicon substrates, L1=52.9 mm, L2=61.1 mm, $z_s$=−8.17 mm, Lp=3.25 cm, CH4/H2=3%, p=180 T and $f_t$=412 sccm.

An example of the variation of η versus $L_s$ is shown in FIG. 14 for a constant substrate position, $Z_S$=−8.17 mm, and a constant pressure of 180 T. Measurements of $P_{abs}$, $P_{ref}$ and $T_s$ are plotted versus $L_s$ for four different constant incident power levels of 1.8 kW, 2.0 kW, 2.2 kW and 2.4 kW. The results of these experiments are shown in FIG. 14 (i)-(iii) where $P_{abs}$ versus $L_s$, $P_{ref}/P_{inc}$ versus $L_s$ and $T_s$ versus $L_s$ are plotted for several constant incident powers. The experimental region that defines the "well matched" $L_s$ positions is displayed in greater detail in FIG. 15.

Figure 15:
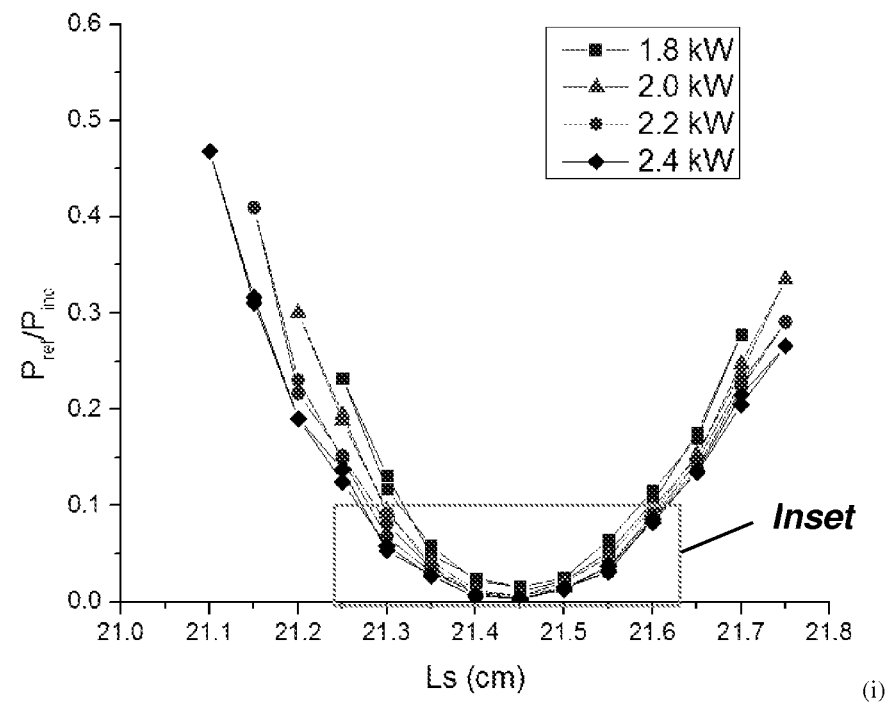
FIG. 15 includes graphs illustrating more detailed and expanded plots of the well matched reactor operating regime (shown in FIG. 14): (i) graph (ii) from FIG. 14, (ii) expanded inset view from (i).
Figure 15:
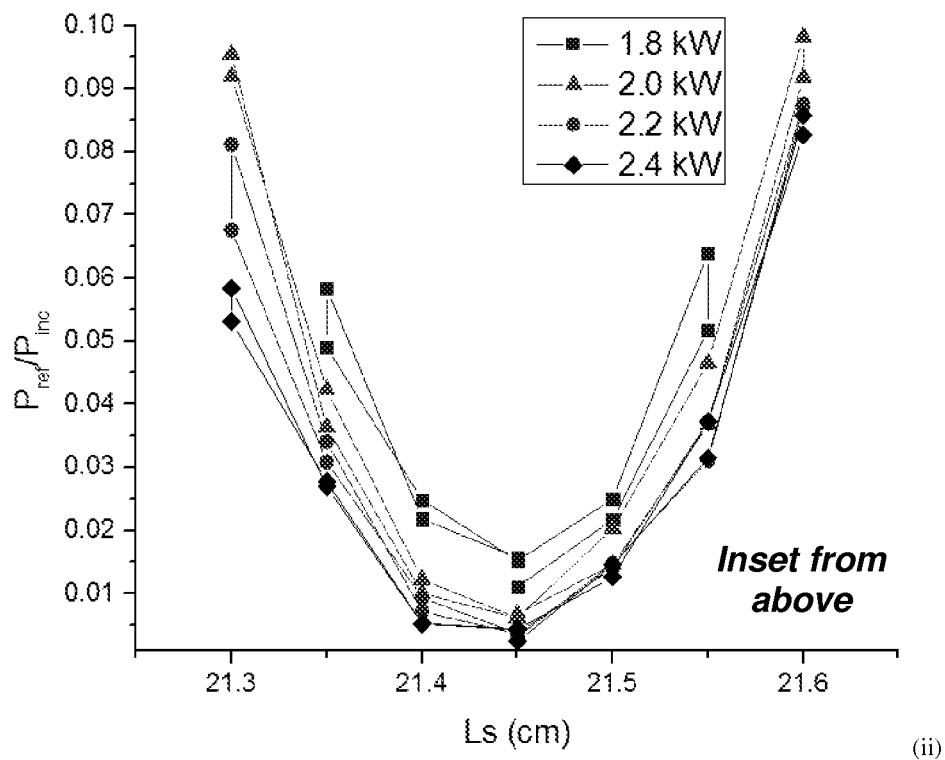

The data in FIGS. 14 and 15 indicate that independent of the incident power, $P_{abs}$ has a maximum, $P_{ref}$ has a minimum and η has a maximum when $L_s$=21.45 cm. The reactor operates within the outer circle 13A of radius 0.1 on the Smith chart in FIG. 13 from about $L_s$=21.6 cm to $L_s$=21.3 cm, i.e. in a very well matched condition where η is >90%. When $L_s$ is between 21.4-21.5 cm, $P_{ref}/P_{inc}$<0.01 and then the normalized reactor impedance is within the inner circle 13B of radius 0.01 in FIG. 13 and η>99%. If $L_s$ is adjusted to 21.45 cm the power reflection coefficient is equal to or less than 0.005, i.e. the reactor is almost perfectly matched, and η~100%. Thus at 180 T the reactor can be well matched over the incident power variation of 1.8 kW-2.4 kW without the addition of an external matching circuit. When operating under these well matched conditions EM standing waves exist only inside the reactor. Over the selected incident input power range of 1.8-2.4 kW the match improves slightly as the $P_{inc}$ increases. Excellent microwave coupling efficiencies of greater that 98% can be achieved with a careful adjustment of Ls.

FIG. 14 (iii) displays the substrate temperature variation versus $L_s$. When the incident power is increased the substrate temperature increases. For any given constant incident power level $T_S$ is a maximum when $L_s$=21.45 cm, i.e. when the reactor is well matched. $T_S$ decreases as $L_S$ is varied either above or below its best matched condition. The substrate temperature variation versus $L_S$ is repeatable. Thus substrate temperature can be varied between 750° C.-950° C. as the incident power and $L_S$ are jointly varied between 1.8 kW and 2.4 kW and 21.6 cm and 21.3 cm respectively.

The experimental curves of FIGS. 14 and 15 also demonstrate how typical generic MPACVD reactors behave under fixed geometry conditions. In these reactors, as shown in FIG. 1, all internal reactor dimensions are fixed. Thus after the substrate and substrate holder are placed in the reactor and the discharge is ignited, the reactor will most likely be unmatched. As shown in FIG. 14, for any internally fixed reactor condition, $P_{ref}$ would most likely be considerable. It is certainly not likely that the best Ls matched position shown in FIG. 14 would be achieved and thus the reactor will be operating outside a well matched condition and the power reflection coefficient will be greater than 0.1 and the coupling efficiency will be <90%. Thus the typical reactor requires an additional external matching network to achieve a well matched condition. Furthermore if during operation the incident power is increased and the plasma density and size increase then additional reflected power would be observed thereby requiring even additional external matching. When the external matching circuit is added a match usually can be achieved at the input matching plane shown in FIG. 1 and more power will be coupled into the discharge as the system is matched. However high EM standing wave fields are set up in the external matching circuit resulting in microwave power losses in the external waveguides. Only a fraction of the additional power is coupled into the discharge loaded reactor, resulting in important losses in the external waveguides.

On the other hand as shown in FIGS. 14 and 15, if internal matching is employed then a simple variation of $L_S$, can easily reduce all additional $P_{ref}$ resulting from any reactor miss-matching such as variations in input power, discharge size, pressure etc. changes in substrate holder design and position, etc. High reactor coupling efficiencies are achieved by just varying the length $L_S$ to achieve the optimum matched condition, i.e. $P_{inc}$~$P_c$.

Coupling Efficiency Versus Substrate Position.

Figure 16:
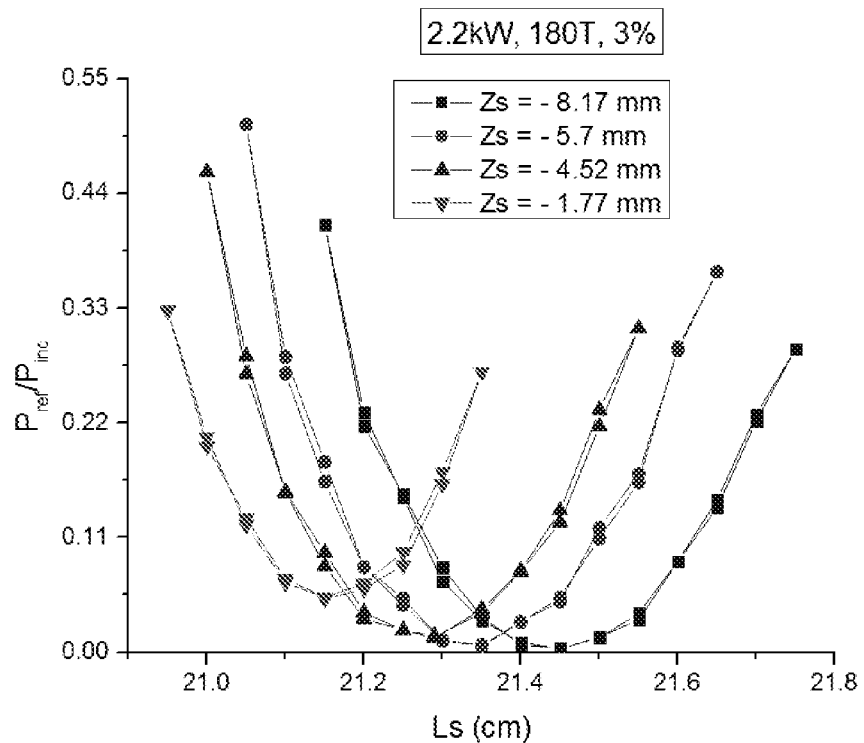
FIG. 16 includes a graph illustrating $P_{ref}/P_{inc}$ vs $L_s$ for different $Z_s$ positions at a constant incident microwave power of 2.2 kW, operating pressure 180 T and 3% CH4/H2.

After adjusting the reactor to a very well matched condition at a constant pressure, η versus the substrate position $Z_s$ was investigated by varying L2. $Z_S$ was varied in steps from −8.17 mm to −1.77 mm. At a constant pressure of 180 T and at each constant substrate position a set of curves similar to those shown in FIG. 14 (ii) and FIG. 15 were measured. FIG. 16 summarizes η versus $z_s$. All data in FIG. 16 were taken with p=180 T, $P_{inc}$=2.2 kW, $CH_4/H_2$=3%, $L_p$=3.25 cm and $f_t$=412 sccm as $z_s$ was varied. At each constant $Z_S$ position $L_S$ was varied to determine the best matched reactor condition.

As $z_s$ is increased from −8.17 mm to −5.7 mm to −4.52 mm to −1.77 mm the best matched position for $L_s$ increases respectively from 21.45 cm to 21.35 cm to 21.29 cm to 21.15 cm. As the length of the coaxial region was decreased the length of the cylindrical portion of the cavity was increased, albeit not in a linear fashion, in order to maintain the reactor in the excited hybrid resonance. The experimental data shows that as the substrate position is varied η>95% are still achieved. The best η vary from almost 100% at $z_s$=−8.17 mm to ~95% at $z_s$=−1.77 mm.

Operating Field Map and Coupling Efficiency at Constant Pressure.

Figure 17:
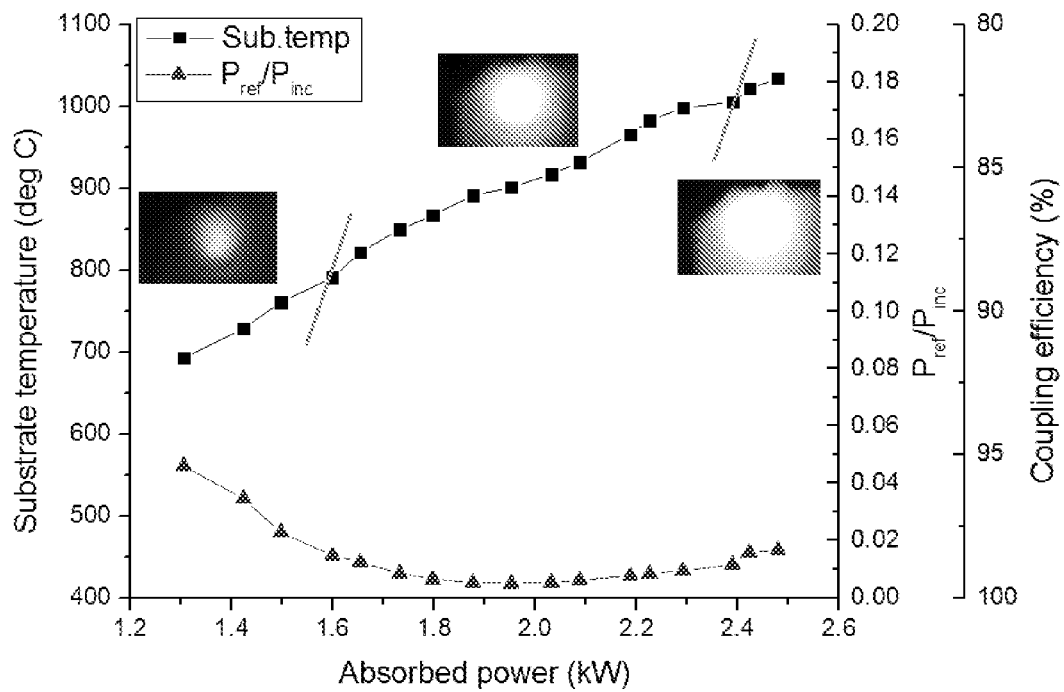
FIG. 17 illustrates an operating field map and matching, i.e. $P_{ref}/P_{inc}$ and η vs $P_{abs}$, for a constant pressure of 180 T. All other experimental input conditions are held constant, such as 2.54 cm diameter silicon substrates, L1=52.93 mm, L2=61.1 mm, $z_s$=−8.17 mm, CH4/H2=3%, and $f_t$=412 sccm. $L_s$ and $L_p$ are also held constant at 21.45 cm and 3.25 cm respectively. The photograph inserts display examples of the discharge size as the input power varies from minimum to maximum input power.

If the reactor geometry, substrate size, methane concentration and total gas flow rate are held fixed then the deposition process is a function of input power, pressure and substrate temperature. The relationship between these variables is nonlinear and given a specific reactor geometry it can be described by a set of experimental curves identified as the reactor operating field maps. The reactor operating field map at a given pressure relates the substrate temperature to the two major input variables input power and pressure. When considering the diamond synthesis application, they are typically plotted only for useful diamond synthesis conditions, i.e. substrate temperatures that are between 700° C.<$T_s$<1300° C. For example if the reactor is operating at a constant pressure of 180 T, and $L_s$ has been adjusted to a well matched condition, i.e. 21.45 cm, the reactor operating field map for 180 T can be experimentally measured. FIG. 17 displays one such experimentally measured operating reactor map for a constant pressure of 180 T. This curve was measured by holding the input variables such as p, $z_s$, $CH_4/H_2$, $L_s$, etc. constant and as the input power was varied in 100 W steps from 1.2 kW to 2.5 kW, $T_s$ and the $P_{ref}$ were recorded. FIG. 17 shows that as input power increases from 1.2 kW to 2.4 kW, the substrate temperature increases from 700-1050° C.

As the input power is increased the discharge size increases, i.e. as the input power increases from 1.4 kW to 2.0 kW to 2.4 kW the discharge size increases from a size that is smaller than the substrate area to a more optimum plasma assisted diamond synthesis size to a discharge size that is much greater than the substrate area. This is displayed pictorially in the discharge photographs shown in FIG. 17. The lower left slanted line intersecting the field map in FIG. 17 at about 1.6 kW defines the lower useful input power limit below which the diamond synthesis is non-uniform over the substrate. If the input power is increased beyond the upper right slanted line shown in FIG. 17 then the additional power is wasted and the diamond synthesis process becomes inefficient. The safe and efficient diamond synthesis regime for diamond synthesis is identified in FIG. 17 as the operating regime that lies between the upper and lower slanted lines intersecting the operating field map.

Also shown in FIG. 17 are the corresponding measurements of $P_{ref}/P_{inc}$ and η. The $P_{ref}/P_{inc}$ data in FIG. 17 was taken for a fixed $L_S$ of 21.45 cm and indicates that η is close to or greater than 99% as the input power is varied from 1.6 kW to 2.4 kW. Thus when the reactor operates within the good diamond synthesis regime, as specified by the limits on the operating field map, then the magnitude of R lies within the inner circle 13B shown in FIG. 13. Only when operating below 1.5 kW and above 2.4 kW does $P_{ref}$ start to increase and then the coupling efficiency becomes less than 98%. However, even then R still lies within an acceptable well matched condition. Therefore once the reactor is matched at 180 T the microwave coupling efficiency remains excellent as the input power varies from 1.5 kW-2.4 kW. This implies that the diamond synthesis temperature can be varied by varying the input power as is shown in FIG. 17 within the safe and useful diamond synthesis regime without degrading the microwave coupling efficiency.

Coupling Efficiency Versus Pressure for Reactor Operating Field Map.

The experimental matching techniques above for a pressure of 180 T can be employed for any constant operating pressure. A separate unique operating field map was measured for each constant operating pressure. Then these curves were combined into the resulting family of curves shown in FIG. 18. The experimental data presented FIG. 18 was created by first matching the reactor at 180 T, as described above. Then $L_S$ was adjusted to the very well matched condition of $L_s$=21.35 cm while all the other variables were held constant. The family of operating field maps shown in FIG. 18 was traced out (solid data points) as the pressure was varied in steps from 100-260 T and power was varied from 1.2 kW-2.4 kW. In an appropriately designed reactor with an appropriate molybdenum holder all the recorded substrate temperatures are within the desirable 700-1300° C. diamond synthesis regime. The safe and efficient operating diamond synthesis operating regimes are also identified on the field maps in FIG. 18 as the solid data points that lie within the two left-most slanted dashed curves. The corresponding set of $P_{ref}/P_{inc}$ versus $P_{abs}$ curves are also plotted (open data points) displaying the microwave coupling efficiency variation over the entire pressure regime. Note that even though the reactor has only been optimized and matched at 180 T the reactor remains in a well matched condition over the entire 100-260 T operating regime. All coupling efficiencies are >90%. Thus once the reactor has been matched at 180 T, i.e. by varying $L_S$ to an excellent match, little reactor tuning is required as the reactor is varied over this large pressure/input power regime. Thus there is no need for an additional external matching circuit. For a given diamond synthesis process the input power and the pressure can be varied over a considerable range without additional reactor tuning while still maintaining high microwave coupling efficiencies.

The field maps are modified when the thickness of the molybdenum holder is varied. Changing holder thickness shifts the temperature curves either up or down. However varying the molybdenum holder thickness also either increases or decreases L1 resulting an unmatched reactor. The reactor can be re-matched as discussed above by varying $L_s$ to a new very well matched condition resulting in a similar very well matched, high coupling efficiency operation. The molybdenum holder also can be modified for many other process useful reasons such as multiple substrate synthesis, reshaping the holder to produce higher power density discharges etc. Only a slight variation in $L_S$ is necessary in order to adapt the reactor for high coupling efficiency operation using these new discharge/substrate loads.

Input Power Limitations.

The experimental data presented above indicate that when operating within the input power range of 1.5 kW-2.5 kW, η>90%. In fact η appears to improve as $P_{inc}$ is increased. This suggests that diamond synthesis rates at a given constant pressure may be even further increased with additional increases in the input power. However there are at any given pressure reasons to place limits on the input power, for example to increase process efficiency, minimize hot spots, and/or eliminate the formation of microwave plasmoids.

First, when operating at a constant pressure if the input power increases the discharge size increases and the absorbed discharge power density remains approximately constant or only slightly increases. Thus as power is increased the discharge surface area in contact with the substrate holder expands beyond what is needed for the radical species to cover the substrate surface and thereby produce uniform deposition. This is can be seen pictorially in FIG. 17. For example, looking at the field map associated with 180 T: as the power is increased the discharge size increases beyond the substrate size. As the input power is increased the absorbed density only slightly increases and hence the growth rate on the substrate slightly increases, but it increases at a decreasing rate versus input power. Diamond deposition also occurs on the molybdenum holder and thus an important amount of the discharge deposition area and input power is wasted. Therefore there is a value of input power beyond which the synthesis process becomes less and less electrically efficient, i.e. carats/KW-h decreases. As indicated in FIG. 17 by the upper right slanted line, in a given application and at a given pressure the input power should be limited to produce a discharge that just covers the substrate. Beyond this input power value any additional power input just increases the discharge size, and often an additional increase in input power even reduces the overall deposition efficiency.

An even further increase in input power (right-most dashed line in FIG. 18) will increase the size of the discharge until it starts interacting with the reactor walls. This is shown in the discharge insert (a) in FIG. 18. These plasma-wall interactions are either with the quartz dome walls or for other reactor designs the discharge could also interact with the metal reactor walls. These microwave plasma wall interactions will lead to the formation of undesirable hot spots (FIG. 18, inset (b)) and microwave plasmoids and hence process contamination. Wall interactions may be reduced via wall cooling as is usually done for metal reactor walls. The cooling of metal walls will efficiently remove the heat from the discharge and will reduce the plasma wall material removal interactions. However this is a counterproductive process since a hot discharge more efficiently produces the desired radical species. The removal of heat from the discharge via wall cooling requires additional input power to maintain the discharge temperature in order to achieve the desired high species densities required for high synthesis rates. Thus the addition of more and more input power and the then the need for additional cooling results in an inefficient process.

Figure 18:
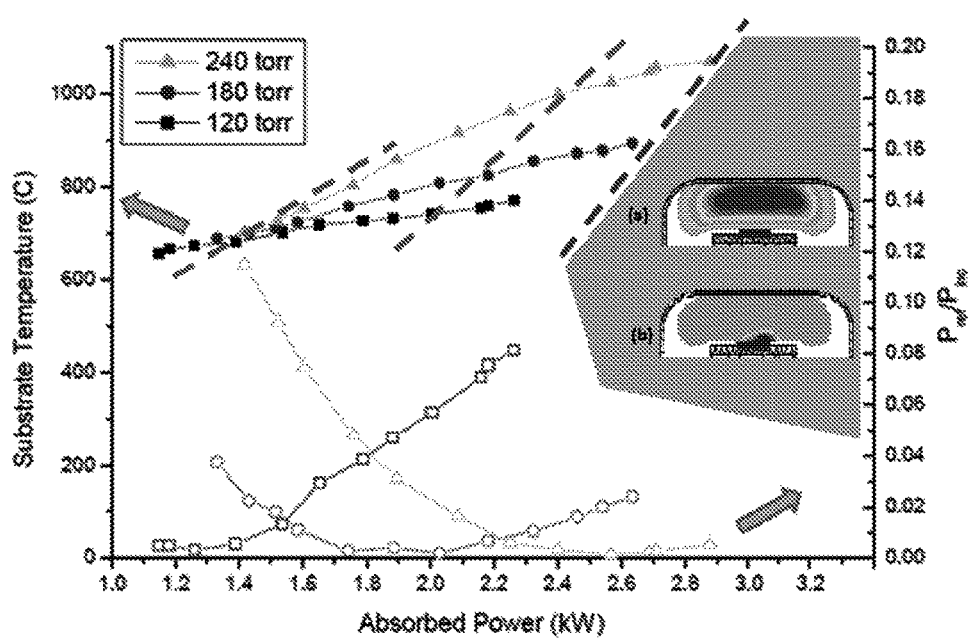
FIG. 18 illustrates operating field maps and matching, i.e. $P_{ref}/P_{inc}$ versus absorbed power for three constant pressure conditions: 120, 180 and 240 T. All other experimental variables are constant.

On the operating field maps of FIG. 18, operational input power limits on the reactor are placed where the reactor operates not only in the desired $T_S$ synthesis regime, but also where it operates safely without wall interactions, and without the formation of microwave plasmoids, and where it is operating with high electrically efficiency. These input power limits are a function of input power and pressure. Indicated in the grey shaded area of FIG. 18 is the region where microwave plasmoid may form.

Summary.

The employment of internal reactor matching enables a well matched, efficient reactor over a wide pressure/input power/substrate position regime while operating under diamond synthesis conditions. For example if the reactor is adjusted to a very well matched condition at a midrange pressure, for example 180T, then $\eta>90\%$ is achieved over the entire 100-260 T pressure and 1.5-2.4 kW input power regime without the need for additional external matching. Additionally, when operating at a specific experimental operating condition within this pressure/power regime small additional internal tuning adjustments can be made to achieve $\eta>98\%$. Virtually all of the available incident power can be coupled into the reactor over the entire 100-260 T operating pressure regime. Then $\eta_{coup}\sim(1-P_{loss}/P_{inc})\times 100\%$ and $\eta_{coup}\sim(1-Q_L/Q_o)\times 100\%$ and the problem of achieving high overall microwave coupling efficiencies into the discharge can be directed toward achieving and maintaining a high $Q_o$. The use of internal matching also results in improved discharge stability, high reactor microwave coupling efficiencies and improved reactor operational flexibility.

An efficient microwave plasma diamond synthesis system preferably utilizes the following features: (1) elimination of external matching circuits, (2) utilization of internal reactor matching systems that achieve well to perfectly matched conditions, i.e. $P_{ref}\sim 0$, and (3) initial design and then the maintenance during process operation of a high $Q_o$ reactor. $\eta_{coup}$ is improved if $Q_o$ is increased, i.e. if the materials inside the cavity reactor are lossless, if the cavity metal joints are microwave tight, if microwave soot formation and carbon film deposition on the walls is eliminated, etc. If $Q_o$ decreases from run to run then the overall system electrical efficiency will decrease from run to run. However it is conceivable that a well designed and maintained internally tuned MPACVD diamond synthesis system can achieve $\eta_{coup}>94\%$. MPACVD SCD synthesis experiments have, after employing the reactor design, microwave coupling and process techniques, achieved electrical synthesis efficiencies of <10 kW-h/carat.

In order to realize the efficient, reliable and robust operation, input power limits should be placed on a given reactor design/synthesis process application. Even though coupling efficiencies may remain high (>90%) as input power is increased, input power limitations are useful in order to achieve an efficient diamond synthesis processes and to avoid discharge wall interactions and the formation of microwave plasmoids and substrate hot spots. These input power limits are a function of process conditions such as input power, pressure, methane concentrations, etc. If higher deposition rates are desired then the reactor should be operated at higher pressures.

Because other modifications and changes varied to fit particular operating requirements and environments will be apparent to those skilled in the art, the disclosure is not considered limited to the example chosen for purposes of illustration, and covers all changes and modifications which do not constitute departures from the true spirit and scope of this disclosure.

Accordingly, the foregoing description is given for clearness of understanding only, and no unnecessary limitations should be understood therefrom, as modifications within the scope of the disclosure may be apparent to those having ordinary skill in the art.

All patents, patent applications, government publications, government regulations, and literature references cited in this specification are hereby incorporated herein by reference in their entirety. In case of conflict, the present description, including definitions, will control.

Throughout the specification, where the compositions, processes, kits, or apparatus are described as including components, steps, or materials, it is contemplated that the compositions, processes, or apparatus can also comprise, consist essentially of, or consist of, any combination of the recited components or materials, unless described otherwise.

Component concentrations can be expressed in terms of weight concentrations, unless specifically indicated otherwise. Combinations of components are contemplated to include homogeneous and/or heterogeneous mixtures, as would be understood by a person of ordinary skill in the art in view of the foregoing disclosure.

REFERENCES

[1] K. W. Hemawan, T. A. Grotjohn, D. K. Reinhard, J. Asmussen, Diam. Relat. Mater. 19 (2010) 1446.
[2] J. Asmussen, Y. Gu, New Diamond, 105 (2012) 4.
[3] Y. Gu, J. Lu, T. Grotjohn, T. Schuelke, and J. Asmussen, Diam. Relat. Mater. 24 (2012) 210-214.
[4] Jing Lu, Y. Gu, T. A. Grotjohn, T. Schuelke, J. Asmussen, Diam. Relat. Mater. 37, (2013) 17-28.
[5] Jie Zhang, "Experimental development of microwave cavity plasma reactors for large area and high rate diamond film deposition," MSU PhD Thesis, 1993.
[6] K-P Kuo, "Microwave assisted plasma CVD of diamond films using a thermal-like plasma discharge," MSU PhD Thesis 1997.
[7] J. Asmussen and D. K. Reinhard, "Diamond Films Handbook" Marcel Dekker, New York 2002, See Chapter 7 by T. A Grotjohn and J. Asmussen, Microwave Plasma-Assisted Diamond Film Deposition, pp 211-302.
[8] J. Lu, "Single crystal microwave plasma assisted chemical vapor synthesis at high pressures and high power densities," MSU PhD Thesis, September 2013.
[9] Y. Gu, "The new generation microwave plasma assisted CVD reactor for diamond synthesis," MSU PhD Thesis, 2011.
[10] J. Asmussen, R. Mallavarpu, J. Hamman, and H. C. Park, "The design of a microwave plasma cavity," Proc. IEEE. 62, (1974), 109 117.
[11] R. Mallavrpu, M. C. Hawley, and J. Asmussen, IEEE Trans. on Plasma Science, PS 6, (1978), 341 354.
[12] S. Whitehair, J. Asmussen, and S. Nakanishi, Appl. Phys. Letters, 44, (1984), 1014 1016.
[13] S. Whitehair, J. Asmussen, and S. Nakanishi, J. of Propulsion and Power, 3, (1987), 136-144.
[14] P. Mak, J. Asmussen, J. Vac. Sci. Technol. A, 15(1), (1997), 154-168.
[15] Y. H. Ohtsuki, H. Ofuruton Nature 350, (1991), 139-141.
[17] K. Yasui, Phys. Let. A, 173 (6), (1993), 451-455.
[18] Y Meir, E. Jerby, Z. Barkay, D. Ashkenazi, J. B. Mitchell, T. Narayanan, N. Eliaz, J. L. LeGattec, M. Sztucki, O. Meshcheryakov, Materials, 6 (9), (2013) 4011-4030.
[19] K. W. Hemawan, M. S. Thesis, Michigan State University, 2003
[20] K W Hemawan, C S Yan, Q Liang, J Lai, Y Meng, S Krasnicki, H K Mao, R J Hemley Plasma Science, IEEE Transactions on 39 (11), 2790-279.
[21] D. King, M. K. Yaran, T. Schuelke, T. A. Grotjohn, D. K. Reinhard and J. Asmussen, Diamond and Related Materials, 17, 520-524, 2008.
[22] McCauley T S and Vohra Y K 1995 Appl. Phys. Lett. 66, 1486
[23] Yan C S, Vohra Y K, Mao H K, and Hemley R L 2002 Proc. Natl. Acad. Sci. U.S.A. 99, 12523
[24] Williams O A and Jackman R 2004 Diamond and Relat. Mater. 13, 557
[25] Mokuno Y, Chayahara A, Soda Y, Horino Y and Fujimori N 2005 Diamond and Relat. Mater. 14, 1743-1746
[26] Tallaire A, Achard J, Silva F, Sussmann R S and Gicquel A 2005 Diamond and Relat. Mater. 14, 249-254
[27] Bauer T, Schreck M, Sternschulte H, Stritzker B 2005 Diamond and Relat. Mater. 14, 266-271
[28] Asmussen J, Grotjohn T A, Schuelke T, Becker M F, Yaran M K, King D J, Wicklein S, Reinhard D K 2008 Appl. Phys. Lett. 93, 031502
[29] Schreck M, Asmussen J, Shikata S, Arnault J and Fujimori N 2014 MRS Bulletin Vol. 39
[30] Teraji T, Hamada M, Wada H, Yamamoto M, Arima K and Ito T 2005 Diamond and Relat. Mater. 14, 255-260
[31] Teraji T, Hamada M, Wada H, Yamamoto M and Ito T 2005 Diamond and Relat. Mater. 14, 1747-1752
[32] Yamada H, Chayahara A, Mokuno Y, Soda Y, Horino Y and Fujimori N 2005 Diamond and Relat. Mater. 14, 1776-1779
[33] Yamada H, Chayahara A, Mokuno Y, Horino Y, Shikata S 2006 Diamond and Relat. Mater. 15, 1389-1394
[34] Yamada H, Mokuno Y, Chayahara A, Horino Y, Shikata S-I 2007 Diamond and Relat. Mater. 16, 576-580
[35] Miyatake H, Arima K, Maida O, Teraji T and Ito T 2007 Diamond and Relat. Mater. 16, 679-684
[36] Mokuno Y, Chayahara A, Yamada H 2008 Diamond and Relat. Mater. 17, 415-418
[37] Yamada H, Chayahara A, Mokuno Y, Shikata S-I 2008 Diamond and Relat. Mater. 17, 1062-1066
[38] Tokuda N, Umezawa H, Ri S G, Ogura M, Yamabe K, Okushi H, Yamasaki S 2008 Diamond and Relat. Mater. 17, 1051-1054
[39] Sternschulte H, Bauer T, Schreck M and Stritzker B 2006 Diamond and Relat. Mater. 15, 542-547
[40] Bauer T, Schreck M, Stritzker B 2008 Diamond and relat. Mater. 15, 472-478
[41] Achard J, Tallaire A, Sussmann R, Silva F, Gicquel A 2005 Journal of Crystal Growth 284, 396-405
[42] Tallaire A, Collins A T, Charles D, Achard J, Sussmann R, Gicquel A, Newton M E, Edmonds A M, Cruddace R J 2006 Diamond and Relat. Mater. 15, 1700-1707
[43] Tallaire A, Achard J, Secroun A, De Gryse O, De Weerdt F, Barjon J, Silva F, Gicquel A 2006 Journal of Crystal Growth 291, 533-539
[44] Achard J, Silva F, Brinza O, Tallaire A, Gicquel A 2007 Diamond and Relat. Mater. 16, 4-689
[45] Silva F, Bonnin X, Achard J, Brinza O, Michau A, Gicquel A 2008 Journal of crystal growth 310, 187-203
[46] Silva F, Achard J, Bonnin X, Brinza O, Michau A, Secroun A, De Corte K, Felton S, Newton M, Gicquel A 2008 Diamond and Relat. Mater. 17, 1067-1075
[47] Tyagi P K, Misra A, Narayanan Unni K N, Rai P, Singh M J, Palnitkar U, Misra D S, Le Normand F, Roy M, Kulshreshtha S K 2006 Diamond and Relat. Mater. 15, 304-308
[48] Silva F, Achard J, Brinza O, Bonnin X, Hassouni K, Anthonis A, De Corte K and Barjon J Diamond and Relat. Mater. 18, 683-697
[49] Liang Q, Chin C, Lai J, Yan C, Meng Y, Mao H, Hemley R J 2009 Appl. Phys. Lett. 94, 024103
[50] Liang Q, Yan C, Meng Y, Lai J, Krasnicki S, Mao H, Hemley R J 2009 Diamond and Relat. Mater. 18, 698
[51] Silva F, Hassouni K, Bonnin X, Gicquel A 2009 J. Phys. Condens. Matter 21, 364202
[52] Ohtsuki Y H, Ofuruton H 1991 Nature 350, 139-141
[53] Yasui K 1993 Phys. Let. A 173 (6), 451-455
[54] Meir Y, Jerby E, Barkay Z, Ashkenazi D, Mitchell J B, Narayanan T, Eliaz N, LeGattec J L, Sztucki M, Meshcheryakov O 2013 Materials 6 (9), 4011-4030

[55] Harris S J and Goodwin D G 1993 J. Phys. Chem. 97, 23.
[56] Müller-Sebert W, Wörner E, Fuchs F, Wild C, Koidl P 1996 Appl. Phys. Lett. 68, 759
[57] Grotjohn T A, Asmussen J, Sivagnaname J, Story D, Vikharev A L, Gorbachev A and Kolysko A 2000 Diamond and Relat. Mater. 9, pp. 322-327
[58] Grotjohn T A, Asmussen J 2002 Chapter 7 in J. Asmussen, D. K. Reinhard (Eds.), Diamond Thin Films Handbook, Marcel Decker, NY, P 221
[59] Mak P and Asmussen J 1997 J. Vac. Sci. and Technol. A15, pp. 154-168
[60] Zhang J, Huang B, Reinhard D K and Asmussen J 1990 J. Vac. Sci and Technol. A8, pp. 2124 2128
[61] Grotjohn T A 1998 J. Phys. IV France 8
[62] Tan W, Grotjohn T A 1995 Diamond and Relat. Mater. 4 1145-1154
[63] Derkaoui N, Rond C, Gries T, Henrion G and Gicquel A 2014 J. Phys. D: Appl. Phys. 47 205201 (10pp)

What is claimed is:

1. A process for depositing a component on a substrate, the process comprising:
    (a) providing a microwave plasma assisted reactor comprising:
        (i) a first microwave chamber having a reference plane at a reference axial location $Z_0$, the first microwave chamber extending in an axial direction $z>Z_0$ and comprising (A) an electromagnetic wave source and (B) an upper conducting short in electrical contact with the first microwave chamber and disposed in an upper portion of the first microwave chamber at an axial distance $L_s$ above $Z_0$, the upper conducting short having a central opening and defining an upper boundary of the first microwave chamber,
        (ii) a plasma chamber having an outer wall, the plasma chamber extending into the first microwave chamber such that at least a portion of the plasma chamber is located at $z>Z_0$, and
        (iii) a conductive stage for supporting a substrate, the conductive stage having an axially adjustable reference surface extending into the plasma chamber at an axial distance $Z_s$ relative to $Z_0$;
    (b) performing an initial coarse tuning process to reduce a power reflection coefficient R defined as $P_{ref}/P_{inc}$ to 0.5 or less;
    (c) after the initial coarse tuning process, performing a first tuning process comprising: (i) operating the reactor to deposit a component on a first tuning substrate supported on the conductive stage at a plurality of different electromagnetic wave source incident power values $P_{in}$, and at a plurality of different $L_s$ values to measure corresponding reflected power values $P_{ref}$, and (ii) identifying a first matched operating regime comprising a plurality of $P_{in}$, and $L_s$ values for which a power reflection coefficient R defined as $P_{ref}/P_{inc}$ is 0.1 or less;
    (d) after the initial coarse tuning process, performing a second tuning process comprising: (i) operating the reactor to deposit a component on a second tuning substrate supported on the conductive stage at a plurality of different axial distance $Z_s$ values, and at a plurality of different Ls values to measure corresponding reflected power values $P_{ref}$, and (ii) identifying a second matched operating regime comprising a plurality of $Z_s$ and $L_s$ values for which a power reflection coefficient R defined as $P_{ref}/P_{inc}$ is 0.1 or less; and
    (e) operating the reactor at a pressure ranging from about 10 Torr to about 760 Torr to deposit a component on the substrate supported on the conductive stage at one or more operating conditions within at least one of the first matched operating regime and the second matched operating regime, wherein the power reflection coefficient R is 0.1 or less during deposition of the component.

2. The process of claim 1, further comprising, during part (e) varying at least one of reactor pressure $p_r$, substrate position $Z_s$, and incident power $P_{inc}$ while maintaining the power reflection coefficient R to be 0.1 or less during deposition of the component.

3. The process of claim 1, wherein the electromagnetic wave source of the microwave plasma assisted reactor comprises a coaxial excitation probe extending through the central opening of the upper conducting short and into the first microwave chamber by an axial distance $L_p$ relative to the upper boundary of the first microwave chamber.

4. The process of claim 1, wherein:
    the conductive stage defines a second microwave chamber in the plasma chamber (i) at $z<Z_0$ and (ii) between the plasma chamber outer wall and the conductive stage;
    the microwave plasma assisted reactor further comprises a conducting short adjustably disposed in the second microwave chamber below $Z_0$ and in electrical contact with the plasma chamber outer wall and the conductive stage, the axial distance between the conducting short and $Z_0$ being L2, and the axial distance between the conducting short and the reference surface of the conductive stage being L1; and
    L2 and L1 are capable of axial adjustment in the reactor by moving the conducting short during operation of the reactor.

5. The process of claim 4, wherein the conductive stage is movable such that both L1 and L2 are capable of independent adjustment during operation of the reactor by moving one or both of the conducting short and the conductive stage.

6. The process of claim 1, wherein the microwave plasma assisted reactor is free from an external matching circuit.

7. The process of claim 1, wherein the component comprises single-crystal diamond, microcrystalline polycrystalline diamond, or nanocrystalline polycrystalline diamond.

8. The process of claim 1, wherein:
    the power reflection coefficient R for the first matched operating regime is 0.05 or less; and
    the power reflection coefficient R for the second matched operating regime is 0.05 or less.

9. The process of claim 1, wherein:
    the power reflection coefficient R for the first matched operating regime is 0.02 or less; and
    the power reflection coefficient R for the second matched operating regime is 0.02 or less.

10. The process of claim 1, wherein:
    the power reflection coefficient R for the first matched operating regime is 0.01 or less; and
    the power reflection coefficient R for the second matched operating regime is 0.01 or less.

11. The process of claim 1, wherein:
    the power reflection coefficient R for the initial coarse tuning process is 0.2 or less;
    the power reflection coefficient R for the first matched operating regime is 0.02 or less; and
    the power reflection coefficient R for the second matched operating regime is 0.02 or less.

12. The process of claim 1, wherein:
the power reflection coefficient R for the initial coarse tuning process is 0.1 or less;
the power reflection coefficient R for the first matched operating regime is 0.01 or less; and
the power reflection coefficient R for the second matched operating regime is 0.01 or less.

* * * * *